(12) United States Patent
Bell et al.

(10) Patent No.: US 7,946,120 B2
(45) Date of Patent: May 24, 2011

(54) HIGH CAPACITY THERMOELECTRIC TEMPERATURE CONTROL SYSTEM

(75) Inventors: Lon E. Bell, Altadena, CA (US); Robert Diller, Pasadena, CA (US); Douglas Crane, Pasadena, CA (US)

(73) Assignee: BSST, LLC, Irwindale, CA (US)

( * ) Notice: Subject to any disclaimer, the term of this patent is extended or adjusted under 35 U.S.C. 154(b) by 964 days.

(21) Appl. No.: 11/829,832

(22) Filed: Jul. 27, 2007

(65) Prior Publication Data

US 2008/0245398 A1  Oct. 9, 2008

Related U.S. Application Data

(63) Continuation-in-part of application No. 11/136,334, filed on May 24, 2005, now Pat. No. 7,587,902, which is a continuation of application No. 10/642,773, filed on Aug. 18, 2003, now Pat. No. 6,959,555, which is a continuation-in-part of application No. 10/405,001, filed on Mar. 31, 2003, now Pat. No. 7,111,465, which is a continuation-in-part of application No. 10/227,398, filed on Aug. 23, 2002, now Pat. No. 7,231,772, which is a continuation of application No. 09/844,818, filed on Apr. 27, 2001, now Pat. No. 6,539,725.

(60) Provisional application No. 60/834,005, filed on Jul. 28, 2006, provisional application No. 60/834,007, filed on Jul. 28, 2006, provisional application No. 60/267,657, filed on Feb. 9, 2001.

(51) Int. Cl.
  *F25B 21/02* (2006.01)
(52) U.S. Cl. .................................. 62/3.7; 62/3.3; 62/3.6
(58) Field of Classification Search ...................... 62/3.2, 62/3.6, 3.7, 259.2
  See application file for complete search history.

(56) References Cited

U.S. PATENT DOCUMENTS

| | | |
|---|---|---|
| 1,120,781 A | 12/1914 | Altenkirch et al. |
| 2,027,534 A | 1/1936 | Ingersoll |

(Continued)

FOREIGN PATENT DOCUMENTS

CN  1195090  10/1998

(Continued)

OTHER PUBLICATIONS

Angrist, S. W., "Direct Energy Conversion," 32 Ed. Ally & Bacon (1976).

(Continued)

*Primary Examiner* — Melvin Jones
(74) *Attorney, Agent, or Firm* — Knobbe, Martens, Olson & Bear, LLP

(57) ABSTRACT

A thermoelectric system includes a first plurality of thermoelectric elements and a second plurality of thermoelectric elements. The thermoelectric system further includes a plurality of heat transfer devices. Each heat transfer device has a first side in thermal communication with two or more thermoelectric elements of the first plurality of thermoelectric elements and a second side in thermal communication with one or more thermoelectric elements of the second plurality of thermoelectric elements, so as to form a stack of thermoelectric elements and heat transfer devices. The two or more thermoelectric elements of the first plurality of thermoelectric elements are in parallel electrical communication with one another, and the two or more thermoelectric elements of the first plurality of thermoelectric elements are in series electrical communication with the one or more thermoelectric elements of the second plurality of thermoelectric elements.

33 Claims, 45 Drawing Sheets

U.S. PATENT DOCUMENTS

| | | |
|---|---|---|
| 2,362,259 A | 11/1944 | Findley |
| 2,363,168 A | 11/1944 | Findley |
| 2,519,241 A | 8/1950 | Findley |
| 2,944,404 A | 7/1960 | Fritts |
| 2,949,014 A | 8/1960 | Belton, Jr. et al. |
| 2,984,077 A | 5/1961 | Gaskill |
| 3,004,393 A | 10/1961 | Alsing |
| 3,006,979 A | 10/1961 | Rich |
| 3,019,609 A | 2/1962 | Pietsch |
| 3,071,495 A | 1/1963 | Hanlein |
| 3,085,405 A | 4/1963 | Frantti |
| 3,125,860 A | 3/1964 | Reich |
| 3,126,116 A | 3/1964 | Corry |
| 3,129,116 A | 4/1964 | Corry |
| 3,137,142 A | 6/1964 | Venema |
| 3,178,895 A | 4/1965 | Mole et al. |
| 3,197,342 A | 7/1965 | Neild, Jr. |
| 3,212,275 A | 10/1965 | Tillman, Jr. |
| 3,213,630 A | 10/1965 | Mole |
| 3,252,504 A | 5/1966 | Newton |
| 3,391,727 A | 7/1968 | Topouszian |
| 3,505,728 A | 4/1970 | Hare et al. |
| 3,527,621 A | 9/1970 | Newton |
| 3,599,437 A | 8/1971 | Panas |
| 3,607,444 A | 9/1971 | Debucs |
| 3,626,704 A | 12/1971 | Coe, Jr. |
| 3,635,037 A | 1/1972 | Hubert |
| 3,663,307 A | 5/1972 | Mole |
| 3,681,929 A | 8/1972 | Schering |
| 3,779,814 A | 12/1973 | Miles et al. |
| 3,817,043 A | 6/1974 | Zoleta |
| 3,859,143 A | 1/1975 | Krebs |
| 4,038,831 A | 8/1977 | Gaudel et al. |
| 4,055,053 A | 10/1977 | Elfving |
| 4,065,936 A | 1/1978 | Fenton et al. |
| 4,125,122 A | 11/1978 | Stachurski |
| 4,281,516 A | 8/1981 | Berthet et al. |
| 4,297,841 A | 11/1981 | Cheng |
| 4,297,849 A | 11/1981 | Buffet |
| 4,420,940 A | 12/1983 | Buffet |
| 4,494,380 A | 1/1985 | Cross |
| 4,499,329 A | 2/1985 | Benicourt et al. |
| 4,665,707 A | 5/1987 | Hamilton |
| 4,730,459 A | 3/1988 | Schlicklin et al. |
| 4,731,338 A | 3/1988 | Ralston et al. |
| 4,823,554 A | 4/1989 | Trachtenberg et al. |
| 4,858,069 A | 8/1989 | Hughes |
| 4,905,475 A | 3/1990 | Tuomi |
| 4,988,847 A | 1/1991 | Argos et al. |
| 4,989,626 A | 2/1991 | Takagi et al. |
| 5,006,178 A | 4/1991 | Bijvoets |
| 5,029,446 A | 7/1991 | Suzuki |
| 5,038,569 A * | 8/1991 | Shirota et al. ............... 62/3.2 |
| 5,092,129 A | 3/1992 | Bayes et al. |
| 5,097,829 A | 3/1992 | Quisenberry |
| 5,111,664 A | 5/1992 | Yang |
| 5,193,347 A | 3/1993 | Apisdorf |
| 5,228,923 A | 7/1993 | Hed |
| 5,232,516 A | 8/1993 | Hed |
| 5,254,178 A | 10/1993 | Yamada et al. |
| 5,300,197 A | 4/1994 | Mitani et al. |
| 5,385,020 A | 1/1995 | Gwilliam et al. |
| 5,419,780 A | 5/1995 | Suski |
| 5,429,680 A | 7/1995 | Fuschetti |
| 5,448,891 A | 9/1995 | Nakagiri et al. |
| 5,499,504 A | 3/1996 | Mill et al. |
| 5,544,487 A | 8/1996 | Attey et al. |
| 5,561,981 A | 10/1996 | Quisenberry et al. |
| 5,584,183 A | 12/1996 | Wright et al. |
| 5,592,363 A | 1/1997 | Atarashi et al. |
| 5,594,609 A | 1/1997 | Lin |
| 5,605,047 A | 2/1997 | Park et al. |
| 5,682,748 A | 11/1997 | DeVilbiss et al. |
| 5,724,818 A * | 3/1998 | Iwata et al. ............... 62/3.7 |
| 5,802,856 A | 9/1998 | Schaper et al. |
| 5,822,993 A | 10/1998 | Attey |
| 5,860,472 A | 1/1999 | Batchelder |
| 5,867,990 A | 2/1999 | Ghoshal |
| 5,900,071 A | 5/1999 | Harman |
| RE36,242 E | 6/1999 | Apisdorf |
| 5,921,088 A | 7/1999 | Imaizumi et al. |
| 5,955,772 A | 9/1999 | Shakouri et al. |
| 5,959,341 A | 9/1999 | Tsuno et al. |
| 5,966,941 A | 10/1999 | Ghoshal |
| 5,975,856 A | 11/1999 | Welle |
| 5,987,890 A | 11/1999 | Chiu et al. |
| 6,000,225 A | 12/1999 | Ghoshal |
| 6,050,326 A | 4/2000 | Evans |
| 6,082,445 A | 7/2000 | Dugan |
| 6,084,172 A | 7/2000 | Kishi et al. |
| 6,096,966 A | 8/2000 | Nishimoto et al. |
| 6,119,463 A | 9/2000 | Bell |
| 6,213,198 B1 | 4/2001 | Shikata et al. |
| 6,223,539 B1 | 5/2001 | Bell |
| 6,274,802 B1 | 8/2001 | Fukuda et al. |
| 6,282,907 B1 | 9/2001 | Ghoshal |
| 6,319,744 B1 | 11/2001 | Hoon et al. |
| 6,334,311 B1 | 1/2002 | Kim et al. |
| 6,346,668 B1 | 2/2002 | McGrew |
| 6,347,521 B1 | 2/2002 | Kadotani et al. |
| 6,359,725 B1 | 3/2002 | Islam |
| 6,366,832 B2 | 4/2002 | Lomonaco et al. |
| 6,367,261 B1 | 4/2002 | Marshall et al. |
| 6,393,842 B2 | 5/2002 | Kim |
| 6,401,462 B1 | 6/2002 | Bielinski |
| 6,412,287 B1 | 7/2002 | Hughes et al. |
| 6,446,442 B1 | 9/2002 | Batchelor et al. |
| 6,477,844 B2 | 11/2002 | Ohkubo et al. |
| 6,481,213 B2 | 11/2002 | Carr et al. |
| 6,510,696 B2 | 1/2003 | Guttman et al. |
| 6,530,231 B1 | 3/2003 | Nagy et al. |
| 6,530,842 B1 | 3/2003 | Wells et al. |
| 6,530,920 B1 | 3/2003 | Whitcroft et al. |
| 6,539,725 B2 | 4/2003 | Bell |
| 6,539,729 B2 | 4/2003 | Tupis et al. |
| 6,560,968 B2 | 5/2003 | Ko |
| 6,563,039 B2 | 5/2003 | Caillat et al. |
| RE38,128 E | 6/2003 | Gallup et al. |
| 6,580,025 B2 | 6/2003 | Guy |
| 6,598,403 B1 | 7/2003 | Ghoshal |
| 6,598,405 B2 | 7/2003 | Bell |
| 6,606,866 B2 | 8/2003 | Bell |
| 6,625,990 B2 | 9/2003 | Bell |
| 6,637,210 B2 | 10/2003 | Bell |
| 6,650,968 B2 | 11/2003 | Hallum et al. |
| 6,653,002 B1 | 11/2003 | Parise |
| 6,672,076 B2 | 1/2004 | Bell |
| 6,807,811 B2 | 10/2004 | Lee |
| 6,812,395 B2 | 11/2004 | Bell |
| 6,907,739 B2 | 6/2005 | Bell |
| 6,948,321 B2 | 9/2005 | Bell |
| 6,959,555 B2 | 11/2005 | Bell |
| 6,986,247 B1 | 1/2006 | Parise |
| 7,100,369 B2 | 9/2006 | Yamaguchi et al. |
| 7,111,465 B2 | 9/2006 | Bell |
| 7,231,772 B2 | 6/2007 | Bell |
| 7,246,496 B2 | 7/2007 | Goenka et al. |
| 7,273,981 B2 | 9/2007 | Bell |
| 7,421,845 B2 | 9/2008 | Bell |
| 7,426,835 B2 | 9/2008 | Bell |
| 7,587,902 B2 | 9/2009 | Bell |
| 7,608,777 B2 | 10/2009 | Bell et al. |
| 2001/0005990 A1 | 7/2001 | Kim |
| 2001/0029974 A1 | 10/2001 | Cohen et al. |
| 2002/0014261 A1 | 2/2002 | Caillat et al. |
| 2003/0024565 A1 | 2/2003 | Guy |
| 2003/0029175 A1 | 2/2003 | Lee |
| 2003/0094265 A1 | 5/2003 | Chu et al. |
| 2004/0055312 A1 | 3/2004 | Bell |
| 2004/0076214 A1 | 4/2004 | Bell |
| 2004/0177876 A1 | 9/2004 | Hightower |
| 2004/0261829 A1 | 12/2004 | Bell |
| 2004/0261831 A1 | 12/2004 | Tsuneoka |
| 2005/0194034 A1 | 9/2005 | Yamaguchi et al. |
| 2005/0263177 A1 | 12/2005 | Bell |
| 2006/0005548 A1 | 1/2006 | Ruckstuhl |
| 2006/0075758 A1 | 4/2006 | Rice et al. |

| | | | | | | |
|---|---|---|---|---|---|---|
| 2006/0130888 A1 | 6/2006 | Yamaguchi et al. | | JP | 10-290590 | 10/1998 |
| 2006/0150657 A1 | 7/2006 | Spurgeon et al. | | JP | 11-317481 | 11/1998 |
| 2006/0157102 A1 | 7/2006 | Nakajima et al. | | JP | 11-201475 A | 7/1999 |
| 2006/0174633 A1 | 8/2006 | Beckley | | JP | 11182907 A | 7/1999 |
| 2006/0188418 A1 | 8/2006 | Park et al. | | JP | 11-274574 | 10/1999 |
| 2007/0000255 A1 | 1/2007 | Elliot et al. | | JP | H2000-58930 | 2/2000 |
| 2007/0033951 A1 | 2/2007 | Goenka et al. | | JP | 2000-185542 | 7/2000 |
| 2007/0220902 A1 | 9/2007 | Matsuoka et al. | | JP | H2000-214934 | 8/2000 |
| 2007/0272290 A1 | 11/2007 | Sims et al. | | JP | 2000-274871 A | 10/2000 |
| 2008/0035195 A1 | 2/2008 | Bell | | JP | 2000-274874 | 10/2000 |
| 2008/0173342 A1 | 7/2008 | Bell | | JP | 2000-286469 A | 10/2000 |
| 2008/0245398 A1 | 10/2008 | Bell | | JP | 2000-323759 | 11/2000 |
| 2008/0250794 A1 | 10/2008 | Bell | | JP | 200124240 A | 1/2001 |
| 2008/0289677 A1 | 11/2008 | Bell | | JP | 2001-210879 | 8/2001 |
| 2008/0307796 A1 | 12/2008 | Bell | | JP | 2001-267642 A | 9/2001 |
| 2009/0000310 A1 | 1/2009 | Bell et al. | | JP | 2001-336853 | 1/2002 |
| 2009/0007572 A1 | 1/2009 | Bell et al. | | JP | 2002-13758 | 1/2002 |
| 2009/0007952 A1 | 1/2009 | Kondoh et al. | | JP | 2002-199761 | 7/2002 |
| 2009/0139556 A1 | 6/2009 | Bell et al. | | JP | 2002232028 A | 8/2002 |
| 2010/0024859 A1 | 2/2010 | Bell et al. | | JP | 2003-86223 | 3/2003 |
| 2010/0031987 A1 | 2/2010 | Bell | | JP | 2005 317648 A | 11/2005 |
| 2010/0031988 A1 | 2/2010 | Bell | | JP | 2006 214350 | 2/2006 |
| 2010/0052374 A1 | 3/2010 | Bell | | JP | 2008 042994 | 10/2008 |
| 2010/0095996 A1 | 4/2010 | Bell | | JP | 2009-247206 | 10/2009 |
| 2010/0236595 A1 | 9/2010 | Bell | | JP | 4460219 | 2/2010 |
| | | | | KR | 10-0972545 | 7/2010 |

FOREIGN PATENT DOCUMENTS

| | | | | | |
|---|---|---|---|---|---|
| CN | 1236429 A | 11/1999 | LU | 66619 | 2/1973 |
| CN | 1249067 A | 3/2000 | RU | 2 092 753 C1 | 10/1997 |
| CN | 1343294 A | 4/2002 | RU | 2 099 642 C1 | 12/1997 |
| CN | 101720414 A | 6/2010 | RU | 2 142 178 C1 | 11/1999 |
| DE | 13 01 454 B | 8/1969 | RU | 2 154 875 C2 | 8/2000 |
| DE | 43 29 816 | 3/1994 | RU | 2174475 | 10/2001 |
| EP | 0 389 407 A | 9/1990 | SE | 329 870 | 10/1970 |
| EP | 0 545 021 A | 6/1993 | SE | 337 227 | 5/1971 |
| EP | 0834421 | 4/1998 | SU | 184886 A | 7/1966 |
| EP | 1 324 400 A | 7/2003 | SU | 1142711 A | 2/1985 |
| EP | 02 72 937 | 12/2003 | SU | 1170234 A | 7/1985 |
| EP | 1 475 532 A | 11/2004 | SU | 1196627 A | 12/1985 |
| EP | 1 641 067 | 3/2006 | WO | WO 95/01500 | 1/1995 |
| EP | 1 679 480 A | 7/2006 | WO | WO 97/47930 | 12/1997 |
| EP | 1 366328 B1 | 8/2008 | WO | WO 99/58907 | 11/1999 |
| FR | 1 280 711 A | 1/1962 | WO | WO 01/52332 | 7/2001 |
| FR | 2 261 638 A | 9/1975 | WO | WO 02/00458 | 1/2002 |
| FR | 2 419 479 A | 10/1979 | WO | WO 02/065029 A1 | 8/2002 |
| FR | 2 550 324 A | 2/1985 | WO | WO 02/065030 A1 | 8/2002 |
| FR | 2 879 728 A | 6/2006 | WO | WO 02/081982 | 10/2002 |
| GB | 231 192 A | 5/1926 | WO | WO 03/014634 | 2/2003 |
| GB | 817 077 | 7/1959 | WO | WO 03/090286 A | 10/2003 |
| GB | 952 678 A | 3/1964 | WO | WO 03/104726 | 12/2003 |
| GB | 1 040 485 A | 8/1966 | WO | WO 2004/019379 A | 3/2004 |
| GB | 2 027 534 | 2/1980 | WO | WO 2004/092662 | 10/2004 |
| GB | 2 267 338 | 12/1993 | WO | WO 2005/020340 A | 3/2005 |
| GB | 2 333 352 | 7/1999 | WO | WO 2005/020422 A | 3/2005 |
| JP | 356018231 A | 2/1981 | WO | WO 2005/023571 | 3/2005 |
| JP | 60-80044 | 7/1985 | WO | WO 2005/098225 A | 10/2005 |
| JP | 63-262076 A | 10/1988 | WO | WO 2006/037178 A | 4/2006 |
| JP | 01131830 | 5/1989 | WO | WO 2006/043514 A | 4/2006 |
| JP | 01 200122 | 8/1989 | WO | WO 2006/064432 A | 6/2006 |
| JP | 01-281344 | 11/1989 | WO | WO 2007/001289 | 1/2007 |
| JP | 03-102219 | 10/1991 | WO | WO 2008/148042 | 12/2009 |
| JP | 04103925 | 4/1992 | WO | WO 2010/014292 | 2/2010 |
| JP | 04-165234 | 6/1992 | WO | WO 2010/014958 | 2/2010 |
| JP | 405219765 A | 8/1993 | WO | WO 2010/004575 | 4/2010 |
| JP | 7-198284 | 1/1995 | WO | WO 2009/149207 | 5/2010 |
| JP | A-7-7187 | 1/1995 | | | |
| JP | 07-074397 | 3/1995 | | | |
| JP | 07-54189 | 6/1995 | | | |
| JP | A-7-202275 | 8/1995 | | | |
| JP | 07-253224 | 10/1995 | | | |
| JP | 07253264 A | 10/1995 | | | |
| JP | 08-098569 | 4/1996 | | | |
| JP | 08-222771 | 8/1996 | | | |
| JP | A 8-293627 | 11/1996 | | | |
| JP | 09042801 A | 2/1997 | | | |
| JP | 09-092761 | 4/1997 | | | |
| JP | 09-254630 | 9/1997 | | | |
| JP | H10-163538 | 6/1998 | | | |
| JP | 10-275943 | 10/1998 | | | |

OTHER PUBLICATIONS

Bell, L.E., "Alternate Thermoelectric Thermodynamic Cycles with Improved Power Generation Efficiencies," 2003 Twenty-Second International Conference on Thermoelectrics—ICT LA Grande Motte, France, Aug. 17-21, 2003, Piscataway, NJ, USA, IEEE, Aug. 17, 2003, pp. 558-562, XP010697375, ISBN: 0-7803-8301-X.

Bell, L.E., "Increased Thermoelectric System Thermodynamic Efficiency by Use of Convective Heat Transport," 2002 Proceedings IT '02, Twenty-First International Conference on Thermoelectrics, Aug. 25-29, 2002, Piscataway, NJ, USA, IEEE, Aug. 25, 2002, pp. 488-499, XP010637529, ISBN: 0-7803-7683-8.

Bell, L.E., "Use of Thermal Isolation to Improve Thermoelectric system Operating Efficiency," 2002 Proceedings ICT '02, Twenty- First International Conference on Thermoelectrics, Aug. 25, 2002, Piscataway, NJ, USA, IEEE, Aug. 25, 2002, pp. 477-487, XP010637528, ISBN: 0-7803-7683-8.
Buist, R.J., et al., "A New Concept for Improving Thermoelectric Heat Pump Efficiency," Borg-Warner, Thermoelectrics, Wolf and Algonquin Road, pp. 60-63, 1976.
Buist, R., et al., "Theoretical Analysis of Thermoelectric Cooling Performance Enhancement Via Thermal and Electrical Pulsing," *Journal of Thermolectricity*, No. 4, 1996.
CRC Handbook of Thermoelectrics, ed. D.M. Rowe, Chapter 54, Medium-Scale Cooling: Thermoelectric Technology and Chapter 55, Modeling of Thermoelectric Cooling Systems, (ISBN: 0-8493-0146-7), Jul. 1995, pp. 667-683.
Database WPI Week 198227 Thomson Scientific, London, GB, AN 1982-J1035E, XP002485188 & SU 861 869 B (Bochin G V) Sep. 7, 1981 & SU 861 869 A1 (Bochin German V [SU]; Butyrskij Velentin; Kochkarev Vladimir; Kubalov) Sep. 7, 1981.
Diller, R. W., et al., "Experimental results confirming improved performance of systems using thermal isolation," 2002 Proceedings ICT '02, Twenty-First International Conference on Thermoelectrics, Aug. 25-29, 2002, Piscataway, NJ USA, IEEE, Aug. 25, 2002, pp. 548-550, XP010637541 ISBN: 0-7803-7683-8.
Diller, R.W., et al., "Experimental Results Confirming Improved Efficiency of Thermoelectric Power Generation Systems with Alternate Thermodynamic Cycles," $22^{nd}$ International Conference on Thermoelectrics, 2003, pp. 571-573.
Goldsmid, H.J., "Electronic Refrigeration," Pion Ltd, 207 Brondesbury Park, London (1986).
Ikoma, K., et al., "Thermoelectric Module and Generator for Gasoline Engine Vehicles," $17^{th}$ Int'l Conf. on Thermoelectrics, Nagoya, Japan, pp. 464-467 (1998).
International Search Report for PCT/US03/24899, dated May 18, 2005.
International Search Report for PCT/US02/03772, dated Jul. 11, 2002.
International Search Report for PCT/US04/026757, dated Apr. 7, 2005.
International Search Report for Application No. EP 02 72 937: Applicant: BSST, LLC, dated Jun. 13, 2005.
Miner, A., et al., "Thermo-Electro-Mechanical Refrigeration Based on Transient Thermoelectric Effects," *Applied Physics Letters*, vol. 75, pp. 1176-1178 (1999).
Tada, S., et al., "A New Concept of Porous Thermoelectric Module Using a Reciprocating Flow for Cooling/Heating Systems (Numerical Analysis for Heating Systems)," $16^{th}$ International Conference on Thermoelectrics (1977).
Crane et al. "Progress Towards Maximizing the Performance of a Thermoelectric Power Generator," Thermoelectrics, 2006, ICT '06, 25th International Conference ON, IEEE, PI, Aug. 1, 2006, pp. 11-16.
Fleurial et al. "Development of Segmented Thermoelectric Multicouple Converter Technology," Aerospace Conference, 2006 IEEE Big Sky, MT, US Mar. 4-11, 2006, Piscataway, NH, USA, IEEE, Mar. 4, 2006, pp. 1-10.
International Search Report and Written Opinion for PCT/US2007/016873 (BSST.1HPC1) mailed Mar. 30, 2009.
International Search Report and Written Opinion for PCT/US2007/016924 (BSST.1HPC2) mailed Jul. 4, 2008.
International Preliminary Report on Patentability for PCT/US2007/016924 (BSST.1HPC2) mailed Jan. 20, 2009.
Snyder, Jeffrey G. "Application of the compatibility factor to the design of segmented and cascaded thermoelectric generators," Applied Physics Letters, AIP, American Institute of Physics, Melville, NY, vol. 84, No. 13, Mar. 29, 2004, pp. 2436-2438.
Bass, J.C. et al., "Performance of the 1 kW Thermoelectric Generator for Diesel Engines", American Institute of Physics, 1995, p. 295-298.
Bell, Lon E., "High Power Density Thermoelectric Systems", BSST LLC, Irwindale, CA, 23rd International Conference on Thermoelectronics, Adelaide, Australia, Jul. 2004.
Bell, L.E., "Increased Thermoelectric System Thermodynamic Efficiency by Use of Convective Heat Transport," Thermoelectrics, 2002. Proceedings IT '02. Twenty-First International Conference on Aug. 25-29, 2002, Piscataway, NJ, USA, IEEE, Aug. 25, 2002, pp. 488-499, XP010637529, ISBN: 0-7803-7683-8.

Bell, L.E., "Use of Thermal Isolation to Improve Thermoelectric system Operating Efficiency," Thermoelectrics, 2002. Proceedings ICT '02. Twenty-First International Conference on Aug. 25, 2002, Piscataway, NJ, USA, IEEE, Aug. 25, 2002, pp. 477-487, XP010637528, ISBN: 0-7803-7683-8.
Birkholz, Ulrich et al., "Conversion of Waste Exhaust Heat in Automobiles Using FeSi2-Thermoelements,"7th International Conference on TE Energy Conversion, p. 124-128.
BSST LLC, "Freedom Car & Vehicle Technologies Program, BSST LLC Project Phase 1 Report: High Efficiency Thermoelectric Waste Energy Recovery System for Passenger Vehicle Application", U.S. Department of Energy, Jun. 1, 2005, p. 1-95.
Cobble, Milan H., "Calculations of Generator Performance", CRC Press, Inc. 1995, p. 489.
Crane, D. T., "Modeling High-Power Density Thermoelectric Assemblies Which Use Thermal Isolation," BSST LLC, Irwindale, CA, 23rd International Conference of Thermoelectronics, Adelaide, Australia, Jul. 2004.
Crane, Douglas T., "Optimizing Thermoelectric Waste Heat Recovery From An Automobile Cooling System, Dissertation" submitted to the Faculty of Graduate School of the University of Maryland, 2003.
Derwent-ACC-No. 1998-283540, Kwon, H et al., Hyundai Motor Co., corresponding to KR 97026106 A, published Jun. 24, 1997 (2 pages).
Hendricks, Terry et al., "Advanced Thermoelectric Power System Investigations for Light-Duty and Heavy Duty Applications," National Renewable Energy Laboratory, Center for Transportation Technology & Systems, Colorado, 2002.
Hsu, Kuei Fang et al., Cubic AgPbmSbTe2+m: Bulk Thermoelectric Materials with High Figure of Merit, Science, Feb. 6, 2004, p. 818-821, vol. 303.
European Examination Report re EP 04 781 451.2, dated May 26, 2010.
International "Supplemental European" Search Report for EPO Application No. EP 02 72 937; dated May 3, 2005 in 3 pgs.
International Search Report for PCT/US 02/03654 mailed on Jun. 12, 2002 (completion date May 20, 2002).
International Search Report for PCT/US 02/03659 mailed on Aug. 6, 2002 (completion date Jul. 9, 2002).
International Search Report for PCT/US 02/06285 mailed on Jun. 12, 2002 (completion date May 11, 2002).
International Search Report for PCT/US 02/25233 mailed on Nov. 29, 2002 (completion date Sep. 24, 2002).
International Preliminary Report on Patentability for PCT/US2008/066208, completion date Sep. 15, 2009, in 15 pgs.
International Search Report for PCT/US 03/026560 mailed on Nov. 17, 2004.
International Search Report for PCT/US 03/17834 mailed on Sep. 2, 2003 (completion date Jul. 29, 2003).
International Search Report for PCT/US04/026560; dated Nov. 25, 2004.
International Search Report for PCT/US2006/025330, mailed Jul. 11, 2007 (completion date Oct. 29, 2007).
International Search Report for PCT/US2008/064763, mailed Dec. 5, 2008.
International Search Report and Written Opinion for PCT/US2009/046166, mailed Mar. 23, 2010 in 21 pages.
International Search and Written Opinion Report for PCT/US2009/045693, mailed Jul. 27, 2010.
International Search Report for PCT/US2009/061944, dated Jan. 1, 2010.
International Partial Search Report (included with Invitation to pay) for PCT/US2010/035321, mailed Aug. 3, 2010.
JP 2001-267642 A, Derwent abstract of Kushibiki et al., patent published Sep. 28, 2001.
Japanese Office Action re JP Patent Application No. 2003-519322, dated Feb. 1, 2008.
Japanese Decision on Appeal re JP Patent Application No. 2003519322, dated Feb. 17, 2010.

Japanese 2nd Office Action re JP Patent Application No. 200480026626.4 issued on Feb. 5, 2010.

Japanese 3rd Office Action re JP Patent Application No. 200480026626.4 issued on Jul. 1, 2010.

Japanese Office Action re JP Patent Application No. 2006-523963 mailed Jan. 6, 2010.

Korean Office Action re KR Patent Application No. 10-2005-7002550, dated Feb. 25, 2010.

Lofy, John et al., "Thermoelectrics for Environmental Control Automobiles," 21st International Conference on Thermoelectronics, 2002, p. 471-476.

Menchen, William R., et al., "Thermoelectric Conversion to Recover Heavy Duty Diesel Exhaust Energy," Teledyne Energy Systems, Timonium, MD 1990.

Snyder, G. Jeffrey, et al., "Thermoelectric Efficiency and Compatibility," The American Physical Society, October 2, 2003, vol. 91, No. 14.

Ursell, T.S. et al., "Compatibility of Segmented Thermoelectric Generators," 21st International Conference on Thermoelectronics, 2002, p. 412-417.

* cited by examiner

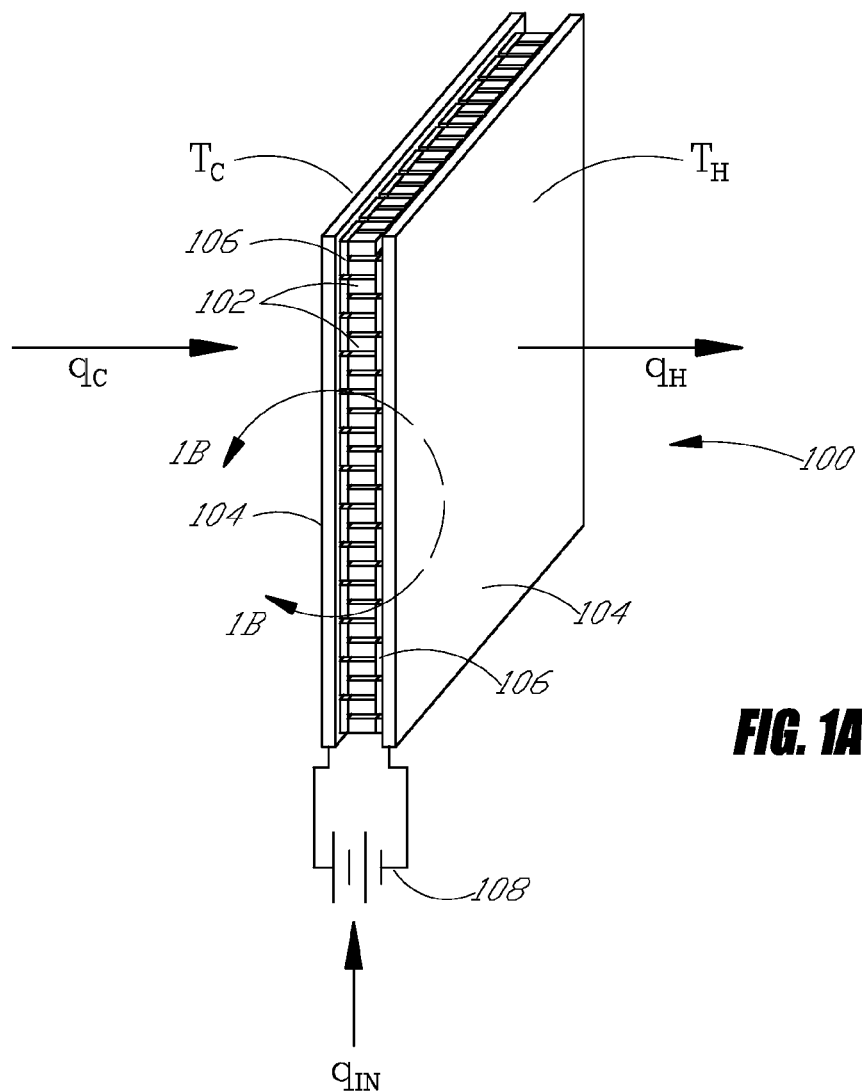
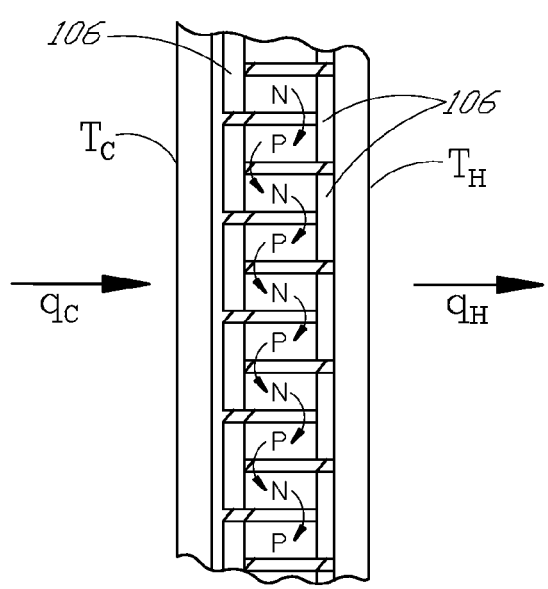

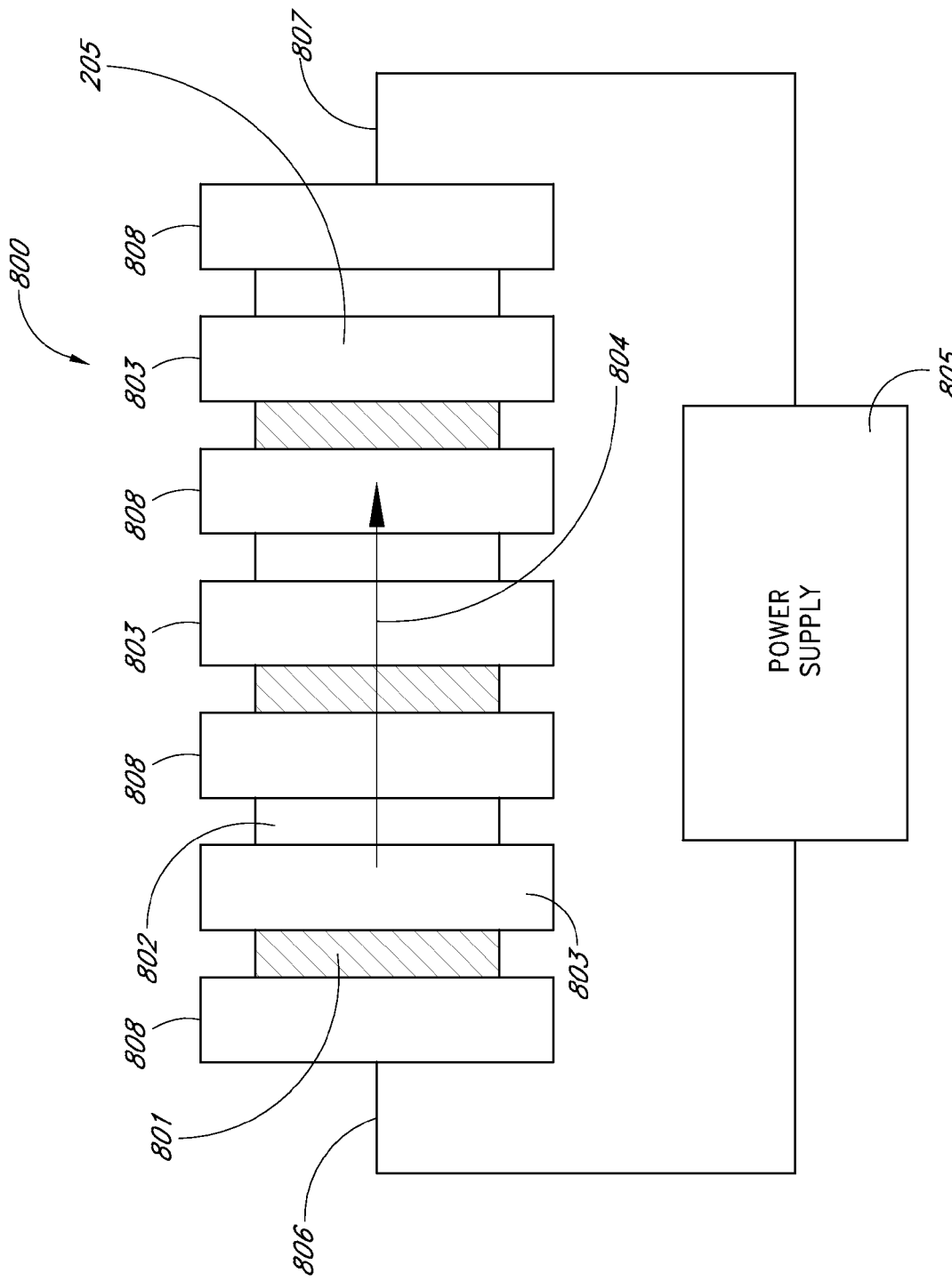

HIGH CAPACITY THERMOELECTRIC TEMPERATURE CONTROL SYSTEM

CONTINUING APPLICATION DATA

This application is a continuation-in-part of U.S. patent application Ser. No. 11/136,334, filed May 24, 2005 and incorporated in its entirety by reference herein, which is a continuation of U.S. Pat. No. 6,959,555, filed Aug. 18, 2003 and incorporated in its entirety by reference herein, which is a continuation-in-part of U.S. Pat. No. 7,231,772, filed Aug. 23, 2002 and incorporated in its entirety by reference herein, and which is a continuation-in-part of U.S. Pat. No. 7,111,465, filed Mar. 31, 2003 and incorporated in its entirety by reference herein, which is a continuation of U.S. Pat. No. 6,539,725, filed Apr. 27, 2001 and incorporated in its entirety by reference herein, which is related to and claims the benefit of U.S. Provisional Patent Application No. 60/267,657 filed Feb. 9, 2001 and incorporated in its entirety by reference herein. This application also claims the benefit of U.S. Provisional Patent Application No. 60/834,005, filed Jul. 28, 2006 and U.S. Provisional Patent Application No. 60/834,007, filed Jul. 28, 2006, both of which are incorporated in their entireties by reference herein.

BACKGROUND OF THE INVENTION

1. Field of the Invention

This disclosure relates to improved configurations for solid-state cooling, heating and power generation systems.

2. Description of the Related Art

Thermoelectric devices (TEs) utilize the properties of certain materials to develop a temperature gradient across the material in the presence of current flow. Conventional thermoelectric devices utilize P-type and N-type semiconductors as the thermoelectric material within the device. These are physically and electrically configured in such a manner that the desired function of heating or cooling is obtained.

The most common configuration used in thermoelectric devices today is illustrated in FIG. 1A. Generally, P-type and N-type thermoelectric elements 102 are arrayed in a rectangular assembly 100 between two substrates 104. A current, I, passes through both element types. The elements are connected in series via copper shunts 106 saddled to the ends of the elements 102. A DC voltage 108, when applied, creates a temperature gradient across the TE elements. TEs are commonly used to cool liquids, gases and solid objects.

Solid-state cooling, heating and power generation (SSCHP) systems have been in use since the 1960's for military and aerospace instrumentation, temperature control and power generation applications. Commercial usage has been limited because such systems have been too costly for the function performed, and have low power density so SSCHP systems are larger, more costly, less efficient and heavier than has been commercially acceptable.

Recent material improvements offer the promise of increased efficiency and power densities up to one hundred times those of present systems. However, Thermoelectric (TE) device usage has been limited by low efficiency, low power density and high cost.

It is well-known from TE design guides (Melcor Corporation "Thermoelectric Handbook" 1995 pp. 16-17) that in today's TE materials, the cooling power at peak efficiency produced by a module with ZT=0.9 is about 22% of the maximum cooling power. Thus, to achieve the highest possible efficiency, several TE modules are required compared to the number required for operation at maximum cooling. As a result, the cost of TE modules for efficient operation is significantly higher and the resulting systems are substantially larger.

It is known from the literature (for example, see Goldsmid, H. J. "Electronic Refrigeration" 1986, p. 9) that the maximum thermal cooling power can be written as:

$$q_{COPT} = I_{OPT}\alpha_C - \tfrac{1}{2} I^2_{OPT} R - K\Delta T, \qquad (1)$$

where:
- $q_{COPT}$ is the optimum cooling thermal power;
- $I_{OPT}$ is the optimum current;
- $\alpha$ is the Seebeck Coefficient;
- R is the system electrical resistance;
- K is the system thermal conductance;
- $\Delta T$ is the difference between the hot and cold side temperatures; and
- $T_C$ is the cold side temperature.

Further, from Goldsmid's:

$$I_{OPT} = \frac{\alpha}{R} \frac{1}{\left(\sqrt{ZT_{AVE}-1}\right)} = \frac{\alpha}{R(M-1)}, \qquad (2)$$

where:
- Z is the material thermoelectric figure of merit;
- $T_{AVE}$ is the average of the hot and cold side temperatures; and
- $M = \sqrt{ZT_{AVE}+1}$.

Substitution Equation (2) into (1) yields:

$$q_{OPT} = \left[\frac{ZT_C}{(M-1)}\left(\frac{\Delta T}{T_C} - \frac{1}{2(M-1)}\right) - \Delta T\right]K. \qquad (3)$$

The term on the right side of Equation (3) in brackets is independent of the size (or dimensions) of the TE system, and so the amount of cooling $q_{OPT}$ is only a function of material properties and K. For the geometry of FIG. 1, K can be written as:

$$K = \frac{\lambda A_C}{L_C}, \qquad (4)$$

where $\lambda$ is the average thermal conductivity of the N & P materials; $A_C$ is the area of the elements; and L is the length of each element.

Since $\alpha$ is an intrinsic material property, as long as the ratio Lc/Ac is fixed, the optimum thermal power $q_{OPT}$ will be the same. For current equal to $I_{OPT}$, the resistance is:

$$R_C = R_{OC} + R_{PC} = \frac{\rho_{TE} L_C}{A_C} + R_{PC}, \qquad (5)$$

where $\rho_{TE}$ is the intrinsic average resistivity of the TE elements; $R_{OC}$ is the TE material resistance; and $R_{PC}$ is parasitic resistances.

For the moment, assume RP is zero, then R is constant. $I_{OPT}$ is constant if $L_C/A_C$ is fixed. Only if the ratio Lc/Ac changes, does K and hence, $q_{COPT}$ and $R_{OC}$ and hence, $I_{OPT}$ changes.

Generally, it is advantageous to make a device smaller for the same cooling output. An important limitation in thermoelectric systems is that as, for example, the length $L_C$ is decreased for fixed $A_C$, the ratio of the parasitic resistive losses to TE material losses, $\phi_C$ becomes relatively large:

$$\phi_C = \frac{R_{PC}}{R_{OC}}. \quad (6)$$

This can be seen by referring to FIG. 1C, which depicts a typical TE couple. While several parasitic losses occur, one of the largest for a well-designed TE is that from shunt 106. The resistance of shunt 106 per TE element 102 is approximately, $$R_{PC} \approx \left(\frac{B_C + G_C}{W_C T_C}\right) P_{SC}, \quad (7)$$

where $G_C$ is the gap between the TE elements; $B_C$ is the TE element and shunt breadth; $W_C$ is the TE element and shunt width; $T_C$ is the shunt thickness; and $P_{SC}$ is the shunt resistivity.

For the geometry of FIG. 1, the resistance for a TE element is:

$$R_{OC} = \frac{P_{TE} L_C}{B_C W_C}, \quad (8)$$

where $L_c$ is the TE element length.
Thus, using Equations (7) and (8) in (6):

$$\phi_C \approx B_C \left(\frac{B_C + G_C}{T_C L_C}\right)\left(\frac{P_{SC}}{P_{TE}}\right). \quad (9)$$

SUMMARY OF THE INVENTION

In certain embodiments, a thermoelectric system is provided. The thermoelectric system comprises a first plurality of thermoelectric elements and a second plurality of thermoelectric elements. The thermoelectric system further comprises a plurality of heat transfer devices. Each heat transfer device has a first side in thermal communication with two or more thermoelectric elements of the first plurality of thermoelectric elements and a second side in thermal communication with one or more thermoelectric elements of the second plurality of thermoelectric elements, so as to form a stack of thermoelectric elements and heat transfer devices. The two or more thermoelectric elements of the first plurality of thermoelectric elements are in parallel electrical communication with one another, and the two or more thermoelectric elements of the first plurality of thermoelectric elements are in series electrical communication with the one or more thermoelectric elements of the second plurality of thermoelectric elements.

In certain embodiments, a thermoelectric system is provided. The thermoelectric system comprises a plurality of thermoelectric modules and a plurality of heat transfer devices. Each heat transfer device comprises a housing and one or more heat exchanger elements inside the housing. Each heat transfer device accepts a working fluid to flow therethrough. At least some of the heat transfer devices are in thermal communication with and sandwiched between at least two thermoelectric modules of the plurality of thermoelectric modules so as to form a stack of alternating thermoelectric modules and heat transfer devices arranged to provide thermal isolation along a direction of a working medium movement.

In certain embodiments, a thermoelectric system is provided. The thermoelectric system comprises a plurality of thermoelectric modules and a plurality of heat transfer devices. Each heat transfer device accepts a working fluid to flow therethrough. At least some of the heat transfer devices are in thermal communication with and sandwiched between at least two thermoelectric modules of the plurality of thermoelectric modules so as to form a stack of alternating thermoelectric modules and heat transfer devices arranged to provide thermal isolation along a direction of a working medium movement. A first working fluid is cooled by flowing through a first set of the heat transfer devices and a second working fluid is heated by flowing through a second set of the heat transfer devices.

These and other aspects of the disclosure will be apparent from the figures and the following more detailed description.

BRIEF DESCRIPTION OF THE DRAWINGS

FIG. 1A-1B depicts a conventional TE module.

FIG. 8 depicts a system with TE elements arranged so that current passes directly through the array and thereby lowers cost, weight and size while providing improved performance.

DETAILED DESCRIPTION OF THE PREFERRED EMBODIMENT

Figure 1C:
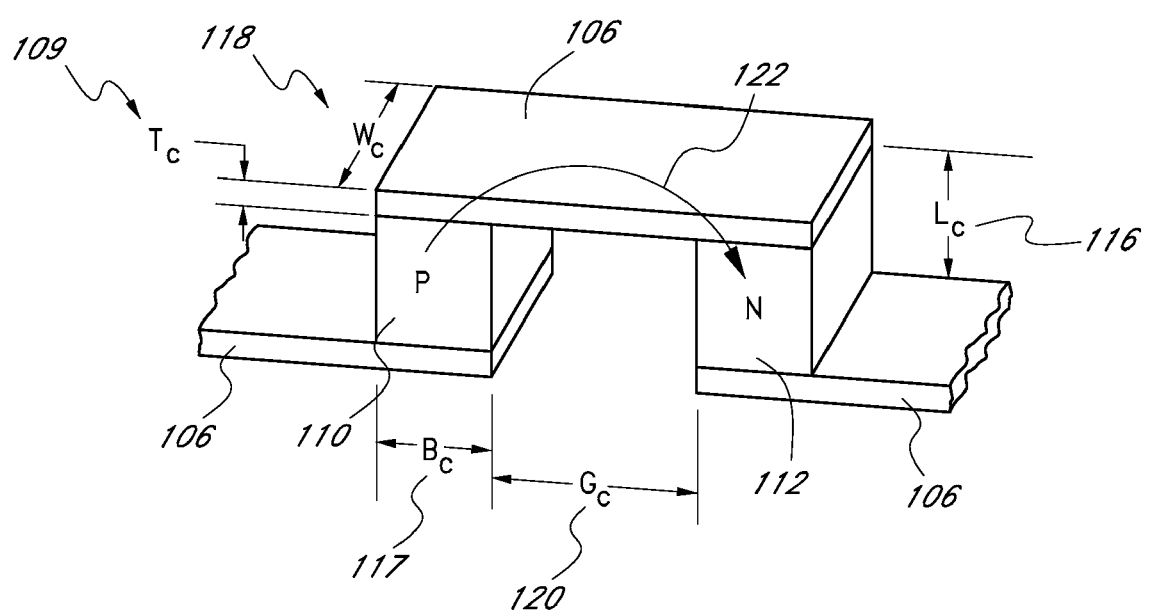
FIG. 1C depicts a conventional TE couple.

In the context of this description, the terms thermoelectric module and TE module are used in the broad sense of their ordinary and accustomed meaning, which is (1) conventional thermoelectric modules, such as those produced by Hi Z Technologies, Inc. of San Diego, Calif., (2) quantum tunneling converters, (3) thermionic modules, (4) magneto caloric modules, (5) elements utilizing one, or any combination of thermoelectric, magneto caloric, quantum, tunneling and thermionic effects, (6) any combination, array, assembly and other structure of (1) through (6) above. The term thermoelectric element, is more specific to indicate an individual element that operates using thermoelectric, thermionic, quantum, tunneling, and any combination of these effects.

In the following descriptions, thermoelectric or SSCHP systems are described by way of example. Nevertheless, it is intended that such technology and descriptions encompass all SSCHP systems.

Accordingly, the invention is introduced by using examples in particular embodiments for descriptive and illustrative purposes. A variety of examples described below illustrate various configurations and may be employed to achieve the desired improvements. In accordance with the present description, the particular embodiments and examples are only illustrative and not intended in any way to restrict the inventions presented. In addition, it should be understood that the terms cooling side, heating side, cold side, hot side, cooler side and hotter side and the like, do not indicate any particular temperature, but are relative terms. For example, the "hot," side of a thermoelectric element or array or module may be at ambient temperature with the "cold," side at a cooler temperature than the ambient. The converse may also be true. Thus, the terms are relative to each other to indicate that one side of the thermoelectric is at a higher or lower temperature than the counter-designated temperature side.

Efficiency gains for geometries described in U.S. Pat. No. 6,539,735, entitled Improved Efficiency Thermoelectrics Utilizing Thermal Isolation, yield an additional 50% to 100% improvement for many important applications. Combined with the material improvements being made, system efficiency gains of a factor of four or more appear possible in the near future. The prospects of these substantial improvements have lead to renewed interest in the technology and the effort to develop SSCHP systems for new applications.

In general, this disclosure describes a new family of SSCHP configurations. These configurations achieve compact, high-efficiency energy conversion and can be relatively low cost. Generally, several embodiments are disclosed wherein TE elements or modules (collectively called elements in this text) are sandwiched between heat exchangers. The TE elements are advantageously oriented such that for any two elements sandwiching a heat exchanger, the same temperature type side faces the heat exchanger. For example, the cooler side of each of the TE elements sandwiching a heat exchanger face the same heat exchanger or shunt, and thus each other. In a group of configurations, at least one working medium is passed sequentially through at least two heat exchangers so that the cooling or heating provided is additive on the working medium. This configuration has the added benefit that it utilizes the advantages of thermal isolation, as described in U.S. Pat. No. 6,539,725, in manufacturable systems that exhibit high system efficiency and power density as noted in the references above. As explained in that patent, in general, a TE device achieves increased or improved efficiency by subdividing the overall assembly of TE elements into thermally isolated subassemblies or sections. For example, the heat exchangers may be subdivided so as to provide thermal isolation in the direction of working medium flow. For example, a TE system has a plurality of TE elements forming a TE array with a cooling side and a heating side, wherein the plurality of TE elements are substantially isolated from each other in at least one direction across the array. Preferably, the thermal isolation is in the direction of the working media flow. This thermal isolation can be provided by having a heat exchanger configured in sections such that the heat exchanger has portions which are thermally isolated in the direction of working fluid flow.

In the present disclosure, having sequential use of heat exchangers of the same temperature type for the working fluid provides a type of thermal isolation in itself. In addition, the heat exchangers or the TE elements, or TE modules or any combination may be configured to provide thermal isolation in the direction of the working fluid flow over and above the thermal isolation provided by having a series or sequence of heat exchangers through which at least one working fluid passes in sequence.

The principles disclosed for cooling and/or heating applications, are equally applicable to power generation applications, and any configuration, design detail, and analogous part that may be combined in any way to produce an assembly for power generation, is also applicable. The system may be tuned in a manner to maximize the efficiency for the given application, but the general principles apply.

The embodiments described in this application lower the construction complexity and cost of SSCHP devices while still maintaining or improving efficiency gains from thermal isolation.

Also disclosed are several embodiments for reducing cost by using less TE material and facilitating operation closer to peak efficiency. Many embodiments achieve a substantial reduction in parasitic losses (see, e.g., FIGS. 12-31).

One aspect of the disclosed embodiments involves a thermoelectric system having a plurality of N-type thermoelectric elements and a plurality of P-type thermoelectric elements. Preferably, a plurality of first shunts and a plurality of second shunts are provided. At least some of the first shunts are sandwiched between at least one N-type thermoelectric element and at least one P-type thermoelectric element, and at least some of the second shunts sandwiched between at least one P-type thermoelectric element and at least one N-type thermoelectric elements, so as to form a stack of thermoelectric elements, with alternating first and second shunts, wherein at least some of the first shunts and at least some of the second shunts project away from the stack in differing directions.

Preferably, the thermoelectric elements are constructed to be quite thin, such as from 5 microns, to 1.2 mm, from 20 microns to 200 microns for superlattice and heterostructure thermoelectric designs, and in another embodiment from 100 to 600 microns. These designs provide for significant reduction in the usage of thermoelectric material.

In one embodiment, the thermoelectric system further comprises a current source electrically coupled to the stack, the drive current traversing through the heat transfer devices and thermoelectric elements in series. In another embodiment, the heat transfer devices thermally isolate at least some of the P-type thermoelectric elements from at least some of the N-type thermoelectric elements.

In one embodiment, the heat transfer devices accept a working fluid to flow through them in a defined direction. Preferably, the heat transfer devices are heat exchangers and may have a housing with one or more heat exchanger elements inside.

In another embodiment, at least some of the first shunts are constructed of a first electrode portion electrically isolated from and thermally coupled to a second shunt portion.

Figure 2:
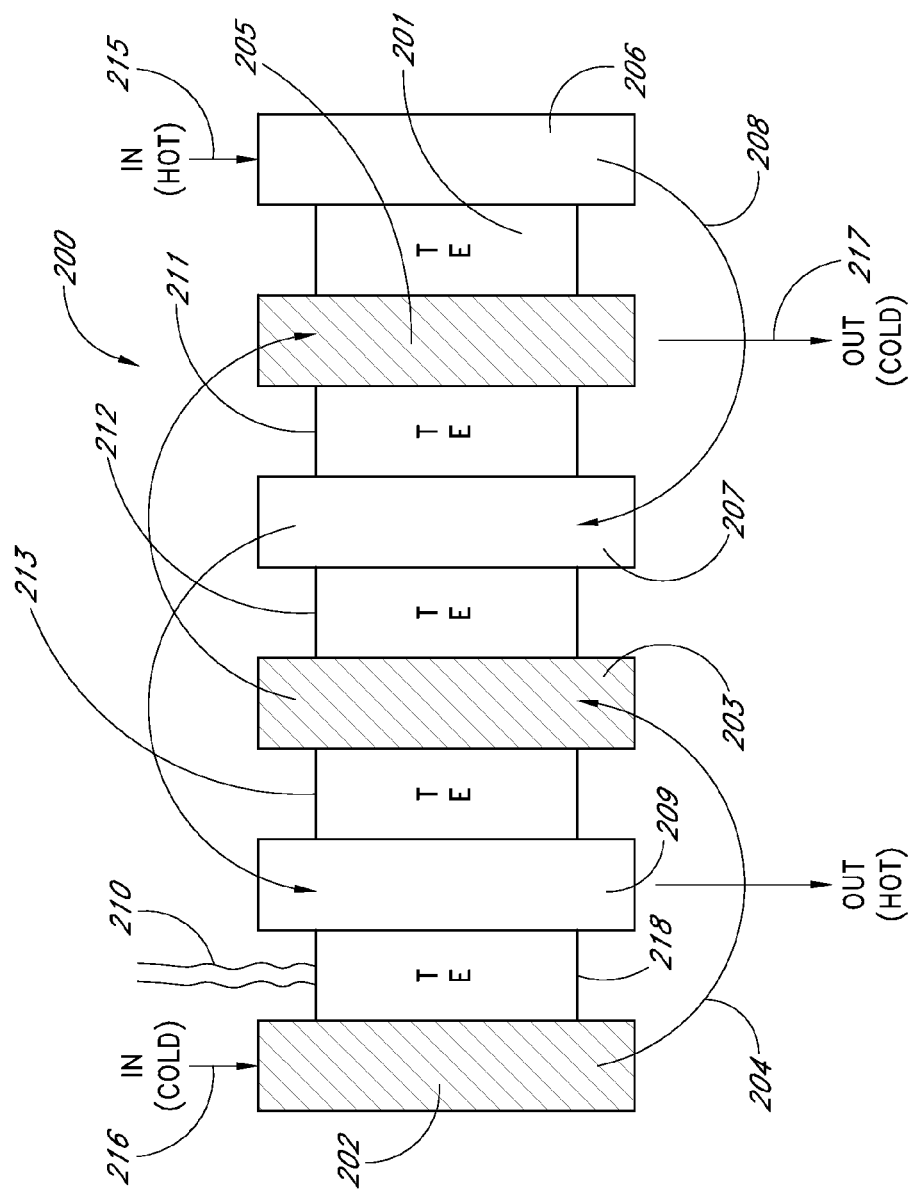
FIG. 2 depicts a general arrangement of a SSCHP system with thermal isolation and counter flow movement of its working media.

FIG. 2 illustrates a first generalized embodiment of an advantageous arrangement for a thermoelectric array 200. The array 200 has a plurality of TE modules 201, 211, 212, 213, 218 in good thermal communication with a plurality of first side heat exchangers 202, 203, 205 and a plurality of second side heat exchangers 206, 207 209. The designation first side heat exchanger and second side heat exchanger does not implicate or suggest that the heat exchangers are on one side or the other side of the entire SSCHP system, but merely that they are in thermal communication with either the colder side or the hotter side of the thermoelectric modules. This is apparent from the figure in that the heat exchangers are actually sandwiched between thermoelectric modules. In that sense, they are in thermal communication with a first side or a second side of the thermoelectric modules. The colder side of a first TE module 201 is in thermal contact with a first side heat exchanger 205 and the hot side of the TE module 201 is in thermal contact with an inlet second side heat exchanger 206. A second working media 215, such as a fluid, enters the array 200 in the upper right hand corner of FIG. 2 through the inlet second side heat exchange 206, and exits near the lower left from a final or outlet second side heat exchanger 209. A first working media 216 enters at the upper left through an inlet first side heat exchanger 202 and exits near the lower right from a final or outlet first side heat exchanger 205. Electrical wires 210 (and similarly for other TE Modules) connected to a power supply, not shown, connect to each TE module 201. First conduits 208, represented as lines on FIG. 2, convey the second working media 215 and second conduits 204 convey the first working media 216 sequentially through various heat exchangers 202, 203, 205, 206, 207 and 209 as depicted.

In operation, the second working media 215 absorbs heat from the TE module 201 as it passes downward through the inlet second side heat exchanger 206. The second working media 215 passes through conduit 208 and upwards into and through the second side heat exchanger 207. In good thermal communication with the heat exchanger 207 are the hotter sides of the TE modules 211 and 212, which have been configured so that their respective hotter sides face toward one another to sandwich the second side heat exchanger 207. The second side working media 215, is further heated as it passes through the second side heat exchanger 207. The second side working media 215 next passes through the second side heat exchanger 209, where again, the hotter sides of the TE modules 213 and 218 sandwich and transfer heat to the second side heat exchanger 209, further heating the second side working media 215. From the heat exchanger 209, the second working media 215 exits the array 200 from the outlet or final second side heat exchange 209.

Similarly, the first working media 216 enters the inlet first side heat exchanger 202 at the upper left corner of FIG. 2. This heat exchanger 202 is in good thermal communication with the colder side of the TE module 218. The first working media 216 is cooled as it passes through the inlet first side heat exchanger 202, on through another first side exchanger 203 and finally through the outlet first side heat exchanger 205, where it exits as colder working media 217.

The thermoelectric cooling and heating is provided by electrical power through wiring 210 into TE module 218, and similarly into all the other TE modules.

Thus, in sum, working media is placed in good thermal contact with the cold side of the TE module at the left hand side of the array, so that heat is extracted from the media. The media then contacts a second and third TE module where additional heat is extracted, further cooling the media. The process of incremental cooling continues, as the media progresses to the right through the desired number of stages. The media exits at the right, after being cooled the appropriate amount. Concurrently, a second media enters the system at the far right and is incrementally heated as it passes through the first stage. It then enters the next stage where it is further heated, and so on. The heat input at a stage is the resultant of the heat extracted from the adjacent TE modules' cold sides, and the electrical power into those modules. The hot side media is progressively heated as it moves in a general right to left direction.

In addition to the geometry described above, the system provides benefit if both media enter at the same temperature and progressively get hotter and colder. Similarly, the media can be removed from or added to the cool or hot side at any location within the array. The arrays can be of any useful number of segments such as 5, 7, 35, 64 and larger numbers of segments.

The system can also be operated by reversing the process with hot and cold media in contact with TE modules, and with the hot and cold media moving from opposite ends (as in FIG. 2 but with the hot media entering as media 216 and the cold media entering as media 215). The temperature gradient so induced across the TE modules produces an electric current and voltage, thus converting thermal power to electrical power. All of these modes of operation and those described in the text that follows are part of the inventions.

As illustrated in FIG. 2, the separation of the heat exchanger into a sequence of stages provides thermal isolation in the direction of flow of the working media from TE module to TE module. U.S. Pat. No. 6,539,725, entitled First Improved Efficiency Thermoelectrics Utilizing Thermal Isolation, filed Apr. 27, 2001 describes in detail the principles of thermal isolation which are exhibited throughout this description with various specific and practical examples for easy manufacturing. This patent application is hereby incorporated by reference in its entirety.

As described in U.S. Pat. No. 6,539,725, the progressive heating and cooling of media in a counter flow configuration as described in FIG. 2, can produce higher thermodynamic efficiency than under the same conditions in a single TE module without the benefit of the thermal isolation. The configuration shown in FIG. 2, thus presents an SSCHP system 200 that obtains thermal isolation through the segments or stages of heat exchangers sandwiched between thermoelectric modules in a compact easily producible design.

In addition to the features mentioned above, the thermoelectric modules themselves may be constructed to provide thermal isolation in the direction of media flow and each heat exchanger or some of the heat exchangers may be configured to provide thermal isolation in a individual heat exchanger through a configuration as will be described further in FIG. 5 or other appropriate configurations. In general, the heat exchanger could be segmented in the direction of flow to provide increased thermal isolation along the flow of a single TE module such as the TE module 218 and the inlet heat exchanger 202.

Figure 3:
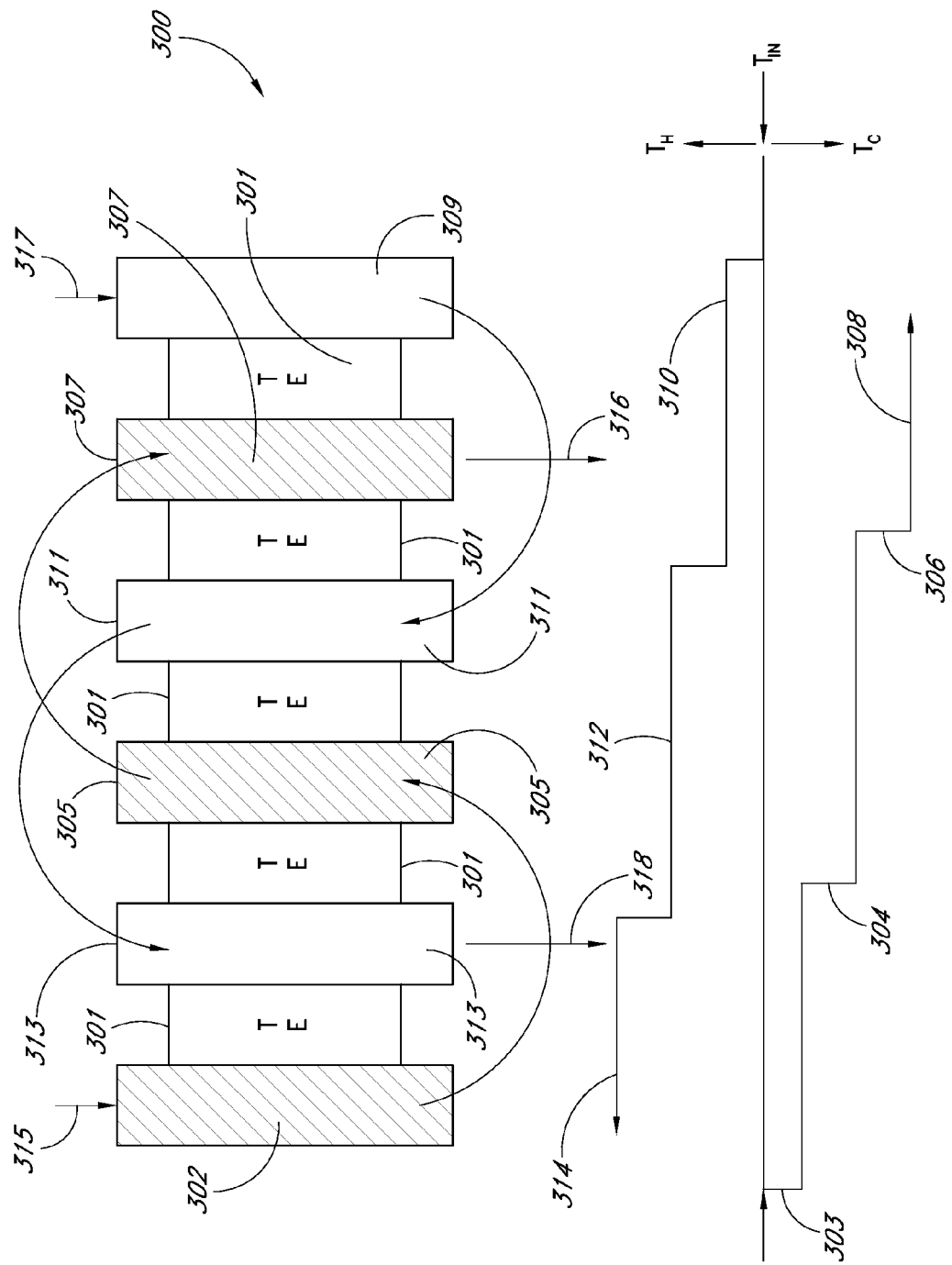
FIG. 3 depicts the temperature changes that occur in the media, as the working media progress through the system.

FIG. 3 depicts an array 300 of the same general design as in FIG. 2, consisting of a plurality of TE modules 301 and colder side heat exchangers 302, 305, and 307 connected so that a first working medium 315 follows the sequential heat exchanger to heat exchanger path shown. Similarly, a plurality of hot side heat exchangers 309, 311 and 313 convey a hotter side working medium 317 in a sequential or staged manner in the direction shown by the arrows. The TE modules 301 are arranged and electrically powered as in the description of FIG. 2.

The lower half of FIG. 3 depicts the cold side temperatures or temperature changes 303, 304, 306, 308 of the colder side working medium and hot side temperatures 310, 312, 314 of the hotter side working medium.

The colder side working medium 315 enters and passes through an inlet colder side heat exchanger 302. The working medium's temperature drop 303 in passing through the inlet colder side heat exchanger 302 is indicated by the drop 303 in the cold side temperature curve Tc. The colder side working medium 315 is further cooled as it passes through the next stage colder side heat exchanger 305, as indicated by a temperature drop 304 and again as it passes through a third colder side heat exchanger 307, with an accompanying temperature drop 306. The colder side working medium 315 exits as colder fluids 316 at temperature 308. Similarly, the hotter side working medium 317 enters a first or inlet hotter side heat exchanger 309 and exits at a first temperature 310 as indicated by the hotter side temperature curve $T_H$ in the FIG. 3. The hotter side working medium progresses through the array 300 in stages as noted in FIG. 2, getting progressively hotter, finally exiting after passing through outlet hotter side heat exchanger 313 as hotter working fluid at 318 and at a hotter temperature 314. It is readily seen that by increasing the number of stages (that is TE modules and heat exchangers) the amount of cooling and heating power can be increased, the temperature change produced by each heat exchanger can be reduced, and/or the amount of media passing through the array increased. As taught in the U.S. Pat. No. 6,539,725, efficiency also can increase with more stages, albeit at a diminishing rate.

Experiments and the descriptions referenced above, show that thermal isolation and the progressive heating and cooling achievable with the configuration of FIGS. 2 and 3 can result in significant efficiency gains, and are therefore important. With such systems, gains of over 100% have been achieved in laboratory tests.

Figure 4:
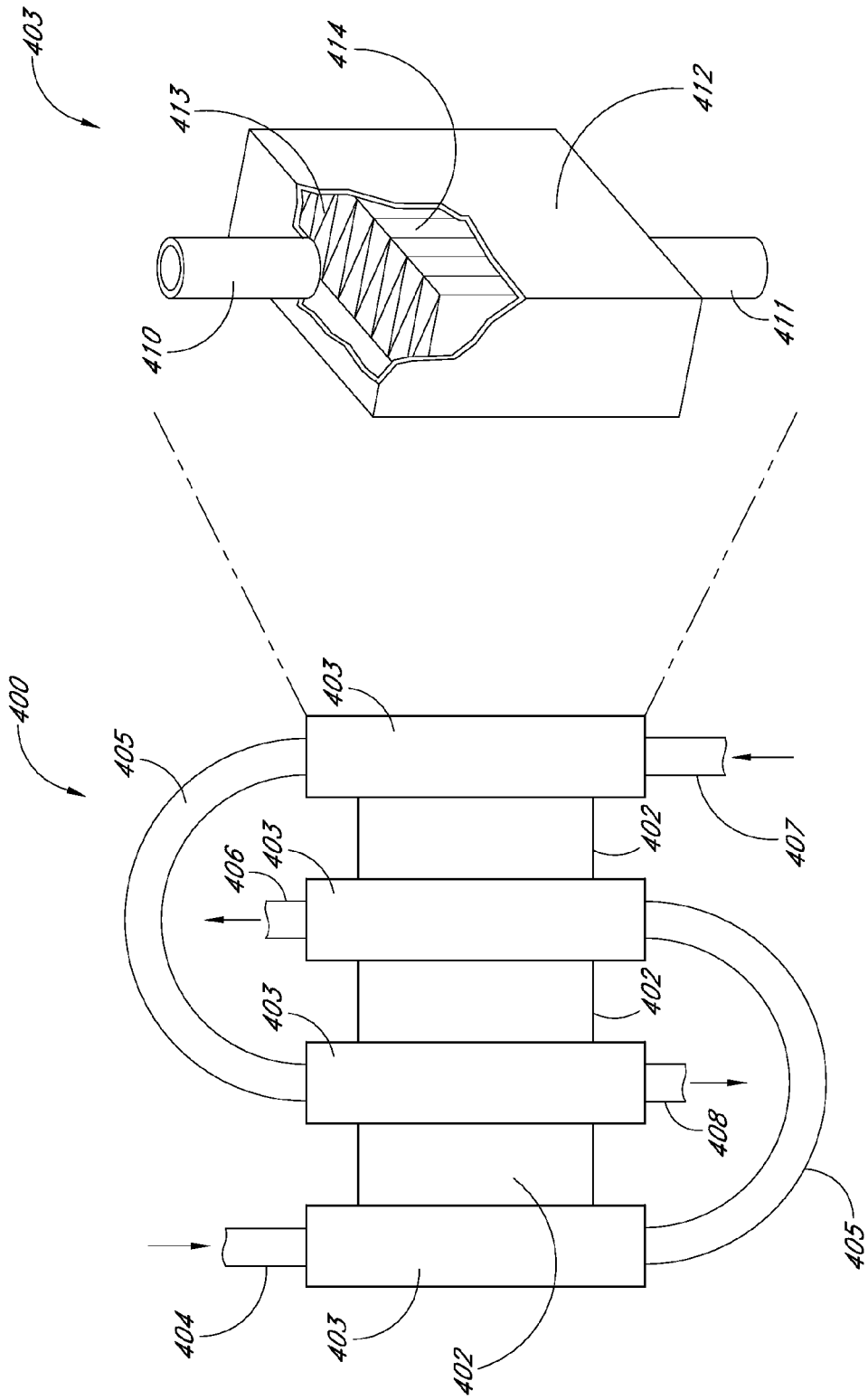
FIGS. 4A-4B depict a system with three TE modules, four fin heat exchangers, and liquid-working media.

FIG. 4A depicts an array 400 with three TE modules 402, four heat exchangers 403 and two conduits 405 configured as described in FIGS. 2 and 3. Colder and hotter side working fluids enters at a colder side inlet 404 and a hotter side inlet 407, respectively and exit respectively at a colder side exit 406 and a hotter side exit 408. FIG. 4B is a more detailed view of one embodiment of a heat exchanger 403. It is shown as a type suitable for fluid media. The heat exchanger assembly 403, has consists of an outer housing 412 with an inlet 410 and an exit 411, heat exchanger fins 414, and fluid distribution manifolds 413. The operation of array 400 is essentially the same as described in FIGS. 2 and 3. The number of the TE modules 402 is three in FIG. 4, but could be any number. Advantageously, the housing 412 is thermally conductive, being made from a suitable material such as corrosion protected copper or aluminum. In one embodiment, heat exchanger fins 414 advantageously are folded copper, or aluminum soldered or braised to the housing 412, so as to achieve good thermal conductivity across the interface to the TE Module. The Fins 414 can be of any form, but preferably of a design well suited to achieve the heat transfer properties desired for the system. Detailed design guidelines can be found in "Compact Heat Exchangers", Third Edition by W. M. Kays and A. L. London. Alternatively, any other suitable heat exchangers can be used, such as perforated fins, parallel plates, louvered fins, wire mesh and the like. Such configurations are known to the art, and can be used in any of the configurations in any of FIGS. 2 through 11.

FIG. 5A depicts an alternative configuration to that of FIG. 4 for the conduit connections to provide flow from heat exchanger stage to heat exchanger. The array 500 has first and second TE modules 501 and 510, three heat exchangers 502, 503 and 506, and a conduit 504. Of course, as with previous embodiments and configurations, the particular number of two first side heat exchangers 502, 503 and one second side heat exchanger 506 is not restrictive and other numbers could be provided.

Figure 5:
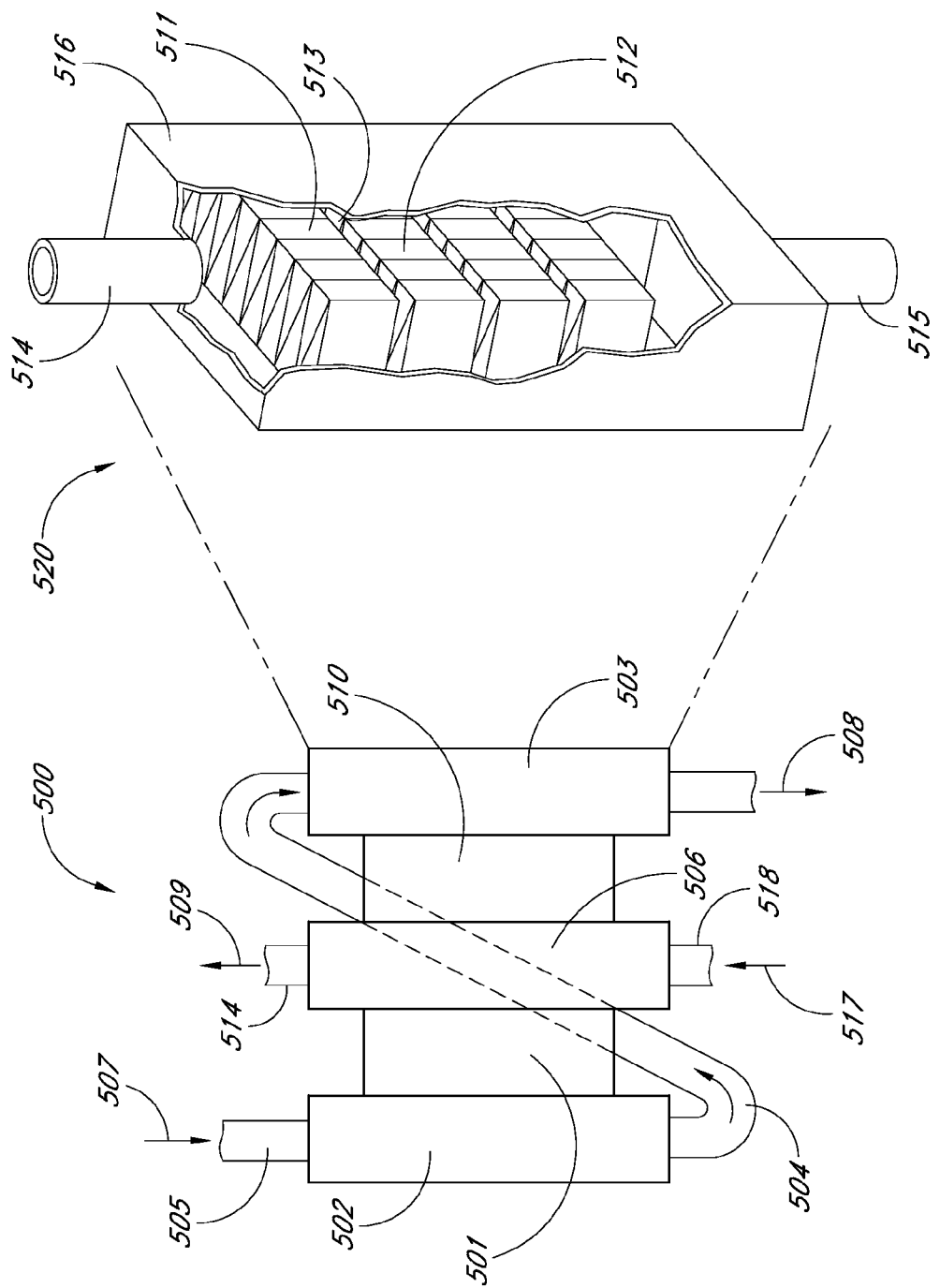
FIGS. 5A-5B depict a system with two TE modules, a segmented heat exchanger to achieve a degree of thermal isolation with a single heat exchanger, and counter flow of the liquid media.

FIG. 5B illustrates an enlarged view of a preferred embodiment for the heat exchangers 502, 503, 506. This heat exchanger configuration as shown in FIG. 5B would be appropriate for the other embodiments and can be used in any of the configuration in FIGS. 2-8 and FIG. 11. This advantageous embodiment for one or more of the heat exchangers in such configurations has an outer housing 516 with segmented heat exchanger fins 511 separated by gaps 513. Working fluid enters through an inlet 505 and exits through exit 508. As an alternative to gaps, the heat exchanger could be made so that it is anisotropic such that it is thermally conductive for a section and non-thermally conductive for another section rather than having actual physical gaps between heat exchanger fins. The point is for thermal isolation to be obtained between stages of an individual heat exchanger segment and another individual heat exchanger segment in the direction of flow. This would be thermal isolation provided in addition to the thermal isolation provided by having stages of heat exchangers in the embodiments described in FIGS. 2-5.

Advantageously, a first working fluid 507 which, for example is to be heated, enters an inlet 505 and passes downward through an inlet or first heat exchanger 502 in thermal communication with a first TE module 501. The working fluid 507 exits at the bottom and is conducted to subsequent heat exchanger 503 through conduit 504, where it again passes in a downward direction past a second TE module 510 and exits through as a hotter working 508. Preferably, a second working fluid 517 enters from the bottom of FIG. 5A through inlet 518 and travels upward through a third heat exchanger 506 past the colder sides (in the present example) of TE modules 501 and 510. The heat exchanger 506 is in good thermal communication with the colder sides of the TE modules 501 and 510. By this arrangement, the working fluids 507 and 517 form a counter flow system in accordance with the teaching of U.S. Pat. No. 6,539,725 referenced above.

Preferably, the heat exchangers 502, 503 and 506, shown in detail in FIG. 5B, are constructed to have high thermal conductivity from the faces of the TE modules 501, 510, 510, through the housing 516 and to the heat exchanger fins 511 (depicted in four isolated segments). However, it is desirable to have low thermal conductivity in the direction of flow, so as to thermally isolate each heat exchanger segment from the others. If the isolation is significant, and TE modules 501 and 510 do not exhibit high internal thermal conductivity in their vertical direction (direction of working fluid flow), the array 500 benefits from the thermal isolation and can operate at higher efficiency. In effect, the array 500 can respond as if it were an array constructed of more TE Modules and more heat exchangers.

Figure 6:
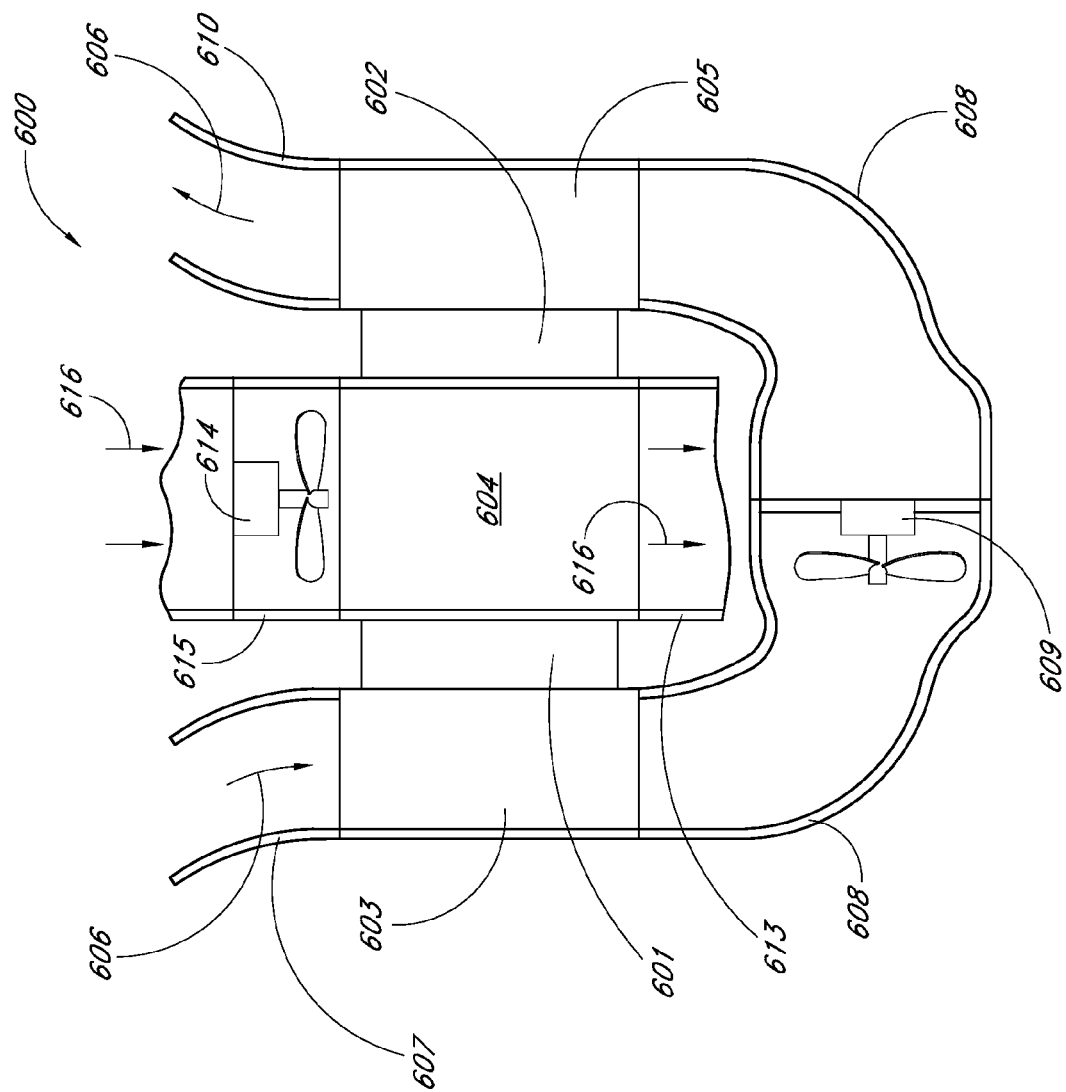
FIG. 6 depicts and gaseous media system with two TE modules and ducted fans to control fluid flow.

FIG. 6 depicts yet another heater/cooler system 600 that is designed to operate beneficially with working gases. The heater/cooler 600 has TE modules 601, 602 in good thermal communication with first side heat exchangers 603, 605 and second side heat exchangers 604. A first working fluid, such as air or other gases 606, is contained by ducts 607, 708, 610 and a second working fluid 616 is contained by ducts 615, 613. Fans or pumps 609, 614 are mounted within ducts 608, 615.

The first working fluid 606 enters the system 600 through an inlet duct 607. The working fluid 606 passes through a first heat exchanger 603 where, for example, it is heated (or cooled). The working fluid 606 then passes through the fan 609 which acts to pump the working fluid 606 through the duct 608, and through the second heat exchanger 605, where it is further heated (or cooled), and out an exit duct 610. Similarly, a working fluid, such as air or another gas, enters through an inlet duct 615. It is pushed by a second fan or pump 614 through a third heat exchanger 604 where, in this example, it is cooled (or heated). The cooled (or heated) working fluid 616 exits through an exit duct 613.

The system 600 can have multiple segments consisting of additional TE modules and heat exchangers and isolated, segmented heat exchangers as described in FIG. 5B. It can also have multiple fans or pumps to provide additional pumping force. In addition, one duct, for example 607, 608, can have one fluid and the other duct 613, 615 a second type of gas. Alternately, one side may have a liquid working fluid and the other a gas. Thus, the system is not restricted to whether a working medium is a fluid or a liquid. Additionally, it should be noted that the exit duct 613 could be routed around the fan duct 609.

Figure 7A:
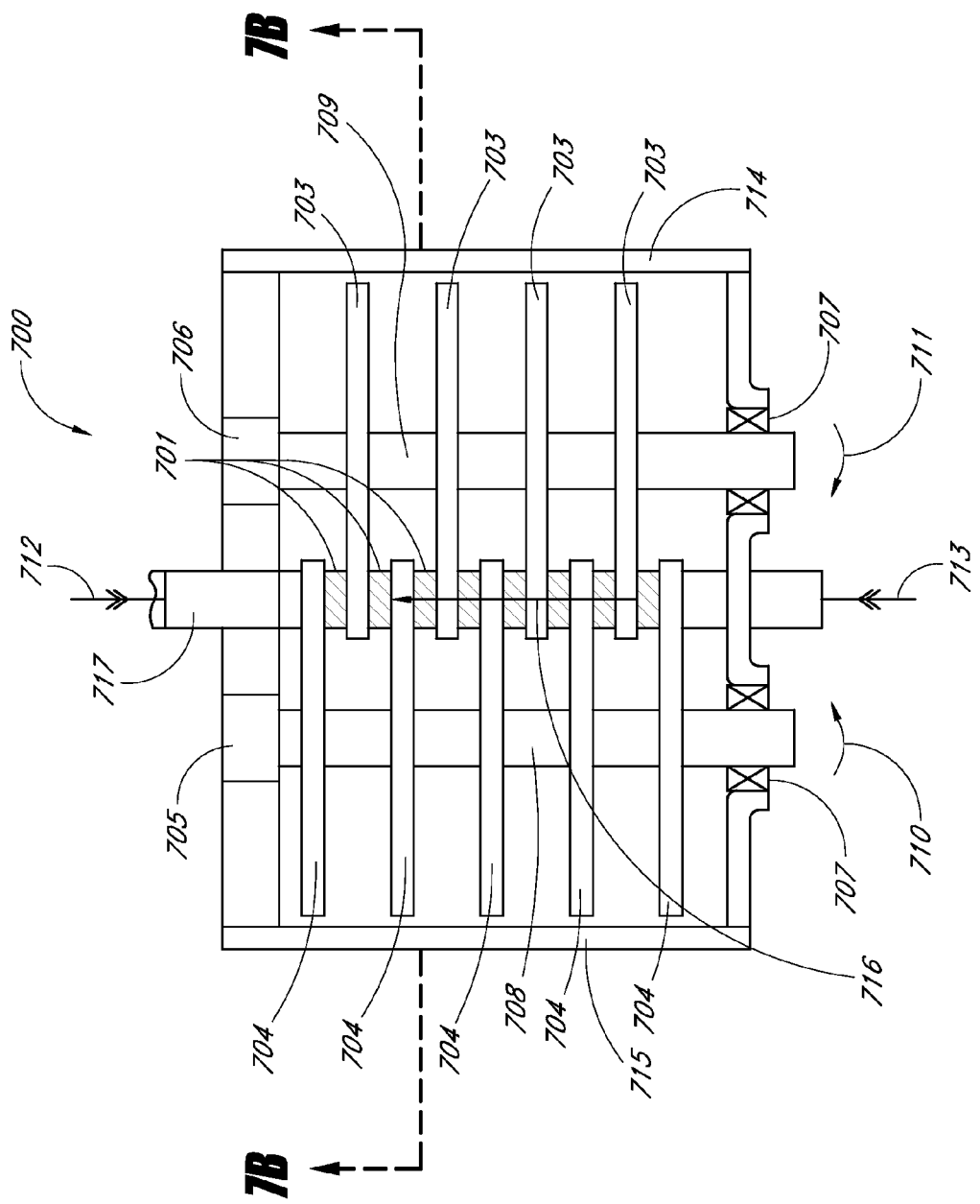
FIGS. 7A-7D depict a solid media system with counter flow to further enhance performance. The TE elements utilize a high length to thickness ratio to achieve added thermal isolation.

FIG. 7A depicts a heating and cooling system 700 for beneficial use with a fluid. The assembly has a plurality of TE modules 701 with a plurality of first side working media 703 and a plurality of second side working media 704. In the present example, both the first side working media 703 and the second side working media 704 form disks. The first side working media 703 are attached to a first side shaft 709, and the second side working media 704 are attached to a second side shaft 708. The shafts 708, 709 are in turn attached to first side motor 706 and second side motor 705, respectively, and to corresponding bearings 707. The preferred direction of motor rotation is indicated by arrows 710 and 711.

A separator 717 both divides the array into two portions and positions the TE modules 701. The TE modules 701, held in position by the separator 717, are spaced so as to alternately sandwich a first side working medium 703 and a second side working medium 704. For any two TE modules 701, the modules are oriented such that their cold sides and hot sides face each other as in the previous embodiments. The working media 703, 704 are in good thermal communication with the TE elements 701. Thermal grease or the like is advantageously provided at the interface between the thermoelectric element 701 and the working media 703, 704. The purpose of the grease becomes apparent in the discussion below regarding the operation of the working media 703, 704. A first side housing section 714 and second side housing section 715 contain fluid conditioned by the system 700. Electrical wires 712, 713 connect to the TE modules 701 to provide drive current for the TE modules.

Figure 7B:
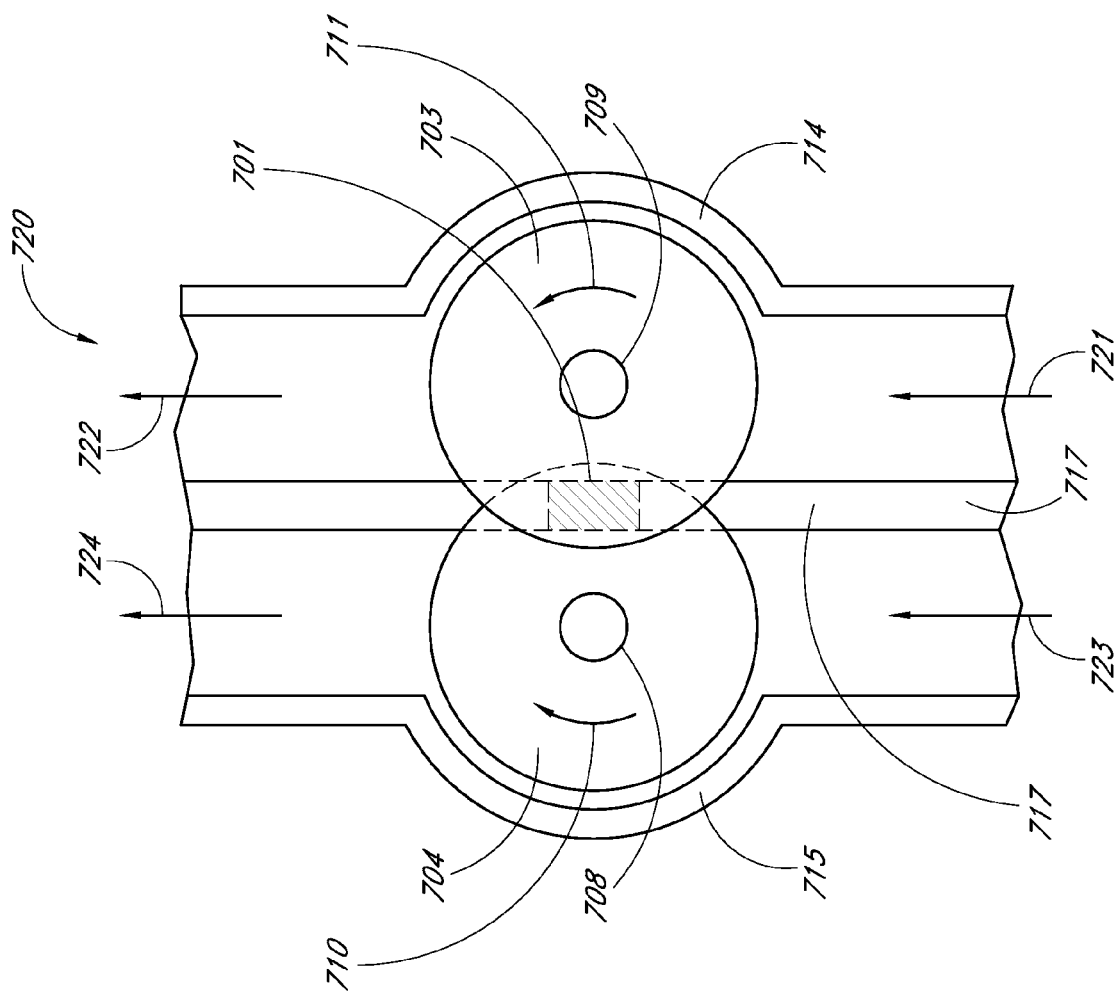

FIG. 7B is a cross sectional view 7B-7B through a portion of the system 700 of FIG. 7A. A first fluid 721 and a second fluid 723 are represented along with their direction of flow by arrows 721 and 723. The first fluid exits as represented by the arrow 722 and a second exits as represented by the arrow 724. The system 700 operates by passing current through electrical wires 712 and 713 to TE modules 701. The TE modules 701 have their cold and hot sides facing each other, arranged in the fashion as described in FIGS. 2 and 3. For example, their adjacent cold sides both face the first side working media 703 and their hot sides face the second side working media 704. The Separator 717 serves the dual function of positioning the TE modules 701 and separating the hot side from the cooled side of the array 700.

For an understanding of operation, assume, for example, that a second fluid 723 is to be cooled. The cooling occurs by thermal exchange with second side media 704. As the second side media 704 rotate, the portion of their surface in contact with the colder side of the TE modules 701 at any given time is cooled. As that portion rotates away from the TE modules 701 through the action of the second motor 705, the second media 704 cool the second side fluid that then exits at exit 724. The second fluid is confined within the array 700 by the housing section 715 and the separator 717.

Similarly, the first fluid 721 is heated by the first side media 703 in thermal contact with the hotter side of the TE modules 701. Rotation (indicated by arrow 711) moves the heated portion of first media 703 to where the first fluid 721 can pass through them and be heated via thermal contact. The first fluid 721 is contained between the housing 714 and the separator 717 and exits at exit 722.

As mentioned above, thermally conductive grease or liquid metal such as mercury, can be used to provide good thermal contact between the TE modules 701 and the media 703, 704 at the region of contact.

As mentioned above, the configuration of FIGS. 7A and 7B may also be advantageously used to cool or heat external components such as microprocessors, laser diodes and the like. In such instances, the disks would contact the part using the thermal grease or liquid metal or the like to transfer the heat to or from the part.

Figure 7D:
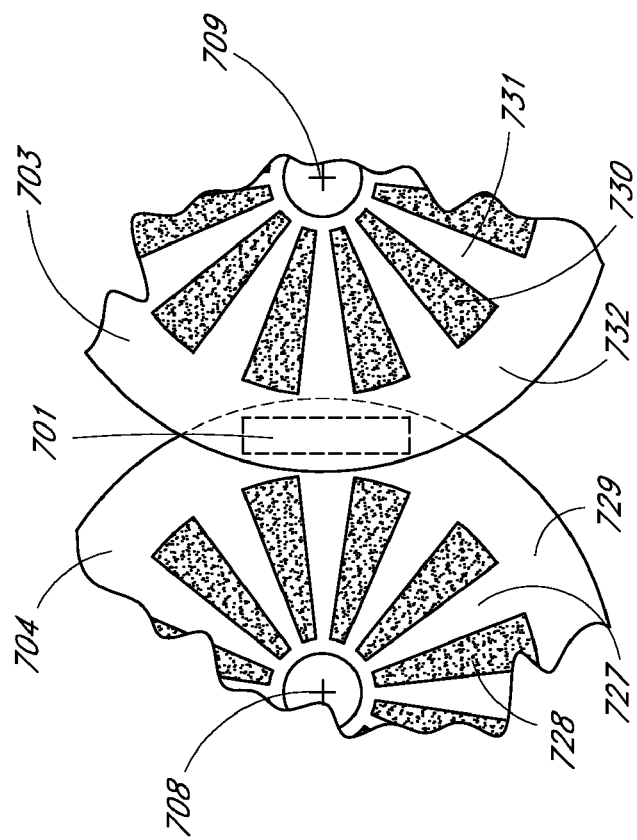
Figure 7C:
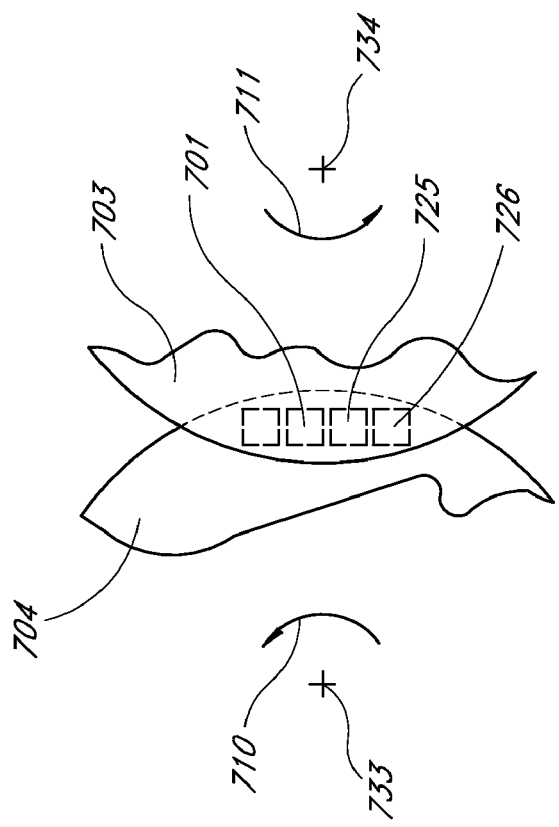

FIG. 7C depicts a modified version of the system 700 in which the TE modules 701 are segmented to achieve thermal isolation. FIG. 7C shows a detailed view of the portion of array 700 in which TE modules 701 and 702 transfer thermal power to heat moving media 704 and 703 (the rotating discs in this example). The moving media 704 and 703 rotate about axes 733 and 734, respectively.

In one embodiment, advantageously, the working media 704 and 703 rotate in opposite directions as indicated by arrows 710 and 711. As moving media 704, 703 rotate, heat transfer from different sections of TE modules 701 and 702 come into thermal contact with them and incrementally change the temperature of the moving media 704, 703. For example, a first TE module 726 heats moving medium 704 at a particular location. The material of the moving media 704 at that location moves into contact with a second TE module 725 as moving medium 704 rotates counter clockwise. The same portion of moving medium 704 then moves on to additional TE module segments 701. The opposite action occurs as moving medium 703 rotates counterclockwise and engages TE modules 701 and then subsequently TE modules 725 and 726.

Advantageously, moving media 704, 703 have good thermal conductivity in the radial and axial directions, and poor thermal conductivity in their angular direction, that is, the direction of motion. With this characteristic, the heat transfer from one TE module 725 to another TE module 726 by conductivity through the moving media 704 and 708 is minimized, thereby achieving effective thermal isolation.

As an alternative to TE modules or segments 701, 725, 726, a single TE element or several TE element segments may be substituted. In this case, if the TE elements 701 are very thin compared to their length in the direction of motion of moving media 704, 703, and have relatively poor thermal conductivity in that direction, they will exhibit effective thermal isolation over their length. They will conduct heat and thus respond thermally as if they were constructed of separate TE modules 701. This characteristic in combination with low thermal conductivity in the direction of motion within the moving media 704, 703 can achieve effective thermal isolation and thereby provides performance enhancements.

FIG. 7D depicts an alternative configuration for moving media 704, 703 in which the media are constructed in the shape of wheels 729 and 732 with spokes 727 and 731. In the spaces between spokes 727 and 731 and in good thermal contact with them, are heat exchanger material 728 and 730.

The system 700 can operate in yet another mode that is depicted in FIG. 7D. In this configuration, working fluid (not shown) moves axially along the axes of the array 700 passing through moving media 704, 703 sequentially from one medium 704 to the next moving medium 704, and so on in an axial direction until it passes through the last medium 704 and exits. Similarly, a separate working fluid, not shown, passes through individual moving medium 703 axially through array 700. In this configuration, the ducts 714 and 715 and separator 717 are shaped to form a continuous ring surrounding moving media 704, 703 and separating medium 704 from medium 703.

As the working fluid flows axially, thermal power is transferred to the working fluid through heat exchanger material 728 and 730. Advantageously, the hot side working fluid, for example, passes through heat exchanger 728, moves through the array 700 in the opposite direction of the working fluid moving through heat exchanger 730. In this mode of operation, the array 700 acts as a counterflow heat exchanger, and a succession of sequential heat exchangers 728 and 730 incrementally heat and cool the respective working fluids that pass through them. As described for FIG. 7C, the thermally active components can be TE modules 701 that can be constructed so as to have effective thermal isolation in the direction of motion of the moving media 704, 703. Alternatively, the TE modules 701 and 702 can be segments as described in FIG. 7C. In the latter case, it is further advantageous for the thermal conductivity of the moving media 704, 703 to be low in the direction of motion so as to thermally isolate portions of the outer discs 729 and 732 of the moving media 704, 703.

Alternately, the design could be further contain radial slots (not shown) in the sections 729 and 732 that are subject to heat transfer from TE modules 701 and 702 to achieve thermal isolation in the direction of motion.

FIG. 8 depicts another embodiment of a thermoelectric system an 800 having a plurality of TE elements 801 (hatched) and 802 (unhatched) between first side heat exchangers 803 and second side heat exchangers 808. A power supply 805 provides current 804 and is connected to heat exchangers 808 via wires 806, 807. The system 800 has conduits and pumps or fans (not shown) to move hot and cold side working media through the array 800 as described, for example, in FIGS. 2, 3, 4, 5, 6 and 7.

In this design, the TE modules (having many TE elements) are replaced by TE elements 801 and 802. For example, hatched TE elements 801 may be N-type TE elements and unhatched TE elements 802 may be P-type TE elements. For this design, it is advantageous to configure heat exchangers 803 and 808 so that they have very high electrical conductivity. For example, the housing of the heat exchangers 803, 808 and their internal fins or other types of heat exchanger members can be made of copper or other highly thermal and electrical conductive material. Alternately, the heat exchangers 803 and 808 can be in very good thermal communication with the TE elements 801 and 802, but electrically isolated. In which case, electrical shunts (not shown) can be connected to the faces of TE elements 801 and 802 to electrically connect them in a fashion similar to that shown in FIG. 1, but with the shunts looped past heat exchangers 803 and 808.

Regardless of the configuration, DC current 804 passing from N-type 801 to P-type TE elements 802 will, for example, cool the first side heat exchanger 803 sandwiched between them, and current 804 passing from P-type TE elements 802 to N-type TE elements 801 will then heat the second side heat exchanger 808 sandwiched between them.

The Array 800 can exhibit minimal size and thermal losses since the shunts, substrates and multiple electric connector wires of standard TE modules can be eliminated or reduced. Further, TE elements 801 and 802 can be heterostructures that accommodate high currents if the components are designed to have high electrical conductivity and capacity. In such a configuration, the array 800 can produce high thermal power densities.

Figure 9:
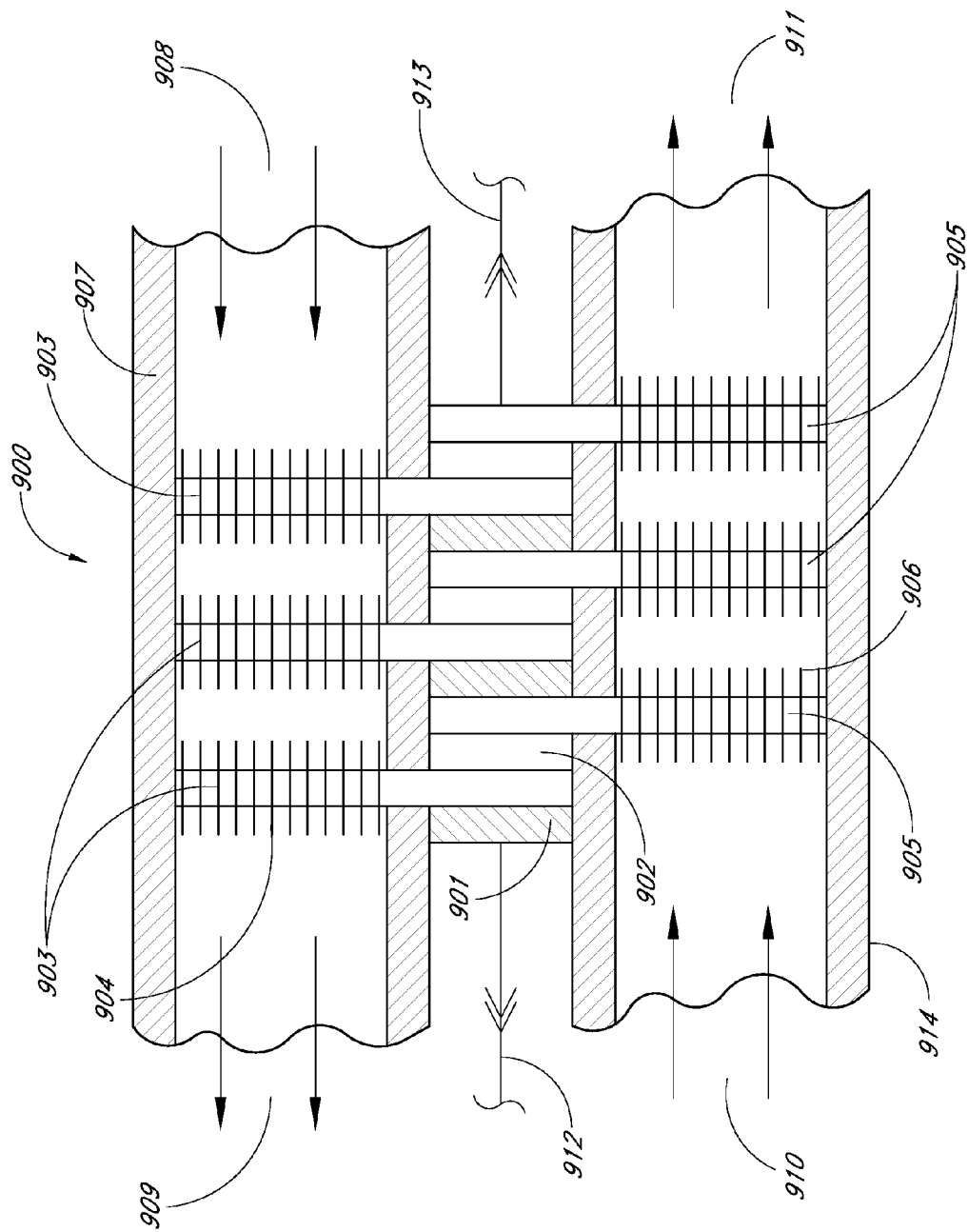
FIG. 9 depicts a system with TE elements, heat pipes and heat exchangers that is simple and low cost. The hot side and cold side are separated by thermal transport through heat pipes.

FIG. 9 depicts a thermoelectric system 900 of the same general type as described in FIG. 8, with P-type TE elements 901 and N-type TE elements 902 between, and in good thermal contact with first side heat transfer members 903 and second side heat transfer members 905. In this configuration, the heat transfer members 903 and 905 have the form of thermally conductive rods or heat pipes. Attached to, and in good thermal communication with the heat transfer members 903 and 905 are heat exchanger fins 904, 906, or the like. A first conduit 907 confines the flow of a first working medium 908 and 909 and a second conduit 914 confines the flow of a second working fluid 910 and 911. Electrical connectors 912 and 913 conduct current to the stack of alternating P-type and N-type TE elements 901, 902, as described in FIG. 8.

In operation, by way of example, current enters the array 900 through the first connector 912, passes through the alternating P-type TE elements 901 (hatched) and N-type TE elements 902 (unhatched) and exits through the second electrical connector 913. In the process, the first working media 908 becomes progressively hotter as it is heated by conduction from heat transfer fins 904, which in turn have been heated by conduction through the first heat transfer members 903. The first conduit 907 surrounds and confines a first working media 908 so it exits at a changed temperature as working fluid 909. Portions of the first conduit 907 thermally insulate the TE elements 901 and 902 and the second side heat transfer members 905 from the first (hot in this case) working media 908 and 909. Similarly, the second working media 910 enters through the second conduit 914, is cooled (in this example) as it passes through the second side heat exchangers 906 and exits as cooled fluid 911. The TE elements 901, 902 provide cooling to the second side heat transfer members 905 and hence, to heat exchanger fins 906. The second side conduit 914 acts to confine the second (cooled in this example) working media 910, and to insulate it from other parts of array 900.

Although described for individual TE elements in the embodiments of FIGS. 8-9, TE modules may be substituted for the TE elements 901, 902. In addition, in certain circumstances, it may be advantageous to electrically isolate TE elements 901, 902 from the heat transfer members 903, 905, and pass current through shunts (not shown). Also, the heat exchangers 904, 906 can be of any design that is advantageous to the function of the system. As with the other embodiments, it is seen that the configurations of FIGS. 8 and 9 provide a relatively easily manufacturable system that also provides enhanced efficiency from thermal isolation. For example, in FIG. 8, the heat exchangers 808, 803 which alternate between P-type and N-type thermal electric elements, will either be of the colder or hotter heat exchanger type, but will be reasonably thermally isolated from each other and cause the thermoelectric elements of the P and N type to be reasonably thermally isolated from one another.

Figure 10:
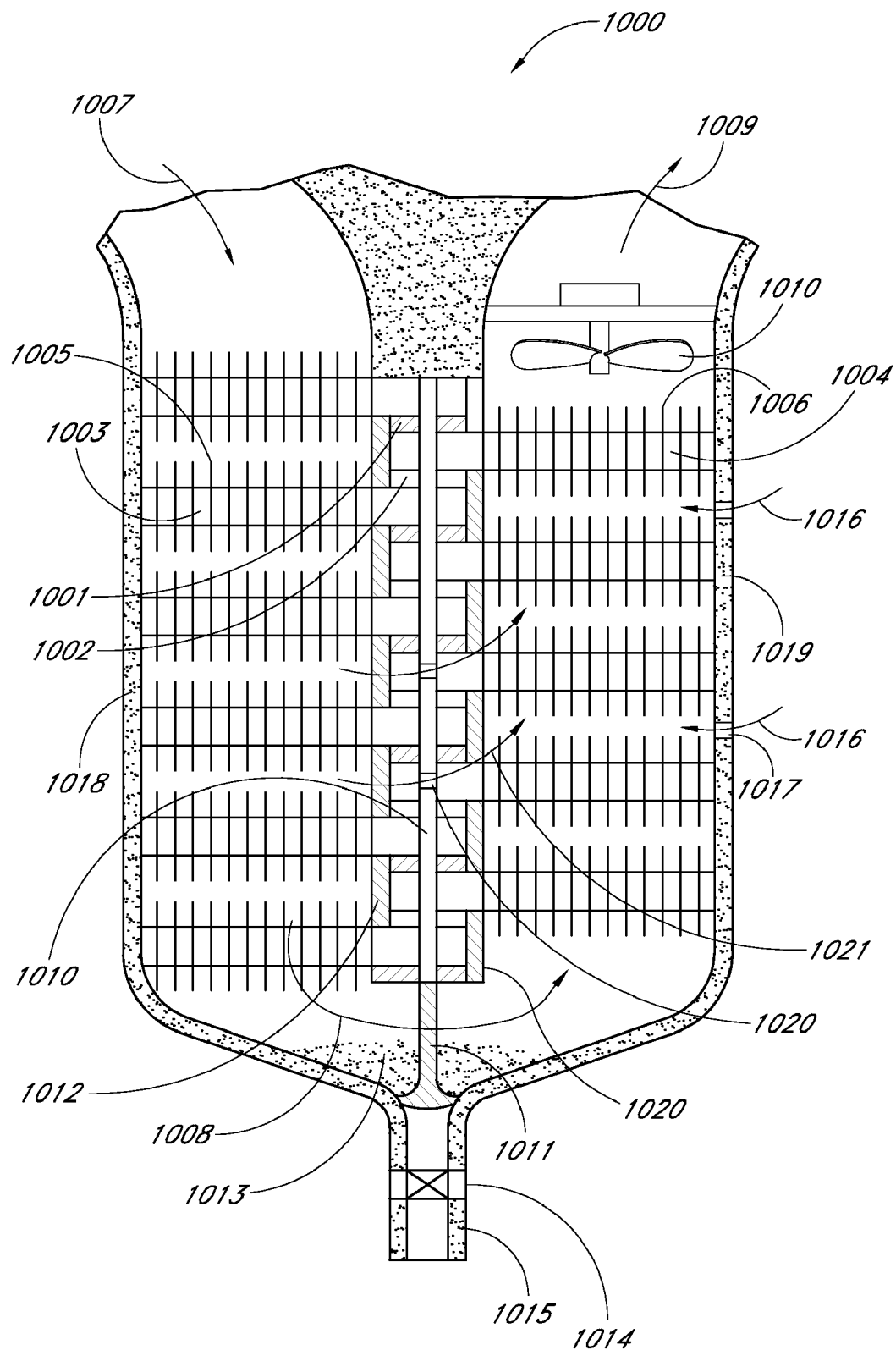
FIG. 10 depicts a fluid system in which the fluid is pumped through the heat exchanger and TE module array so as to achieve a low temperature at one end to condense moisture out of a gas or a precipitate from a liquid or gas. The system has provisions to shunt working fluid flow to improve efficiency by lowering the temperature differential across portions of the array.

FIG. 10 depicts another thermoelectric array system (1000) that provides thermal isolation. Advantageously, this configuration may perform the function of a system that utilizes cooling and heating of the same medium to dehumidify, or remove precipitates, mist, condensable vapors, reaction products and the like and return the medium to somewhat above its original temperature.

The system 1000 consists of a stack of alternating P-type TE elements 1001 and N-type TE elements 1002 with interspersed cold side heat transfer elements 1003 and hot side heat transfer elements 1004. In the depicted embodiment, heat exchanger fins 1005, 1006 are provided for both the colder side heat transfer elements 1003 and the hotter side heat transfer elements 1004. A colder side conduit 1018 and a hotter side conduit 1019 direct working fluid 1007, 1008 and 1009 within the array 1000. A fan 1010 pulls the working fluid 1007, 1008 and 1009 through the array 1000. Preferably, colder side insulation 1012 thermally isolates the working fluid 1007 while travelling through the colder side from the TE element stack and hotter side insulation 1020 preferably isolates the working fluid while travelling through the hotter side from the TE element stack. A baffle 1010 or the like separates the colder and hotter sides. In one preferred embodiment, the baffle 1010 has passages 1010 for working fluids 1021 to pass through. Similarly, in one embodiment, fluid passages 1017 allow fluid 1016 to enter the hot side flow passage.

A screen 1011 or other porous working fluid flow restrictor separates the colder from the hotter side of array 1000. Condensate, solid precipitate, liquids and the like 1013 accumulate at the bottom of the array 1000, and can pass through a valve 1014 and out a spout 1015.

Current flow (not shown) through TE elements 1001 and 1002, cools colder side heat transfer elements 1003 and heats hotter side heat transfer elements 1004, as discussed in the description of FIG. 9. In operation, as the working fluid 1007 passes down the colder side, precipitate, moisture or other condensate 1013 from the working fluid 1007 can collect at the bottom of the array 1000. As required, the valve 1014 can be opened and the precipitate, moisture or condensate 1013 can be removed through the spout 1015 or extracted by any other suitable means.

Advantageously, some of the working fluid 1021 can be passed from the colder to the hotter side through bypass passages 1020. With this design, not all of the colder side fluid 1007 passes through the flow restrictor 1011, but instead can be used to reduce locally the temperature of the hotter side working fluid, and thereby improve the thermodynamic efficiency of the array 1000 under some circumstances. Proper proportioning of flow between bypass passages 1020 and flow restrictor 1011, is achieved by suitable design of the flow properties of the system. For example, valves can be incorporated to control flow and specific passages can be opened or shut off. In some uses, the flow restrictor 1011 may also act as a filter to remove precipitates from liquid or gaseous working fluids 1008, or mist or fog from gaseous working fluids 1008.

Advantageously, additional hotter side coolant 1016 can enter array 1000 through side passages 1017, also for the purpose of reducing the hotter side working fluid temperature or increasing array 1000 efficiency.

This configuration can produce very cold conditions at the flow restrictor 1011, so that working fluid 1008 can have substantial amounts of precipitate, condensate or moisture removal capability. In an alternative mode of operation, power to the fan 1010 can be reversed and the system operated so as to heat the working fluid and return it to a cool state. This can be advantageous for removing reaction products, precipitates, condensates, moisture and the like that is formed by the heating process. In one advantageous embodiment, flow restrictor 1011, and/or heat exchangers 1005 and 1006 can have catalytic properties to enhance, modify, enable, prevent or otherwise affect processes that could occur in the system. For liquid working fluids, one or more pumps can replace fan/motor 1010 to achieve advantageous performance.

Figure 11:
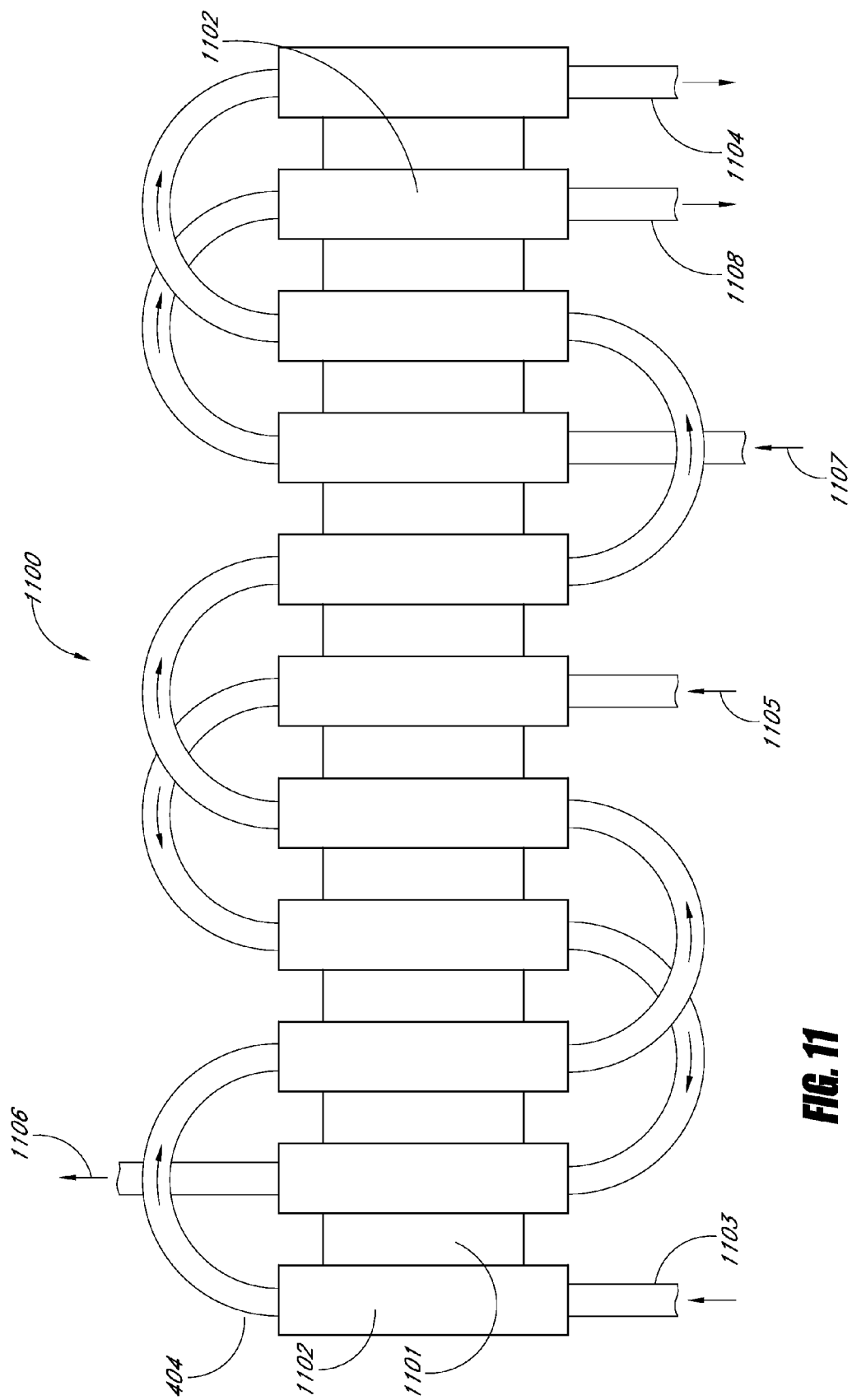
FIG. 11 depicts an array in which working fluid enters and exits at a variety of locations, and in which part of the system operates in counter flow and part in parallel flow modes.

FIG. 11 depicts a thermoelectric array 1100 similar in design to that of FIGS. 2 and 3, but in which working media has alternate paths through the system. The array 1100 has TE modules 1101 interdispersed between heat exchangers 1102. A plurality of inlet ports 1103, 1105 and 1107 conduct working media through the array 1100. A plurality of exit ports 1104, 1106 and 1108 conduct working media from the array 1100.

In operation, by way of example, working media to be cooled enters at a first inlet port 1103 and passes through several of the heat exchangers 1102, thereby progressively cooling (in this example), and exits through a first exit port 1104. A portion of the working media that removes heat from array 1100 enters through a second inlet port 1105, passes through heat exchangers 1102, is progressively heated in the process, and exits through a second exit port 1106.

A second portion of working media to remove heat enters a third inlet port 1107, is heated as it passes through some of the heat exchangers 1102 and exits through a third exit port 1108.

This design allows the cool side working media which passes from the first inlet port 1103 to the first exit port 1104 to be efficiently cooled, since the hot side working media enters at two locations in this example, and the resultant temperature differential across the TE modules 1101 can be on average lower than if working media entered at a single port. If the average temperature gradient is lower on average, then under most circumstances, the resultant system efficiency will be higher. The relative flow rates through the second and third inlet port 1105 and 1107 can be adjusted to achieve desired performance or to respond to changing external conditions. By way of example, higher flow rates through the third inlet port 1107, and most effectively, a reversal of the direction of flow through that portion so that third exit port 1108 is the inlet, can produce colder outlet temperatures in the cold side working media that exits at first exit port 1104.

The basic underlying connections for a conventional thermoelectric 100 are shown in additional detail in FIG. 1C. As mentioned above, a P-type element 110 and an N-type element 112 are of the type well known to the art. Shunts 106 are attached to, and in good electrical connection with, P-type and N-type TE elements 110 and 112. Generally, large numbers of such TE elements and shunts are connected together to form a TE module, as shown in FIG. 1A.

The length of TE elements 110, 112 in the direction of current flow is $L_C$ 116; their breadth is $B_C$ 117; their width is $W_C$ 118, and their distance apart is $G_C$ 120. The thickness of shunts 106 is $T_C$ 109.

The dimensions $B_C$, $W_C$, and $L_C$, along with the TE material's figure of merit, Z, the current 122 and the operating temperatures determine the amount of cooling, heating or electrical power produced, as is well known to the art (See Angrist, S.W. "Direct Energy Conversion" $3^{rd}$ Ed. 1977 Ch. 4, for example).

Figure 12:
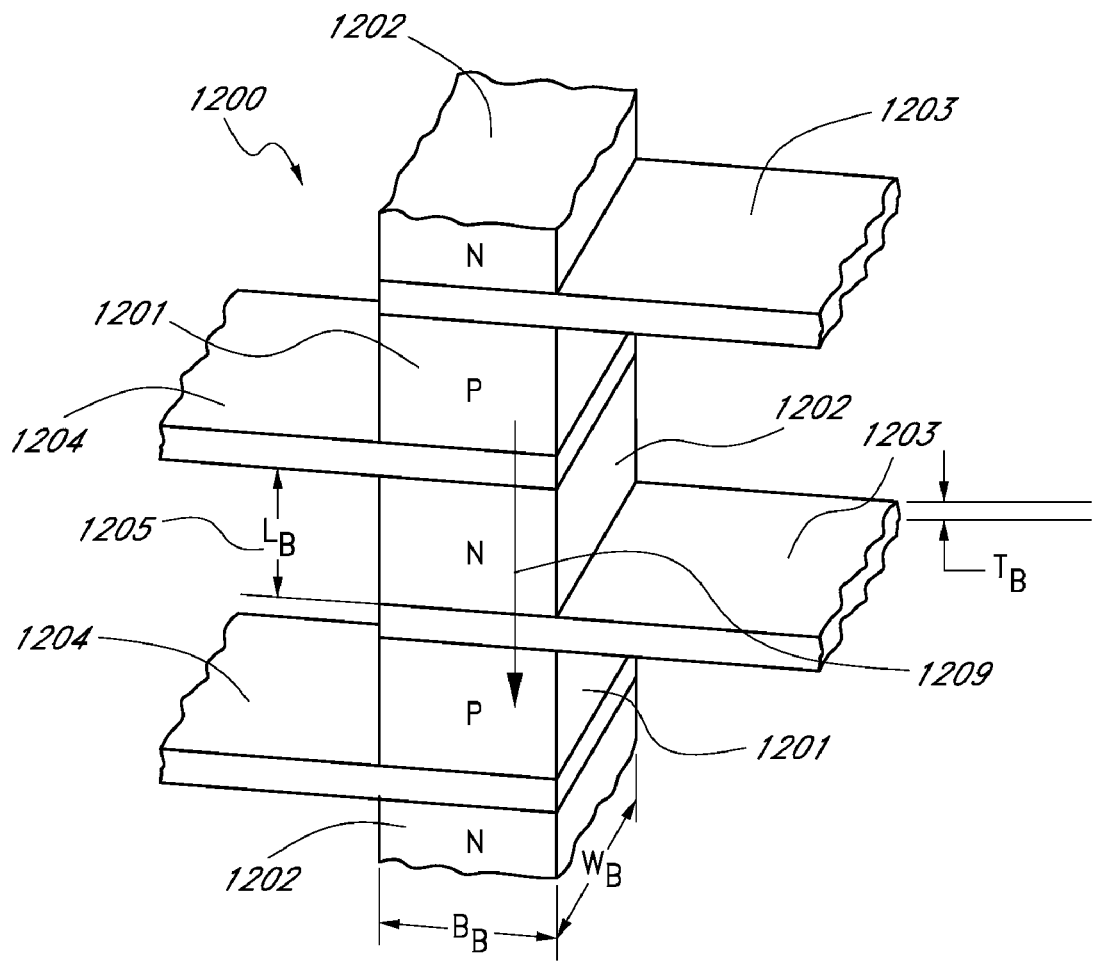
FIG. 12 depicts a stack TE system with reduced parasitic electrical resistive losses.

The design depicted in FIG. 12 alters the conventional construction of FIG. 1 in a manner to reduce the amount of thermoelectric material required, and the magnitude of the parasitic resistance in the shunts 106. A TE configuration 1200 has a plurality of first side TE elements 1201, 1202 of alternating conductivity types sandwiched in series between shunts 1203 and a plurality of second side shunts 1204, so that a current 1209 passes perpendicular to the breadth $B_B$ and width $W_B$ of the shunts rather than generally parallel to the breadth as in FIG. 1C. For the design of FIG. 12, the ratio, $\phi_B$ of $R_{PB}$ to $R_{OB}$ is:

$$\phi_B \approx \frac{R_{PB}}{R_{OB}} \tag{10}$$

Where;

$$R_{PB} \frac{P_{SB} T_B}{B_B W_B} \tag{11}$$

$$R_{OB} = \frac{P_{TE} L_B}{B_B W_B} \tag{12}$$

so, $$\phi_B \approx \left(\frac{T_B}{B_B}\right)\left(\frac{P_{SB}}{P_{TE}}\right) \tag{13}$$

Where
- $T_B$ is the shunt thickness
- $L_B$ is the TE element length
- $\rho_{SB}$ is the shunt resistivity
- $B_B$ is the TE element and shunt active breadth
- $W_B$ is the TE elements and shunt active width If $\phi_C$ is set equal to $\phi_B$, then the parasitic electrical resistance losses will have the same proportional effect on the performance of the configurations of FIG. 1C and FIG. 12. For comparative purposes, assume material properties of the two configurations are identical, then;

$$\phi_C = \phi_B \tag{14}$$

or using Equations (9 and 12) in B;

$$\frac{L_C}{L_B} \approx B_C \left( \frac{B_C + G_C}{T_C T_B} \right) \tag{15}$$

For today's typical thermoelectric modules;
- $B_C \approx 1.6$ mm.
- $W_C \approx 1.6$ mm.
- $G_C \approx 1.6$ mm.
- $T_C \approx 0.4$ mm.

and assume;
- $T_B \approx 2$ mm.
- $P_{SB} \approx P_{SC}$ then, $$\frac{L_c}{L_B} \approx 6.4 \tag{16}$$

Thus the length $L_B$ can be 1/6.4 that of $L_C$ and the resulting resistive losses of the design in FIG. 12 do not exceed those of a conventional TE module. If this is the case, and all other losses are negligible or decrease proportionally, a TE system utilizing the configuration of FIG. 12 would have the same operating efficiency as that of FIG. 1C, but with $L_B = L_C/6.4$.

The volume of the new configuration can be compared to that of FIG. 1C. For the same $q_{OPT}$, the area ratio must remain the same, so;

$$\frac{L_B}{A_B} = \frac{L_C}{A_C} \tag{17}$$

and since;

$$\frac{L_B}{L_C} = \frac{1}{6.4} \tag{18}$$

$$A_C = 6.4 A_B. \tag{19}$$

The volume ratio of thermoelectric material of the two is;

$$V_C = A_C L_C \tag{20}$$

$$V_B = A_B L_B \tag{21}$$

and;

$$\frac{V_B}{V_C} = \left( \frac{A_B}{A_C} \right) \left( \frac{L_B}{L_C} \right) \tag{22}$$

$$\approx \frac{1}{6.4^2} \approx \frac{1}{41} \tag{23}$$

Therefore with these assumptions, 1/41 as much TE material is required. This substantial potential reduction, while it may not be fully realized because of the exactitude of assumptions made, nevertheless can be very beneficial in reducing the amount of TE material used and hence, cost and size as well.

The TE stack configuration 1200 of FIG. 12 has P-type TE elements 1201 and N-type TE elements 1202 of length $L_B$ 1205. The direction of current flow is indicated by the arrow 1209. The TE elements have a breadth $B_B$ and a width $W_B$. Between P-type TE elements 1201 and N-type TE elements 1202, in the direction of current flow, are the second side shunts 1204 ("PN shunts"). Between N-type 1202 and P-type 1201 elements, in the direction of current flow, are the first side shunts 1203 ("NP shunts"). The PN shunts 1204 extend generally in the opposite direction from the stack 1200 than the NP shunts 1203. Angles other than 180° are also advantageous.

If an appropriate current 1209 is passed in the direction indicated, NP shunts 1203 are cooled and PN shunts 1204 are heated. Through this configuration, the parasitic electrical resistance losses for the configuration 1200 are lower typically than for the conventional configuration 100 of FIG. 1 for the same TE element dimensions. Thus, if the TE length $L_B$ 1205 is reduced to equate the ratio of parasitic electrical losses in the two configurations, the TE length $L_B$ 1205 will be smaller, and the configuration of FIG. 12 advantageously can operate at higher power density than that of FIG. 1. As a result, the configuration 1200 of FIG. 12 also uses less thermoelectric material, and can be more compact than in the conventional design of FIG. 1.

The shunts 1203, 1204 can serve the dual function of transmitting thermal power away from the TE elements 1201, 1202 and exchange thermal power with an external object or medium, such as a working fluid.

Figure 13A:
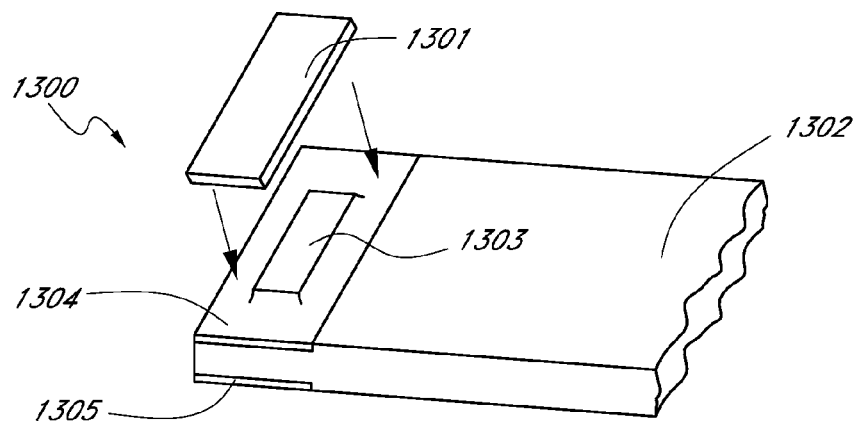
FIG. 13A depicts details of a TE element and heat exchange member in a preferred embodiment for a stack system.

An illustration of a preferred embodiment 1300 of a shunt combined to form a heat exchanger 1302 is depicted in FIG. 13A. Preferably, at least one TE element 1301 is electrically connected, such as with solder, to a raised electrode surface 1303 of a heat exchange shunt 1302. Advantageously, the shunt 1302 can be constructed primarily of a good thermal conductor, such as aluminum, and have integral clad overlay material 1304, 1305, made of a high-electrical conductivity material, such as copper, to facilitate TE element 1301 attachment and current flow at low resistance.

Figure 13B:
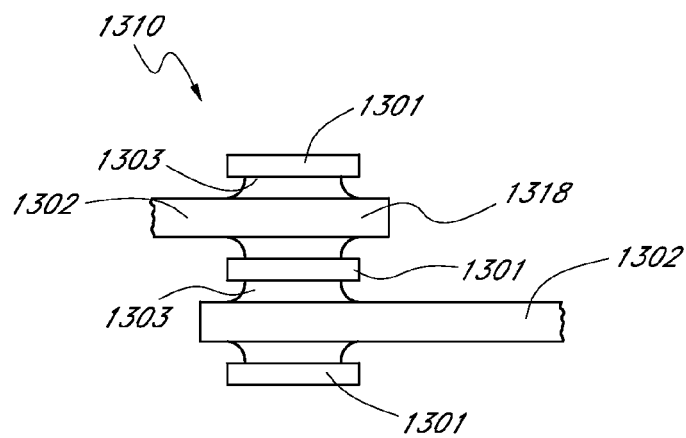
FIG. 13B depicts a section of a stack system constructed from elements shown in FIG. 13A.

FIG. 13B depicts a detailed side view of a portion of a stack thermoelectric assembly 1310 made up of the thermoelectric shunts 1302 and TE elements 1301 of FIG. 13A. A plurality of shunts 1302 with raised electrode surfaces 1303 are electrically connected in series to TE elements 1301 of alternating conductivity types.

The shunts 1302 will be alternately heated and cooled when an appropriate current is applied. The thermal power produced is transported away from the TE elements 1301 by the shunts 1302. Advantageously, the raised electrodes 1303 facilitate reliable, low-cost, stable surfaces to which to attach the TE elements 1301. In practice, a stack of a plurality of these assemblies 1310 may be provided. An array of stacks could also be used which also further facilitates thermal isolation.

The electrodes 1303 advantageously can be shaped to prevent solder from shorting out the TE elements 1301. Also, the electrodes 1303 advantageously can be shaped to control the contact area and hence, current density, through the TE elements 1301.

Figure 14:
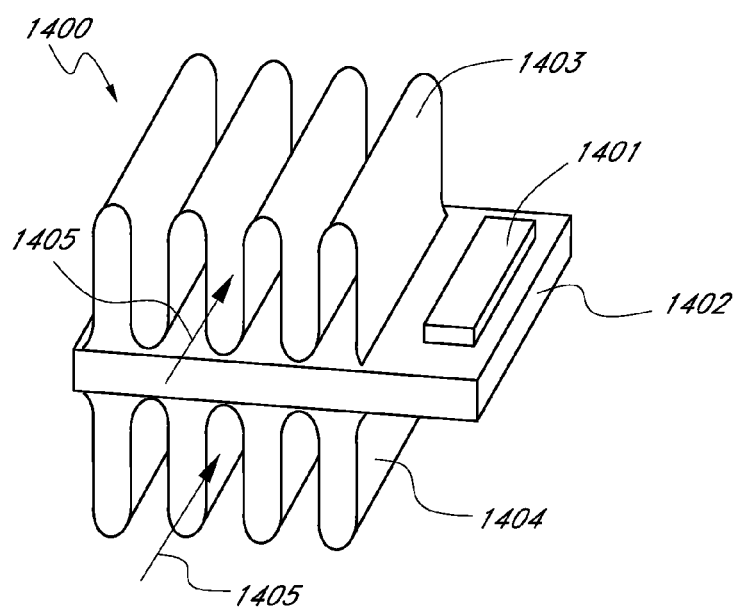
FIG. 14 depicts another TE element and heat exchanger configuration.

An example of a portion of a shunt heat exchanger 1400 is depicted in FIG. 14. This portion 1400 has increased surface area to aid heat transfer. A TE element 1401 is attached to a shunt 1402, preferably constructed as depicted in FIG. 13A, or as in other embodiments in this application. Heat exchangers 1403, 1404, such as fins, are attached with good thermal contact, such as by brazing, to the shunt 1402. In this embodiment, a working fluid 1405 passes through the heat exchangers 1403, 1404.

Advantageously, the shunt portion 1400 is configured so that as the working fluid 1405 passes through the heat exchangers 1403, 1404, thermal power is transferred efficiently. Further, the size of materials and proportions of the shunt 1402 and heat exchangers 1403, 1404 are designed to optimize operating efficiency when combined into a stack such as described in FIGS. 12 and 13B. Advantageously, the heat exchangers 1403, 1404 can be louvered, porous or be replaced by any other heat exchanger design that accomplishes the stated purposes such as those described in "Compact Heat Exchangers", Third Edition, by W. M. Kays and A. L. London. The heat exchangers 1403, 1404 can be attached to the shunt 1402 by epoxy, solder, braze, weld or any other attachment method that provides good thermal contact.

Figure 15:
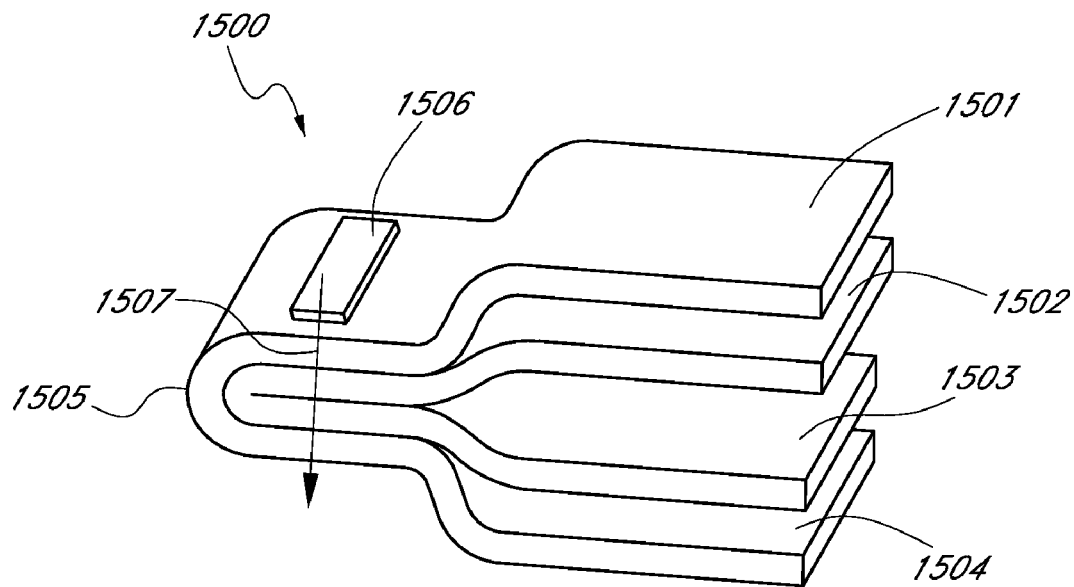
FIG. 15 depicts yet another TE element and heat exchanger configuration.

Another example of a shunt segment 1500 is depicted in FIG. 15. The shunt segment 1500 is constructed of multiple shunt elements 1501, 1502, 1503 and 1504. The shunt elements 1501, 1502, 1503 and 1504 may be folded over, brazed, riveted to each other or connected in any other way that provides a low electrical resistance path for a current 1507 to pass and to provide low thermal resistance from a TE element 1506 to the shunts 1501, 1502, 1503 and 1504. The TE element 1506 is advantageously attached to segment 1500 at or near a base portion 1505.

The shunt segment 1500 depicts a design alternative to the shunt segment 1400 of FIG. 14, and can be configured in stacks as depicted in FIGS. 12 and 13, and then in arrays of stacks if desired. Both the configurations in FIGS. 14 and 15 can be automatically assembled to lower the labor cost of the TE systems made from these designs.

Figure 16:
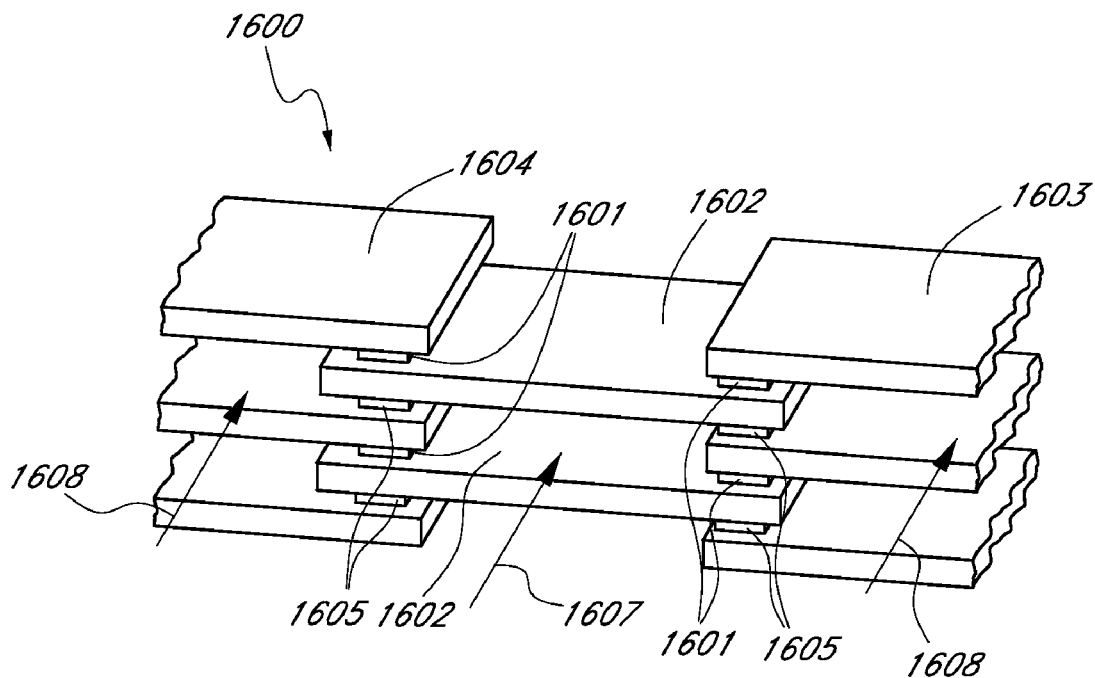
FIG. 16 depicts a stack configuration with two vertical rows of TE elements electrically in parallel.

Shunt segments can also be formed into stack assemblies 1600 as depicted in FIG. 16. Center shunts 1602 have first side TE elements 1601 of the same conductivity type at each end on a first side and second side TE elements 1605 of the opposite conductivity type at each end of the opposite side of the center shunts 1602. Between each center shunt 1602 to form a stack of shunts 1602 is placed a right shunt 1603 and a left shunt 1604, as depicted in FIG. 16. The right shunts 1603 are placed such that the left end is sandwiched between, the TE elements 1601, 1605 in good thermal and electrical contact. Similarly, the left side shunts 1604 are positioned such that the right end is sandwiched between TE elements 1601, 1605, and are in good thermal and electrical contact. The shunts 1602, 1603 and 1604 are alternately stacked and electrically connected to form a shunt stack 1600. A first working fluid 1607 and a second working fluid 1608 pass through the assembly 1600. Of course, for the embodiments shown in FIG. 16 and of the stack configurations described herein, the stack may be, and likely will, consist of many additional shunt elements in the stack. The small portions of a stack assembly 1600 are merely depicted to provide the reader with an understanding. Further replication of such stacks is clear from the figures. In addition, additional stacks, thermally isolated in a direction of working fluid flow could be provided.

When a suitable current is applied in the one direction through the TE elements 1601, shunts 1605, 1604, the center shunts 1602 will be cooled and the left and right shunts 1604 and 1606 will be heated. As a result, the first working fluid 1607 passing through the center shunts 1602 will be cooled and the second working fluid 1608 passing through the right and left shunts 1603, 1604 will be heated. The stack assembly 1600 forms a solid-state heat pump for conditioning fluids. It is important to note that the stack 1600 can have few or many segments and can thereby operate at different power levels, depending on the amount of current and voltage applied, component dimensions and the number of segments incorporated into the assembly. Arrays of such stacks may also be advantageous. In a situation where arrays of such stacks 1600 are used, it would be preferable to provide thermal isolation in the direction of fluid flow as described in U.S. Pat. No. 6,539, 725 for improved efficiency.

It should also be understood that the shunts 1602, 1603, 1604 can be replaced by other shapes such as, but not limited to, those depicted in FIGS. 14 and 15, to improve performance.

Figure 17:
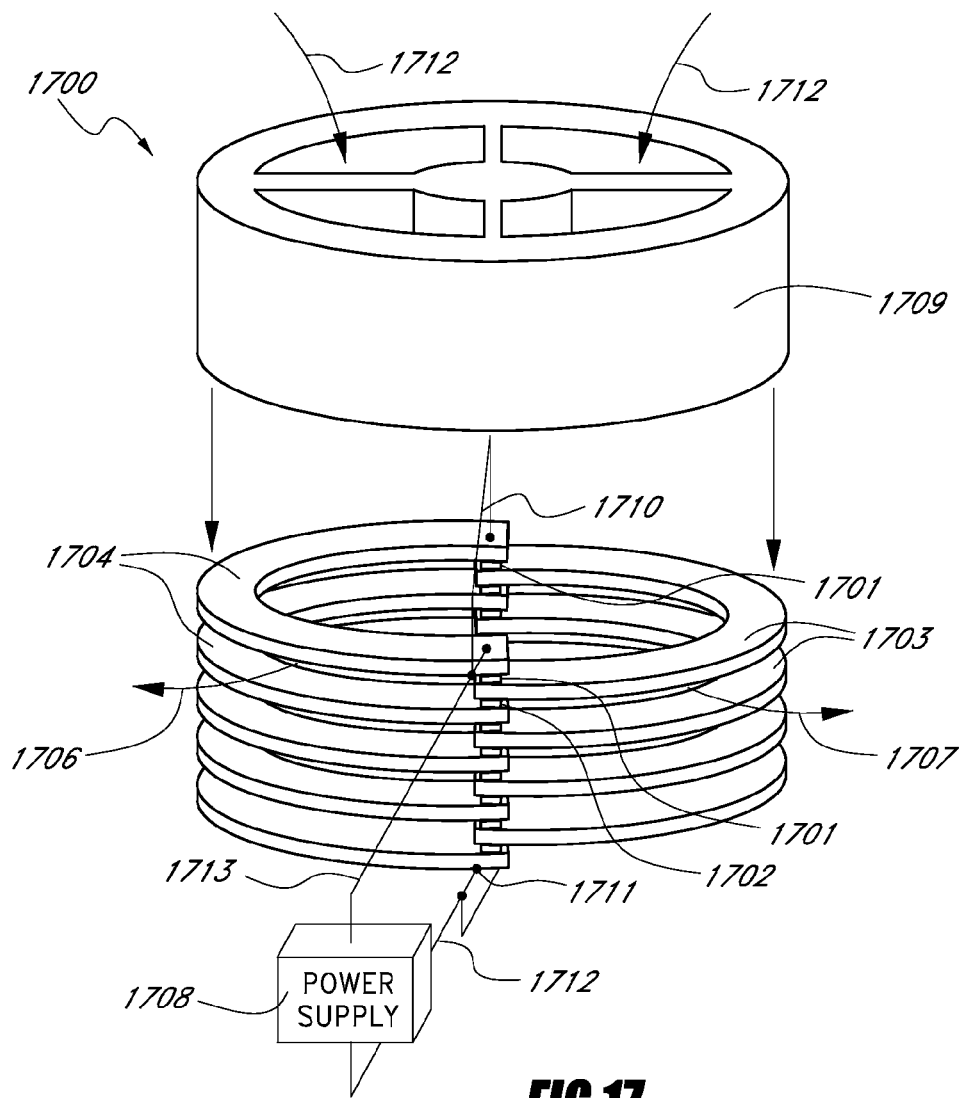
FIG. 17 depicts a cooling/heating assembly with two rows of TE elements electrically in parallel.

A variation to the stack assembly 1600 depicted in FIG. 16 is illustrated in FIG. 17. For this configuration, a TE assembly 1700 is constructed of right side shunts 1703 and left side shunts 1704 to form a generally circular shape. The right side shunts 1703 are advantageously configured to form a partial circle as are the left side shunts 1704. In a preferred embodiment, the shunts which become cold during operation may be either larger or smaller than the shunts that become hot, depending on the particular goals of the device. It should be noted that the substantially circular configuration is not necessary, and other configurations of the shunt segments shown in FIG. 17 to create a center flow portion could be used. For example, the right side shunts could be half rectangles or half squares, and the left side shunts 1704 could be half rectangles or squares. Similarly, one side could be multi-sided and one side could be arcuate. The particular shape of the shunts are changeable. The TE elements 1701 and 1702, of alternating conductivity type, as discussed for FIG. 16, are electrically connected in series in the stack assembly 1700. Preferably, a fluid 1712 passes into the central region formed by the shunts 1703, 1704. A first portion 1707 of the fluid 1712 passes between the right side shunts 1703 and a second portion 1706 of the working fluid 1712 passes between the left side shunts 1704. A power supply 1708 is electrically connected to the TE elements by wires 1712, 1713 that are connected to the stack at connections 1710 and 1711. A fan 1709 may be attached to one (or both) ends of the stack. A pump, blower, or the like could be used as well.

When power is applied to the fan 1709, it pumps the working fluid 1712 through the assembly 1700. When current is supplied with a polarity such that the right shunts 1703 are cooled, the first fluid portion 1707 of working fluid 1712 is cooled as it passes through them. Similarly, the second portion 1706 of working fluid is heated as it passes through heated left side shunts 1704. The assembly 1700 forms a simple, compact cooler/heater with a capacity and overall size that can be adjusted by the number of shunts 1703, 1704 utilized in its construction. It is apparent that the shunts 1703, 1704 could be angular, oval or of any other advantageous shape. Further, the shunts can be of the designs depicted in FIGS. 14, 15 or any other useful configuration.

Figure 18:
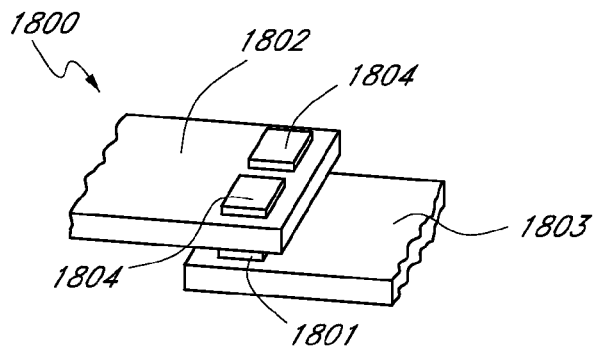
FIG. 18 depicts another configuration with two TE elements electrically in parallel.

In one embodiment of the thermoelectric system of FIGS. 12, 14, 15, 16 and 17, more than one TE element can be used in one or more portions of an array as is depicted in FIG. 18. In this example, TE elements 1801, 1804 are connected to raised electrode surfaces 1804 on each side of shunts 1802, 1803.

A number of TE elements 1801, electrically in parallel, can increase mechanical stability, better distribute thermal power and add electrical redundancy to the system. More than two TE elements 1801 can be used in parallel.

Figure 19:
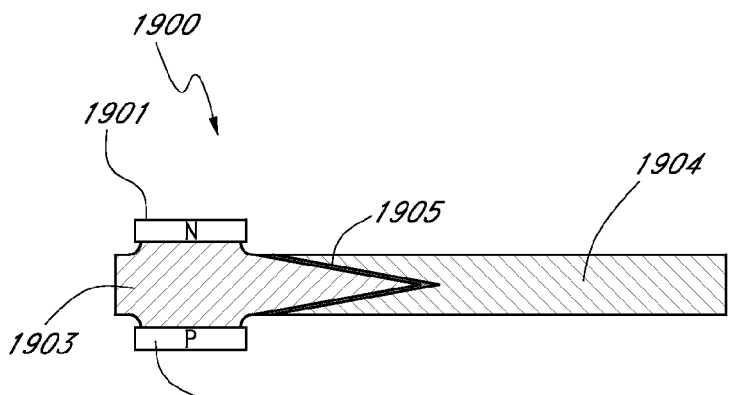
FIG. 19 depicts a heat exchanger element with one portion electrically isolated from another portion.

In certain applications, it is desirable to have exposed portions of shunts in accordance with FIGS. 12-13 electrically isolated from an electrode portion. One example of such a shunt is depicted in FIG. 19. In this embodiment, an electrical insulation 1905 isolates an electrode portion 1903 of a shunt 1900 from a heat exchange portion 1904 of the shunt 1900. TE elements 1901, 1902 are preferably mounted on the electrode portion 1903.

In operation, electrical potential is applied between TE elements 1901, 1902 of opposite conductivity types, through, advantageously, the electrode portion, 1903 made of a high electrical and thermal conductivity material, such as copper. Thermal power produced by the TE elements 1901, 1902 is conducted along the shunt electrode 1903, through the electrical insulation 1905, and into the heat exchange portion 1904 of the shunt 1900. Advantageously, the electrical insulation 1905 is a very good thermal conductor such as alumina, thermally conductive epoxy or the like. As shown, the interface shape formed by electrical insulation 1905 is a shallow "V" shape to minimize thermal resistance. Any other shape and material combination that has suitably low interfacial thermal resistance can be used as well. A stack of such shunts 1900 can be used as described previously.

Figure 20:
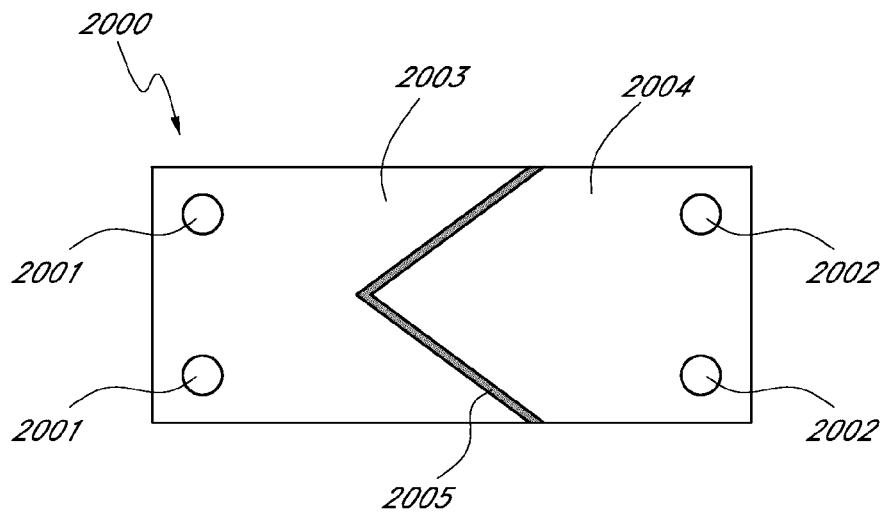
FIG. 20 depicts another configuration of a heat exchanger element with one portion electrically isolated from another portion.

An alternate form of electrical isolation is shown in another shunt segment 2000 assembly depicted in top view in FIG. 20. First TE elements 2001 are connected to a left shunt 2003 of shunt segment array 2000, and second TE elements 2002 are connected to a right shunt 2004 of shunt segment array 2000. Electrical insulation 2005 is positioned between left side shunt segments 2003 and right side shunt segments 2004.

The configuration depicted in FIG. 20 provides electrical isolation between TE elements 2001 and 2002 while retaining mechanical integrity of the overall shunt 2000. In this configuration as drawn, the electrical insulation 2005 need not provide particularly good thermal conductivity since the sources of thermal power, the TE elements 2001 and 2002, can cool or heat the left and right shunt segments 2003, 2004, at different levels, provided electrical insulation 2005 is on average centered between the TE elements 2001 and 2002. It should be noted that although two TE elements 2001 and two second TE elements 2002 are depicted, a larger TE element or a larger number of TE elements on each side could be utilized. Two first TE elements 2001 and two second TE elements 2002 are merely selected for illustration of a good stable mechanical structure. It should also be noted that depending on the desired route for current, the first TE element 2001 and the second TE elements 2002 need not be, but may be, of differing conductivity types.

Figure 21:
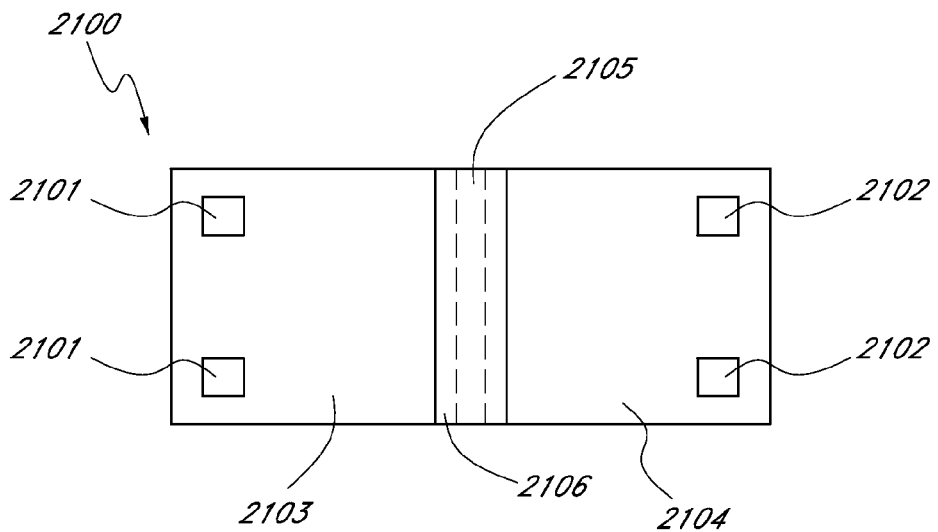
FIG. 21 depicts yet another configuration of a heat exchanger with one portion electrically isolated from another portion.

An alternate method of achieving electrical isolation within a shunt 2100 is depicted in FIG. 21. A shunt portion 2103 with two first TE elements 2101 is mechanically attached to a second shunt portion 2104 with two second TE elements 2102. Electrical insulation 2106 mechanically attaches shunt portions 2103 and 2104, which are also separated from one another by a gap 2105.

In cases where mechanical attachment 2106 is approximately centered between the TE elements 2101 and 2102, and the TE elements 2101 and 2102 produce about equal thermal power, the electrical insulation 2106 need not be a good thermal conductor. The TE elements 2101 and 2102 each provide thermal power to the respective shunt portions 2103 and 2104. Electrical insulation 2106 can be adhesive-backed Kapton tape, injection molded plastic, hot melt adhesive or any other suitable material. As shown in plan view in FIG. 21, the shunt portions 2103 2104 do not overlap to form a lap joint. Such a joint, with epoxy or other electrically insulating bonding agent could also be used.

Figure 22:
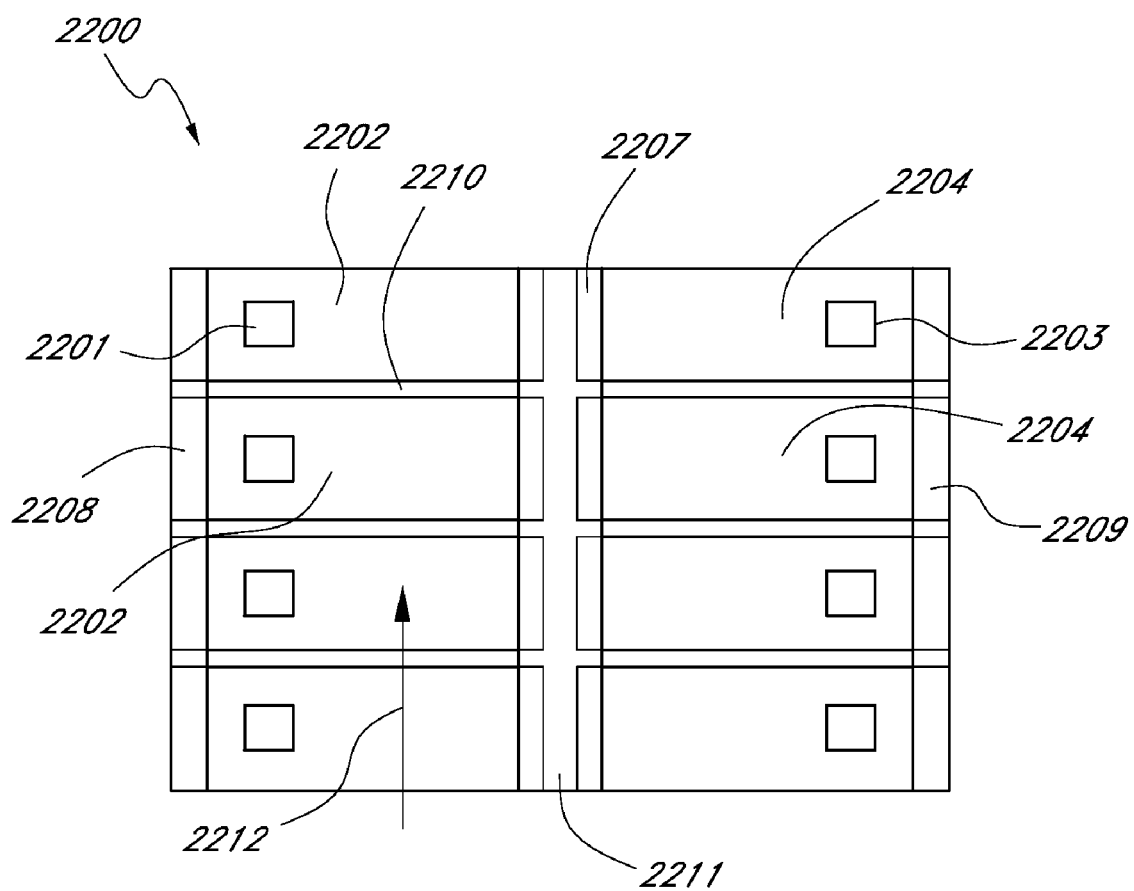
FIG. 22 depicts a heat exchanger segment configured in an array of electrically and thermally isolated portions.

Another shunt segment array 2200, depicted in top view in FIG. 22, has electrically isolated shunt segments in a rectangular TE array 2200. First TE elements 2201 are thermally connected to first shunt portions 2202, and second TE elements 2203 are thermally connected to second shunt portions 2204. Each shunt portion is separated electrically from the other shunt portions by gaps 2210, 2211. Electrical insulation 2208 at the left side of the assembly, insulation 2207 in the middle and insulation 2209 on the right side are preferably provided. An arrow 2212 indicates working fluid flow direction. This configuration can be operated at higher voltage and lower current than a similar array without electrical isolation. As noted for FIG. 20, first TE elements 2201 and second TE elements 2203 need not, but may be, of differing conductivity types. This will depend on the direction of desired current flow. The TE elements 2202, 2203 may, however, be at different potentials.

The gaps 2210 serve to effectively thermally isolate first shunt portions 2202 from each other, and second shunt portions 2204 from each other. Similarly, the side insulation 2208, 2209 provide both thermal and electrical isolation while mechanically attaching the shunts together. Center insulation 2207 provides electrical insulation and thermal isolation along its length. Thus, array 2200 is constructed to produce thermal isolation in the direction of arrow 2212 as described in U.S. Pat. No. 6,539,725. This configuration can be operated at higher voltage and lower current than a similar array without electrical isolation.

Figure 23:
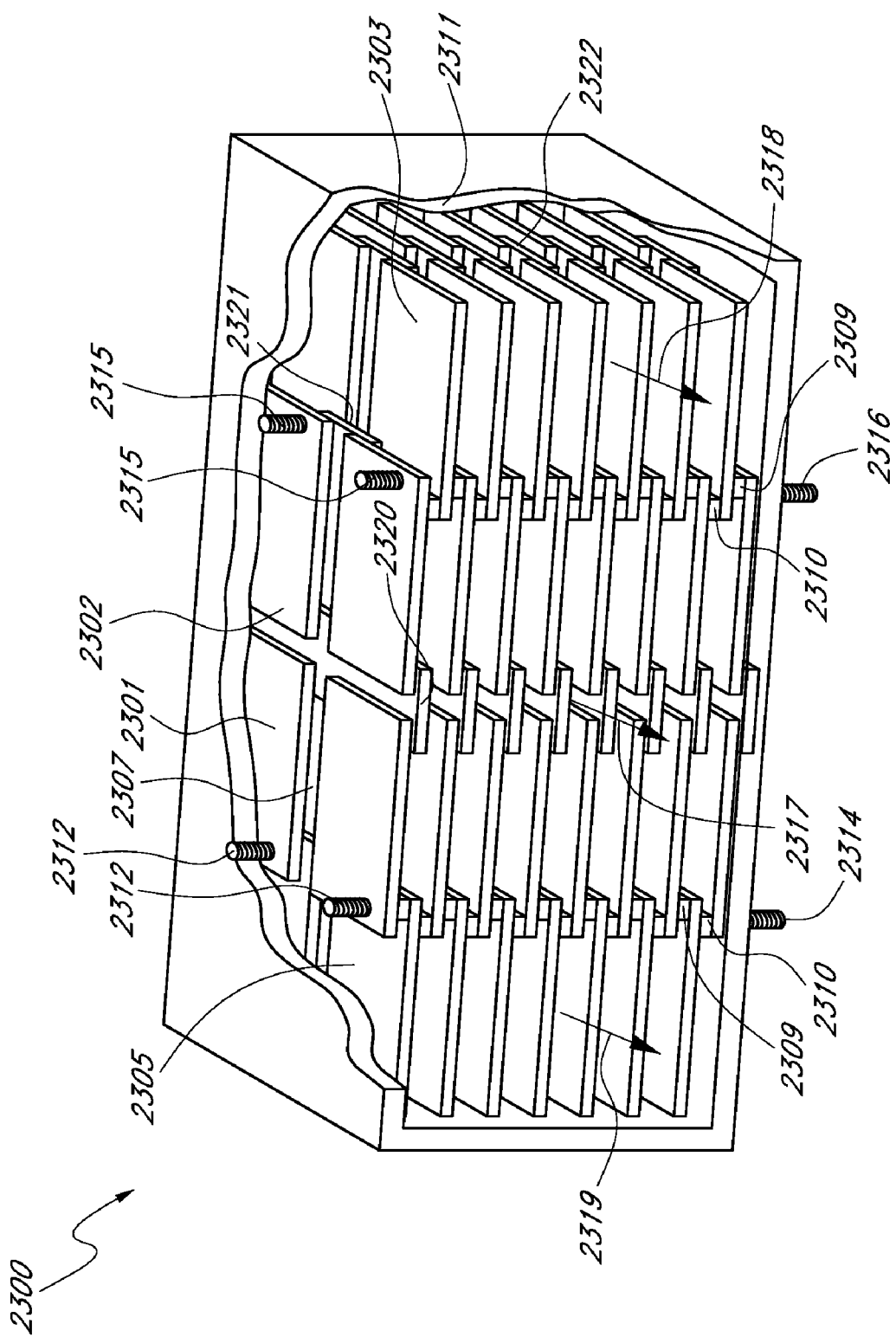
FIG. 23 depicts a cooler/heater constructed in accordance with the concepts of FIG. 22.

A cooling system 2300 that employs shunt segment arrays generally of the type described in FIG. 22, is depicted in FIG. 23. The cooling system 2300 has inner shunt segments 2301, 2302 connected mechanically by electrically insulating material 2320 such as tape. The inner shunt segments 2302 are mechanically connected by electrically and thermally insulating material 2321. Similarly, the inner segments 2301 are mechanically connected by electrically and thermally insulating material 2307. The inner shunt segments 2301, 2302 separately are connected to TE elements at the ends (not shown) in a manner described for FIG. 22. The TEs are sandwiched in the stack between inner shunt segments 2301, 2302 and respective outer shunt segments 2303, 2305. The center shunt segments 2301 separately are connected to outer left shunt segments 2305, and the inner shunt segments 2302 are connected to right outer shunt segments 2303. Preferably, the right outer shunt segments 2303 are similarly mechanically connected by electrically and thermally insulating material 2322 which is similar to electrically insulating material 2321 connecting the inner shunt segments 2302. The left outer shunt segments 2305 are similarly mechanically connected. A housing 2311 holds a stack array of shunt segments and TEs. Terminal posts 2312 and 2314 are electrically connected to inner segments 2301. Similarly, terminals 2315 and 2316 connect to inner shunt segments 2302. Preferably, thermally and electrically insulating spacers 2309, 2310 are positioned between each inner and outer segment.

A first working fluid 2317 passes through the inner region and a second working fluid 2318, 2319 passes through the outer regions. When voltages of the proper polarities and magnitude are applied between terminals 2312 and 2314, 2315 and 2316, the inner shunt segments 2301, 2302 are cooled. Also, the outer shunt segments 2303, 2305 are heated. Thus, the working fluid 2317 passing through the inner region is cooled, and the working fluid 2318, 2319 passing through the outer shunt segments 2303, 2305 is heated. The housing 2311 and the insulators 2309, 2310 contain and separate the cooled fluid 2317 from the heated fluid 2318, 2319.

The electrical connections to energize each stack in the system 2300 can be in series to operate at high voltage, in series/parallel to operate at about half the voltage or in parallel to operate at about ¼ the voltage. Polarity could be reversed to heat the inner working fluid 2317 and cool the outer working fluids 2318, 2319. More segments could be utilized in the direction of working fluids 2317, 2318, 2319 flow to operate at even higher voltage and to achieve higher efficiency from the resultant more effective thermal isolation.

Figure 24A:
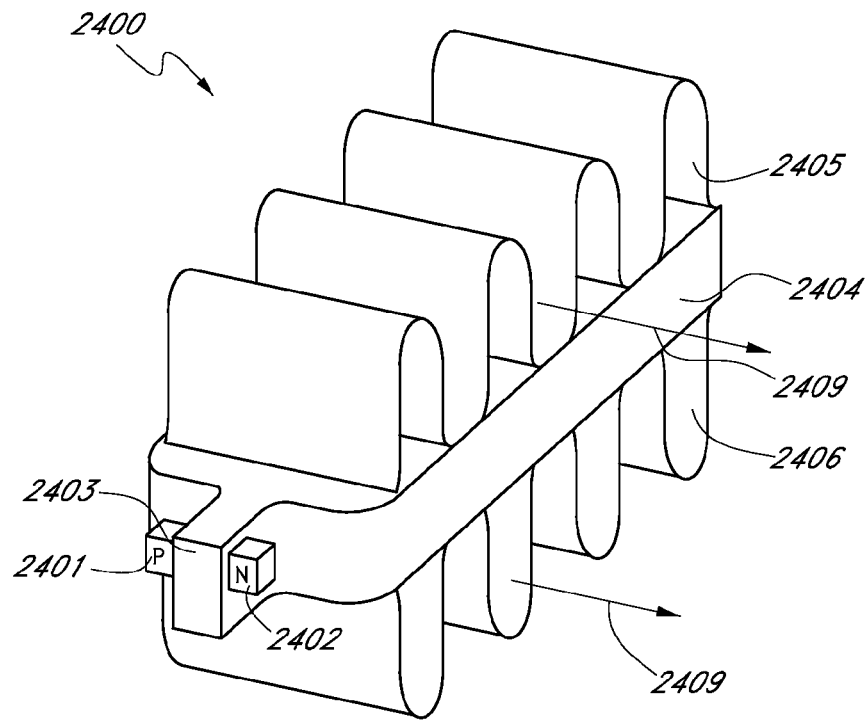
FIG. 24A depicts a heat exchange segment with TE elements aligned in the direction of fluid flow.
Figure 24B:
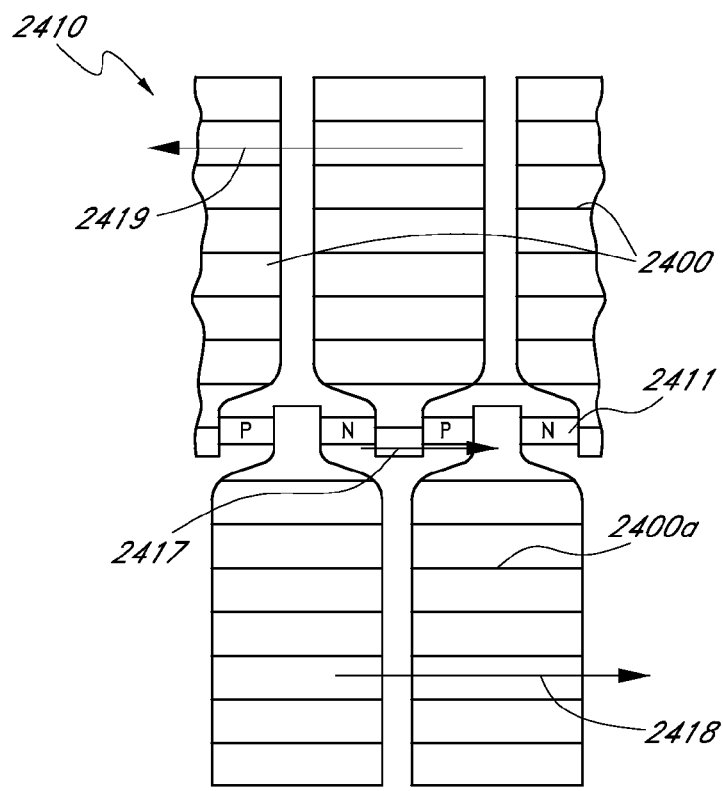
FIG. 24B depicts segments of FIG. 24A configured as an isolated element heat exchanger array in which electrical current flows generally parallel to working medium flow.

Another compact design that achieves enhanced performance from thermal isolation uses combined shunt and heat transfer segments 2400 as depicted in FIGS. 24A and 24B. This design is very similar to that of FIG. 14, but with TE elements 2401, 2402 aligned in the general direction of fluid flow. The TE elements 2401, 2402 of opposite conductivity type are connected to an extension 2403 of a shunt 2404. Preferably, heat exchangers 2405, 2406, such as fins, are in good thermal contact with the shunt 2404. A working fluid 2409 is heated or cooled as it passes through heat exchanger fins 2405, and 2406, depending on the direction of current flow.

FIG. 24B depicts a portion of a stack 2410 consisting of TE shunt segments 2400 as shown in FIG. 24A. Current 2417 flows in the direction indicated by the arrow. A plurality of first side shunts 2400 and a plurality of second side shunts 2400a are connected to TE elements 2411. A first working fluid 2418 flows along the lower portion of stack 2410 through the heat exchangers on the second side shunts 2400a in FIG. 24a, and a working fluid 2419 flows advantageously in the opposite direction through the heat exchangers of first side shunts 2400.

When suitable current 2417 is applied, the upper portion of the stack 2410 progressively cools fluid 2419 as it passes from one segment to the next, and the lower portion progressively heats fluid 2418 as it passes from one shunt 2400a to the next.

Figure 25A:
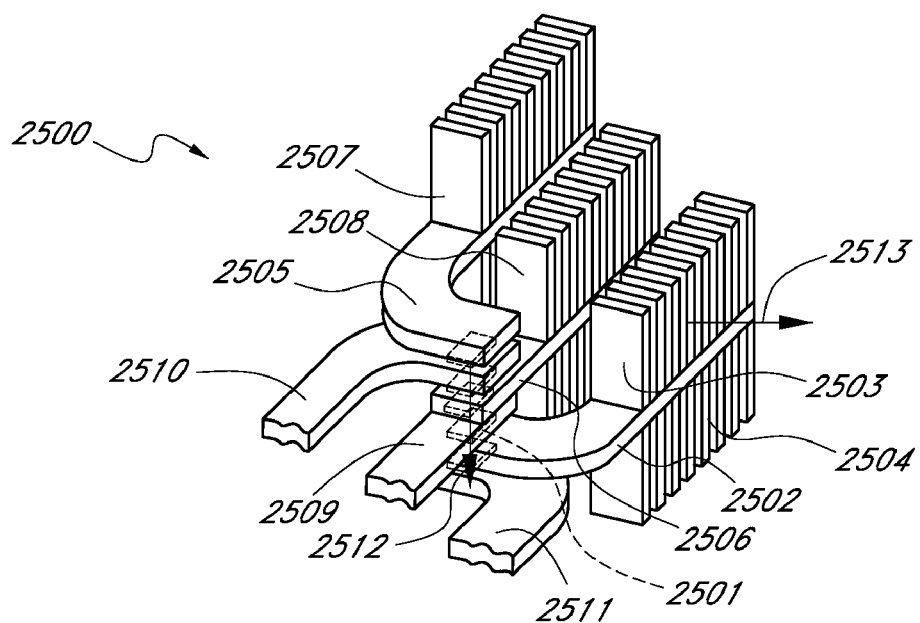
FIG. 25A depicts segments of a design configured as an isolated element heat exchanger array in which electrical current flows generally perpendicular to the direction of current flow.

An alternative TE stack configuration 2500 is depicted in FIG. 25A. This TE stack achieves the benefits of thermal isolation with a working fluid 2513 flowing generally perpendicular to the direction of current flow 2512. A first shunt 2502 is connected electrically to a first TE element 2501 and is in good thermal contact with heat exchangers 2503, 2504. A second first side shunt 2506 is similarly in good thermal contact with its heat exchangers 2508, and a third first side shunt 2505 is in good thermal contact with its heat exchangers 2507. Interspersed between each first side shunt 2502, 2506 and 2505 are TE elements 2501 of alternating type and second side shunts 2509, 2510 and 2511 projecting generally in the opposite direction, as with FIG. 12. Second side shunts 2509, 2510 and 2511, not fully depicted, are generally of the same shape and bear the same spatial relationship as first side shunts 2502, 2506 and 2505. A working fluid 2513 passes through the stack assembly in the direction indicated by the arrow. When suitable current is applied vertically through the TE elements, first side shunts 2502, 2505 and 2506 are heated and second side shunts 2509, 2510 and 2511 are cooled. As the working fluid 2513 passes first through heat exchanger 2507, then through the heat exchanger 2508 and finally through the heat exchanger 2503, it is progressively heated. A full stack assembly has repeated sections of the array 2500, in the direction of current flow, assembled so that the top of heat exchanger 2503 would be spaced closely to the bottom of the next sequential heat exchanger 2504 of another array portion. The thermal isolation in the direction of working fluid 2513 flow is readily apparent.

Figure 25B:
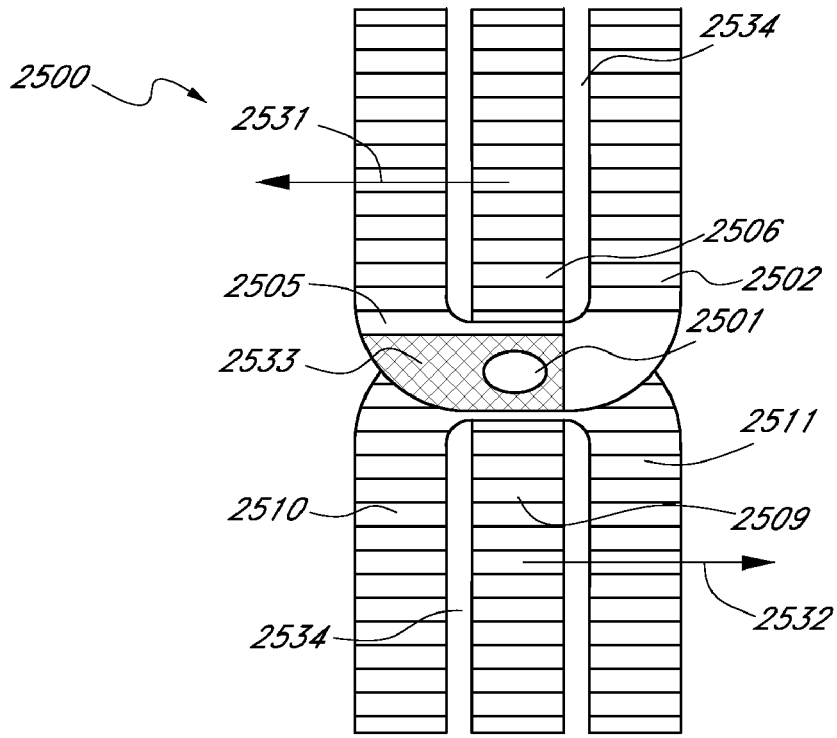
FIG. 25B depicts a plan view of the assembly in FIG. 25A.

FIG. 25B is a plan view of the array portion 2500 depicted in FIG. 25A. The cooling of a plurality of TE elements 2501, alternating in conductivity type, are interspersed with the plurality of first side shunts 2502, 2506, 2505, and a plurality of second side shunts 2511, 2509 and 2510, so that the first side shunts 2502, 2506 and 2505 alternate with the second side shunts 2511, 2509 and 2510. The shunts are separated by gaps 2534 and are in good thermal contact with heat exchangers for each shunt. A first working fluid 2531 passes along the upper section from right to left and a working fluid 2532 passes advantageously from left to right along the lower section. Thermal and electrical insulation 2533 is preferably provided between each pair of shunts, except where the electrical current flows through the TEs and shunts.

When suitable current passes through the array 2500, for example, the working fluid 2531 is progressively heated and the working fluid 2532 is progressively cooled. The insulation 2533 prevents unnecessary thermal losses and also prevents the working fluids 2531, 2532 from mixing. The array 2500, as shown, operates in counter flow mode, and employs thermal isolation to enhance performance. The same array 2500, can operate with the working fluids 2531, 2532 moving in the same direction in parallel flow mode, and still have the benefits of thermal isolation to enhance performance. In either case, advantageously, the TE elements 2521 are not all of the same resistance, but have resistances that vary depending on the temperature and power differentials between individual TE elements, as described in U.S. Pat. No. 6,539,735.

Figure 26A:
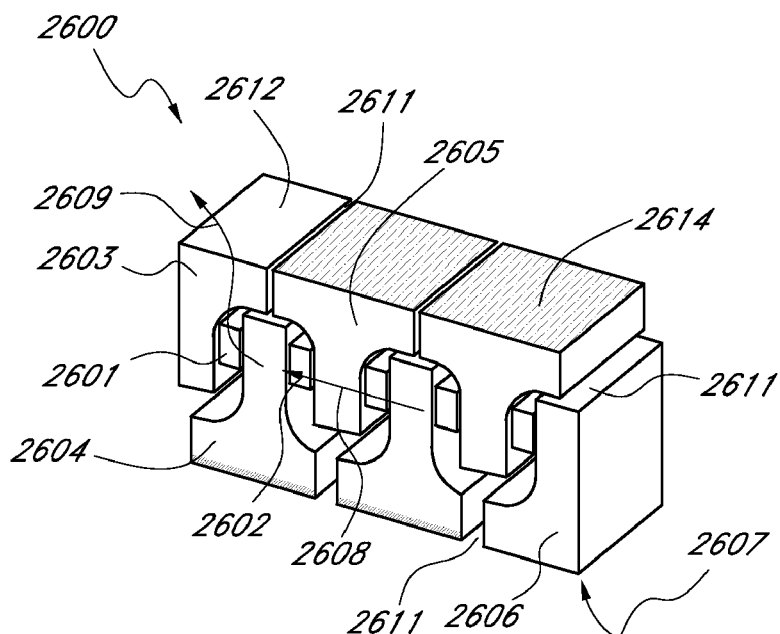
FIG. 26A depicts a TE heat exchanger module with reduced parasitic electrical resistance, which operates at relatively high voltage.

Another TE module 2600 is depicted in FIG. 26A, that uses the principles discussed in the present description to achieve operation at higher voltages and possible other benefits such as higher power density, compact size, ruggedness, higher efficiency. A first TE element 2601 is sandwiched between a first end shunt 2603 and a second shunt 2604. A second TE element 2602, of opposite conductivity type is sandwiched between the second shunt 2604 and a third shunt 2605. This pattern is continued to final end shunt 2606. A current 2607 flows into final end shunt 2606, through the TE modules and out the first end shunt 2603, as indicated by arrows 2608 and 2609. Gaps 2611 prevent electrical conduction and reduce thermal conduction between adjacent shunts. In one embodiment, the first end shunt 2603 and the final end shunt 2606 have an electrode surface 2612. The other shunts have shunt surfaces 2614 that are thermally conductive but electrically insulating from the body of the shunts.

In operation, suitable current 2608 passes through the TE module 2600 heating the upper surface and cooling the lower surface (or vice versa). The TE module 2600 depicted in FIG. 26A consists of five TE elements and six shunts. Advantageously, any odd number of TE elements can be employed, spaced alternately with shunts as depicted. Further, more than one TE element (of the same type as explained for FIG. 18) may be connected in parallel between each pair of shunts. To achieve alternative functionality, an even number of TEs can be used, such as to have electrical power confined to electrically isolated portions of one surface.

Figure 26B:
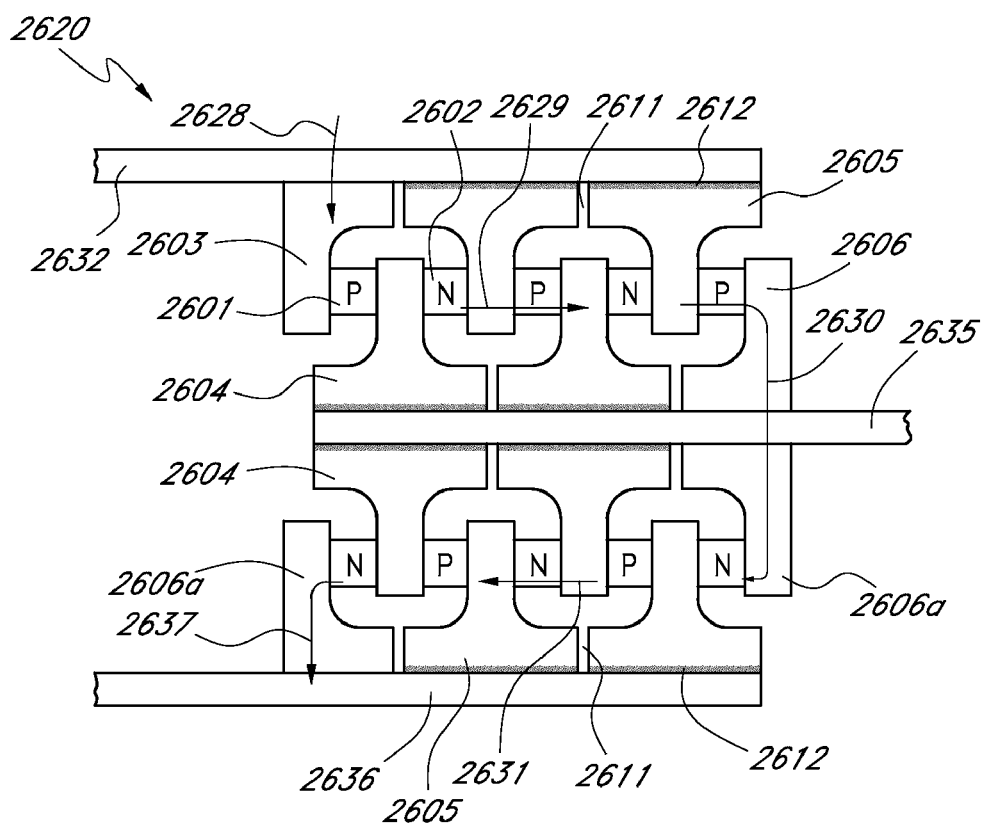
FIG. 26B depicts a plan view of a heat exchanger array that uses TE modules of FIG. 26A.

An array 2620 of TE modules 2600 is depicted in FIG. 26B. FIG. 26B depicts two TE modules 2600, of the type shown in FIG. 26A, stacked on top of each other with a center heat transfer member 2635 sandwiched between first side shunts 2604. Outer heat transfer members 2632 and 2636 are thermally coupled to second side shunts 2605. The shunt and heat transfer members can also be of any other suitable types, for example, the types presented in FIGS. 14 and 15. A first end shunt 2603 of a first TE module is electrically connected to the outer heat transfer members 2632. Similarly, the other end shunt 2606 of the first or upper TE module is electrically connected to the center heat transfer member 2635. Similarly, a second end shunt 2606a of the second TE module is electrically coupled to the center heat transfer member 2635 and the first end shunt 2603a of the second TE module is electrically coupled to the outer heat transfer member 2636 on the bottom of FIG. 26B. Other than the end shunts, 2603, 2606, 2606a and 2603a, the other shunts 2604, 2605 have electrical insulation 2612 that is thermally conductive. In addition, as in the arrangement of FIG. 26A, the shunts have gaps 2611 to electrically isolate them from one another. Current flow is indicated by the arrows 2628, 2629, 2630, 2631 and 2637. As depicted, the TE elements 2601, 2602 alternate in conductivity type.

When suitable current is passed through the array 2620, second side shunts 2605 and the outer heat transfer members 2632 and 2636 are heated. The first side shunts 2604 and center heat transfer member 2635 are cooled. The opposite is true for reversed current. The operating current can be adjusted along with the corresponding voltage by adjusting the dimensions and number of TE elements 2601, 2602. Similarly, power density can be adjusted. It should be noted that a larger number of shunts and TE elements could be used, which would widen the configuration shown in FIG. 26B. In addition, further TE modules 2600 could be stacked in a vertical direction. In addition, an array of such stacks into or out of the plane of FIG. 26B could be provided or any combination of the above could be utilized. In a suitable array, thermal isolation principles in the direction of heat transfer or working fluid flow could be utilized in accordance with the description in U.S. Pat. No. 6,539,725.

Figure 27:
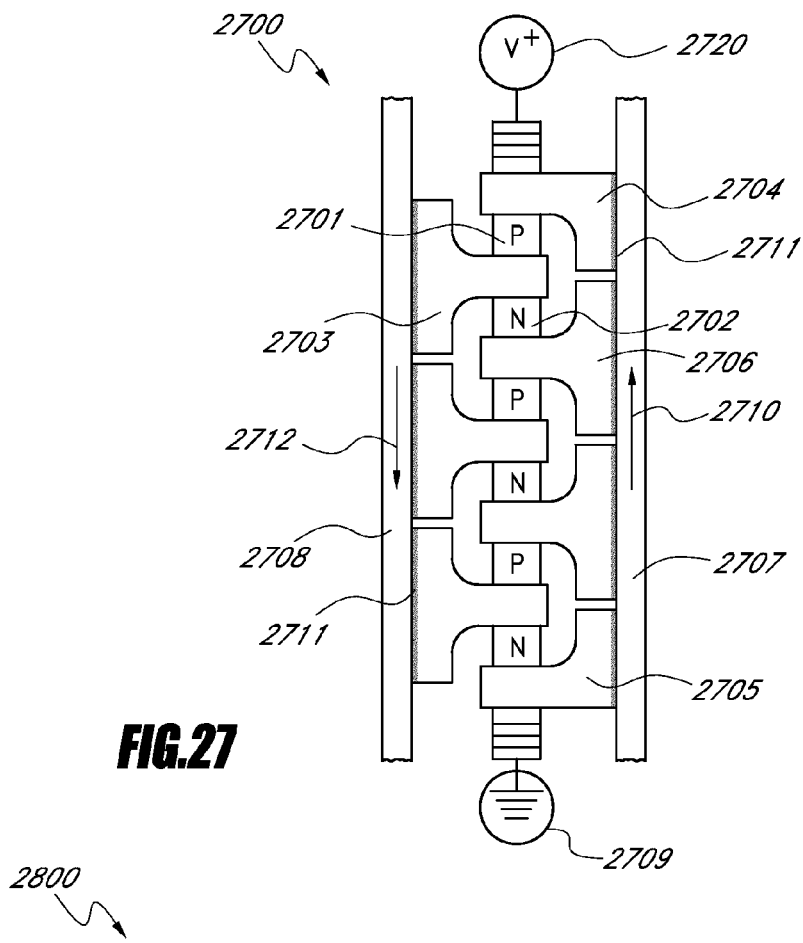
FIG. 27 depicts an isolated element and stack configuration with heat transfer to moving solid members.

An alternative embodiment of a TE module 2700, similar in type to the TE module 2600 of FIG. 26A, is illustrated in FIG. 27. End shunts 2705, 2704 are electrically connected to a power source 2720 and ground 2709. TE elements 2701, 2702 are electrically connected to between the series of shunts 2703, 2704, 2705, 2706. In this embodiment, all shunts 2703, 2704, 2705, 2706 are electrically isolated by insulation 2711 from first and second heat transfer members 2707, 2708. The shunts are in good thermal contact with the heat transfer members 2707, 2708. First side heat transfer member 2708 moves in the direction indicated by an arrow 2712. Advantageously, the second side heat transfer member 2707 moves in the opposite direction, as indicated by an arrow 2710.

When suitable current is applied to the TE module 2700, the second side heat transfer member 2707 is cooled and the first side heat transfer member 2708 is heated. Operation is similar to that associated with the description of FIGS. 7A, 7B, 7C, and 7D. It should be noted that the first and second heat transfer members 2707, 2708, need not be rectangular in shape as might be inferred from FIG. 27, but may be disk shaped or any other advantageous shape, such as those discussed in FIG. 7A. With effective design, the TE module 2700 can also achieve the performance benefits associated with thermal isolation as discussed in U.S. Pat. No. 6,539,725.

In an alternative embodiment, heat transfer components 2707 and 2708 do not move. In that configuration, the TE module 2700 is similar to a standard module as depicted in FIG. 1, but can operate with a high power density and utilize relative thin TE elements 2701, 2702. Advantageously, the TE module 2700 induces low shear stresses on the TE elements 2701, 2702 that are produced by thermal expansion differences between the first side and second side shunts, for example. Because shear is generated in the TE module 2700 by the temperature differential across TE elements 2701, 2702, and is proportional to the width dimension, it can be much less than the shear in a standard TE module, in which the shear is proportional to the overall module width. The differences can be seen from a comparison of FIG. 12 with a standard module depicted in FIG. 1. Standard modules with more than two TE elements of the same dimensions as those in the configuration of FIG. 12 will exhibit disadvantageously high shear stresses. Such stresses limit thermal cycling durability and module size.

FIG. 27 also provides a good illustration to describe how the embodiments described in this specification can be used for power generation as well. In such a configuration, the terminals 2709, 2720 are connected to a load rather than a power source in order to provide power to a load. The heat transfer members 2708, 2707 provide thermal power in the form of a temperature gradient. The temperature gradient between the first heat transfer member 2708 and second heat transfer member 2707 causes the thermoelectric system 2700 to generate a current at terminals 2709, 2720, which in turn would connect to a load or a power storage system. Thus, the system 2700 could operate as a power generator. The other configurations depicted in this description could also be coupled in similar manners to provide a power generation system by applying a temperature gradient and deriving a current.

Figure 28:
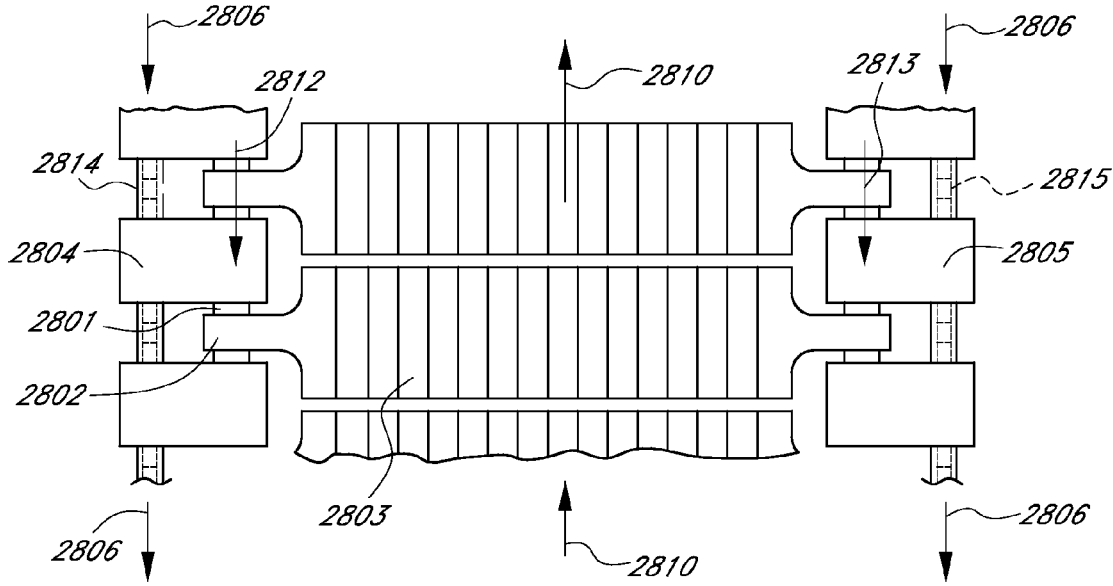
FIG. 28 depicts an isolated element stack array with heat transfer between a liquid and a gas.

A TE heat transfer system 2800 is depicted in FIG. 28 that uses a gas working fluid 2810, and a liquid working fluid 2806. In this embodiment, first side shunt heat exchangers 2803 are of construction depicted in FIG. 24A and FIG. 24B. The shunt heat exchangers 2803 transfer thermal power with the gaseous working media 2810. In this embodiment, second side shunts heat exchanger 2804, 2805 transfer thermal power with liquid working media 2806. A plurality of TE elements 2801 of opposite conductivity types are sandwiched between second side shunts 2804, 2805 and the shunt heat exchanger 2803. The second side shunt heat exchangers 2804, 2805 are similarly sandwiched between TE elements 2801 of alternating conductivity type. A current 2812, 2813 passes through the system 2800 as represented by the arrows 2812, 2813. In this embodiment, tubes 2814, 2815 pass the liquid working media 2806 from one shunt heat exchanger 2804, 2805 to the next one.

Operation of the TE heat transfer system 2800 is similar to that of the description of FIG. 24B, with one working fluid 2810 being gaseous and the other 2806 being liquid. The benefits of thermal isolation as described in U.S. Pat. No. 6,539,725 are also achieved with the design depicted in system 2800.

Figure 29:
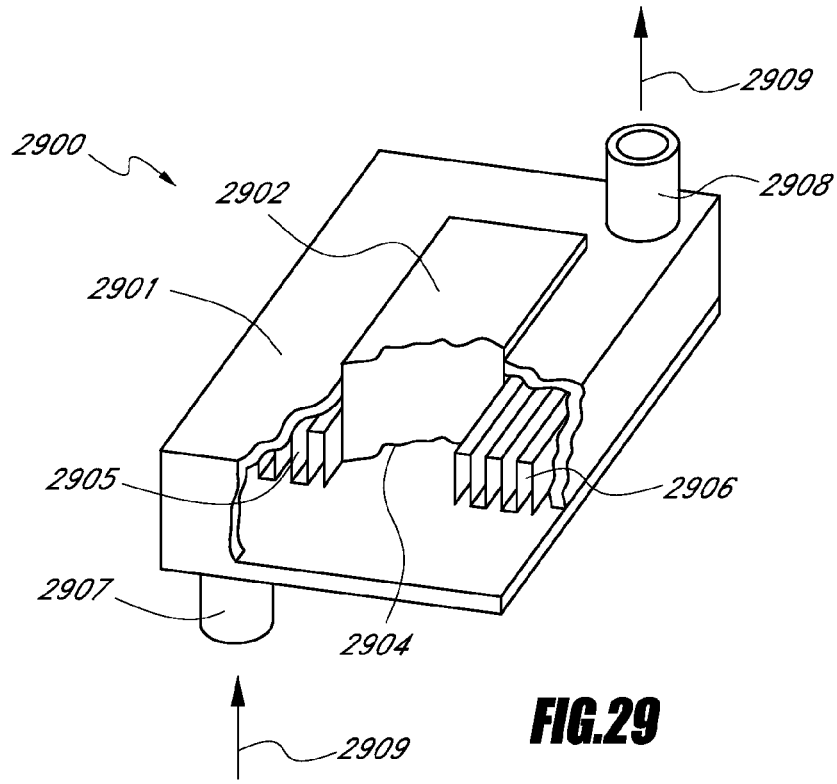
FIG. 29 depicts a heat exchanger module with low parasitic electrical resistance for use in the stack array of FIG. 28.

FIG. 29 depicts details of a shunt heat exchanger 2900. The assembly advantageously has a container 2901 constructed of very good thermally conductive material, an electrode 2902 constructed of very good electrically conductive material, and heat transfer fins 2905 and 2906 in good thermal contact with the top and bottom surfaces of container 2901. In one embodiment, the container 2901 and the electrode 2902 are constructed of a single material, and could be unitary in construction. Advantageously, an interface 2904 between the bottom surface of container 2901 and electrode 2902 has very low electrical resistance. Fluid 2909 passes through the shunt heat exchanger 2900.

In operation, TE elements, not shown, are electrically connected to the top and bottom portions of the electrode 2902. When suitable current is applied through the TEs and the electrode 2902, the container 2901 and the fins 2905, 2906 are heated or cooled. The working fluid 2909 passing through the shunt heat exchanger 2900 is heated or cooled by the heat exchange 2900. Advantageously, the shunt heat exchanger 2900 is of sufficiently good electrical conductivity that it does not contribute significantly to parasitic losses. Such losses can be made smaller by minimizing the current path length through electrode 2902, maximizing electrical conductivity throughout the current path, and increasing electrode 2902 cross sectional area.

The container 2901 top and bottom surfaces, and fins 2905 and 2906 provide sufficient electrical conductivity in the direction of current flow, that the solid electrode body 2902 can be reduced in cross sectional area or completely eliminated as shown in the embodiment in FIG. 4B.

Figure 30:
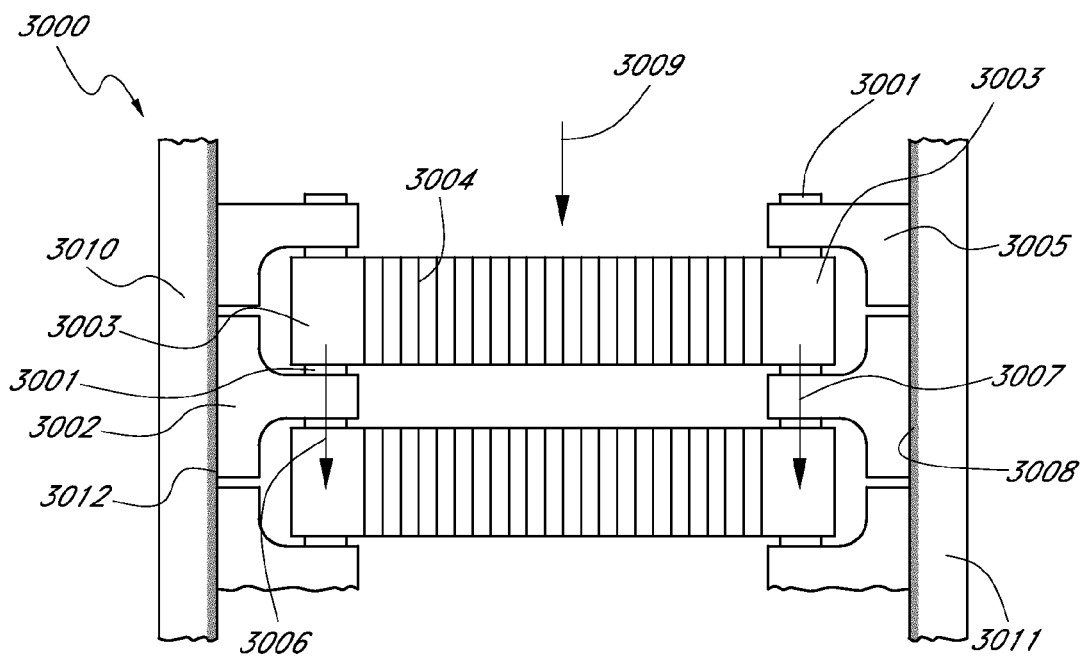
FIG. 30 depicts a segment of an isolated element heat exchanger with solid heat sink and moving gaseous working fluid.

A heat sink and fluid system 3000 is depicted in FIG. 30. TE elements 3001 of alternating conductivity types are interspersed between fluid heat exchanges 3004, each having shunt portions 3003, and shunts 3002 and 3005. Current 3006, 3007 flows through the shunt portions 3003, the shunts 3002 and 3005 and the TE elements 3001. A working fluid 3009 flows as indicated by the arrow. Heat sinks 3010, 3011 are in good thermal contact with and electrically insulated from the shunts 3002, 3005. In embodiments with metallic or otherwise electrically conductive heat sinks 3010, 3011 electrical insulation 3008, 3012 that advantageously has good thermal conductance confines the current flow 3001, 3007 to the circuit path indicated.

When suitable current 3006, 3007 is applied, thermal power is transferred to the heat sinks 3010, 3011 and from the working fluid 3009. The shunt heat transfer members 3004 are thermally isolated from one another so that performance gains from thermal isolation are achieved with this embodiment.

Figure 31A:
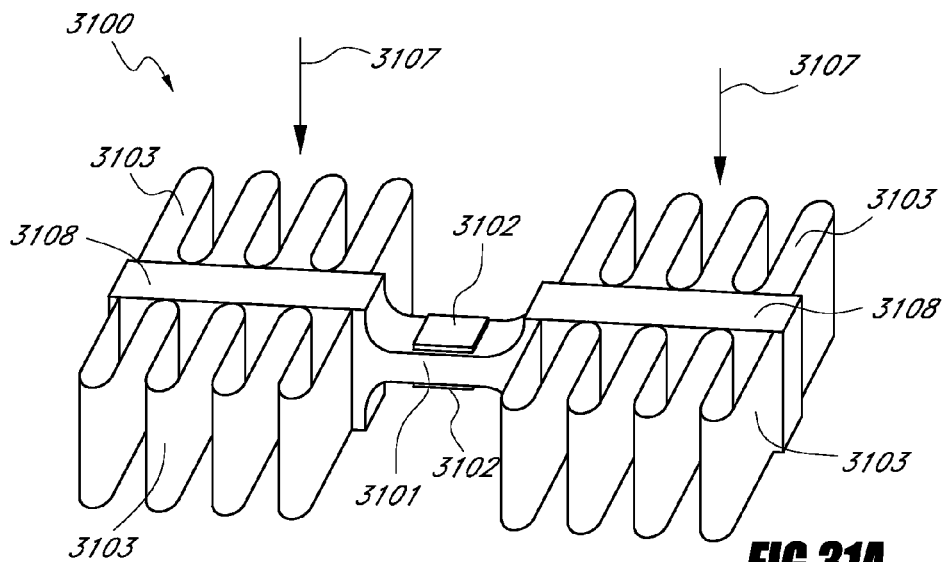
FIG. 31A depicts a heat exchanger element with TE elements generally in the center to about double heat transfer from the element.

An alternative shunt heat exchanger embodiment 3100 is depicted in FIG. 31A. A shunt portion 3101 has electrodes 3102 for connection to TE elements (not shown) and heat transfer extensions 3108 in good thermal contact with heat exchangers 3103, such as fins. A fluid 3107 passes through the heat exchangers 3103.

The shunt heat exchanger 3100 preferably has electrodes 3102 located generally centered between heat transfer extensions 3108. In this embodiment, thermal power can flow into and out of the TE assemblies in two directions, and thus can increase heat transfer capacity by about a factor of two per TE element in comparison to the embodiment depicted in FIG. 24A. The shunt side may have increased heat transfer characteristics such as by incorporation heat pipes, convective heat flow, or by utilizing any other method of enhancing heat transfer.

Figure 31B:
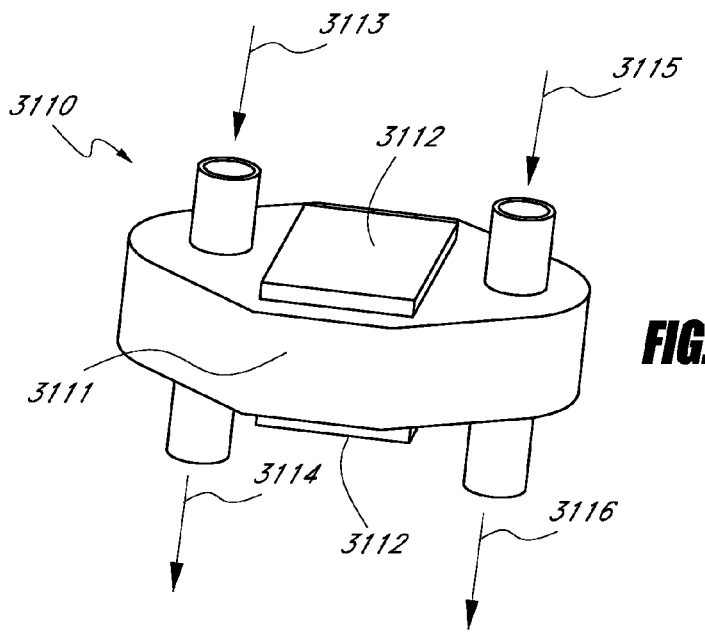
FIG. 31B depicts another heat transfer element generally for liquids with the TE element generally in the center.

FIG. 31B depicts a heat transfer shunt assembly 3110 with a shunt 3111, electrodes 3112 and influent fluid ports 3113, 3114, and effluent fluid ports 3115, 3116. The heat transfer shunt assembly 3110 can have increased heat transfer capacity per TE element and more fluid transport capacity than the system depicted in FIG. 29.

Figure 31C:
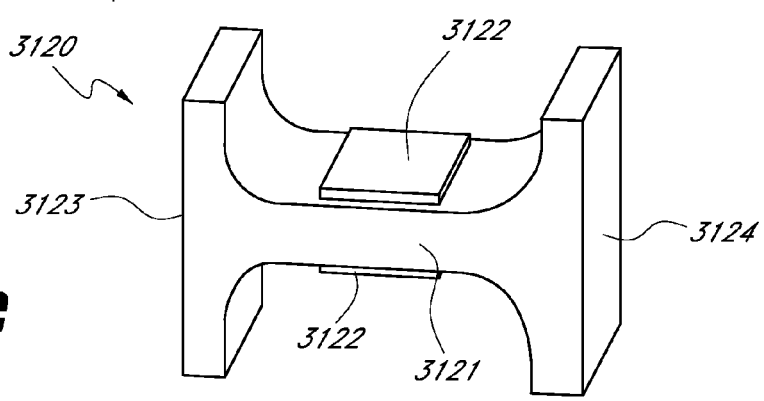
FIG. 31C depicts yet another heat exchanger with the TE element generally in the center.

FIG. 31C depicts a shunt assembly 3120 with shunt member 3121, electrodes 3122 and heat exchange surfaces 3123, 3124. The shunt assembly 3120 can have approximately two times the heat transfer capacity per TE assembly as the embodiment depicted in FIGS. 26A and 26B. However, in contrast to the usage described in FIGS. 26A and 26B, stacks of shunt assemblies 3120 would alternate at approximately right angles to one another and the surfaces 3123, 3124 opposite one another would both be heated, for example, and the next pair of surfaces in the stack at about a right angle to the heated pair, would be cooled. Alternatively the surfaces 3123, 3214 could be at other angles such as 120° and be interdispersed with shunts 2604 as depicted in FIG. 26. Any combination of multisided shunts is part of the inventions.

It should be noted that the reduction in thermoelectric material can be quite dramatic. For example, the thermoelectric elements discussed herein may be as thin as 5 microns to 1.2 mm in one general embodiment. For superlattice and heterostructure configurations, such as could be accomplished using the embodiments of FIGS. 31A-C, 26A-B, and 27, thermoelectric elements may be between 20 microns and 300 microns thick, more preferably from 20 microns to 200 microns, and even from 20 microns to 100 microns. In another embodiment, the thickness of the thermoelectric elements is between 100 microns and 600 microns. These thicknesses for the thermoelectric elements are substantially thinner than conventional thermoelectric systems.

It should be noted that the configurations described do not necessarily require the TE elements to be assembled into arrays or modules. For some applications, TE elements are advantageously attached directly to heat transfer members, thereby reducing system complexity and cost. It should also be noted that the features described above may be combined in any advantageous way without departing from the invention. In addition, it should be noted that although the TE elements are shown in the various figures to appear to be of similar sizes, the TE elements could vary in size across the array or stack, the end type TE elements could be of different size and shape than the P-type TE elements, some TE elements could be hetero structures while others could be non-hetero structure in design.

In general, the systems described in these figures do operate in both cooling/heating and power generation modes. Advantageously, specific changes can be implemented to optimize performance for cooling, heating or power generation. For example, large temperature differentials (200 to 2000° F.) are desirable to achieve high-efficiency in power generation as is well know in the art, while small temperature differentials (10 to 60° F.) are characteristic of cooling and heating systems. Large temperature differentials require different construction materials and possibly TE modules and elements of different design dimensions and materials. Nevertheless, the basic concept remains the same for the different modes of operation. The designs described in FIGS. 5, 8 and 9 are advantageous for power generation because they offer the potential to fabricate simple, rugged, low-cost designs. However, all of the above mentioned designs can have merit for specific power generation applications and cannot be excluded.

High Capacity Thermoelectric Temperature Control System

Thermoelectric cooling, heating and temperature control devices have important features that make them of great interest for use in several growing market sectors. For example, increased cooling capacity requirements for electronic chasses use small cooling systems with form factors not easily achieved with two-phase compressor systems. Similarly, local cooling and heating systems, quiet room heat pumps, and other applications could benefit by conversion from two-phase compressor-based technology to quiet, vibration-free solid-state solutions. However, while finding success in limited niche applications, adapting the technology has been slow, in part due to three deficiencies of such solid-state systems:

TE devices are generally about ¼ as efficient as two-phase compressor-based cooling systems, resulting in 4 times the operating costs and larger heat rejection components;

Projected initial costs are at least double the cost of competitive systems; and Simulation tools that are capable of optimizing TE system design for cost, efficiency, size and other important parameters have not been available.

Certain embodiments described herein advantageously optimize alternative thermodynamic cycles capable of approximately doubling efficiency in important applications. The improvements in efficiency of certain embodiments are associated with working fluid movement, such as found in HVAC and temperature control systems. Results have been experimentally verified in air- and liquid-based devices. In addition, in certain embodiments described herein, high power density thermoelectric designs reduce thermoelectric material usage to a practical minimum, subject to the limitations of present thermoelectric material fabrication and heat transfer technology. Material use reduction has been enabled in certain embodiments described herein by improved heat transfer technology and more accurate modeling software. Certain embodiments described herein employ these technological advances and achieve substantial material reduction. Certain embodiments described herein have been accurately and comprehensively modeled with simultaneous, multidimensional optimization algorithms that efficiently optimize complex designs. The models allow design input variables to be constrained to ranges suitable for ease of manufacture, and other purposes. Also, design output can be constrained by imposing limits on volume, pressure drop, flow rate and other parameters.

These advancements have been used to design, construct and test certain embodiments described herein, including but not limited to, thermoelectric-based solid-state cooling, heating and temperature control systems with 80 watts and 3500 watts of thermal power output. Certain other embodiments described herein provide thermoelectric systems with other ranges of thermal power output.

Certain embodiments described herein comprise a liquid-based heating, cooling, and temperature control system. Certain embodiments described herein include one or more of the following specific technical design objectives:

Operating efficiencies at least 50% greater than that with conventional thermoelectric technology;
Thermoelectric material usage less than 25% of commercial thermoelectric modules with the same thermal output;
Readily manufactured and have the prospect of being low cost, compact, and minimum weight;
Incorporate electrical redundancy;
Nominal thermal pumping capacity of 3,500 watts in cooling mode; and
Scalable to larger and smaller sizes between 50 and 5,000 watt thermal capacity.

Figure 32:
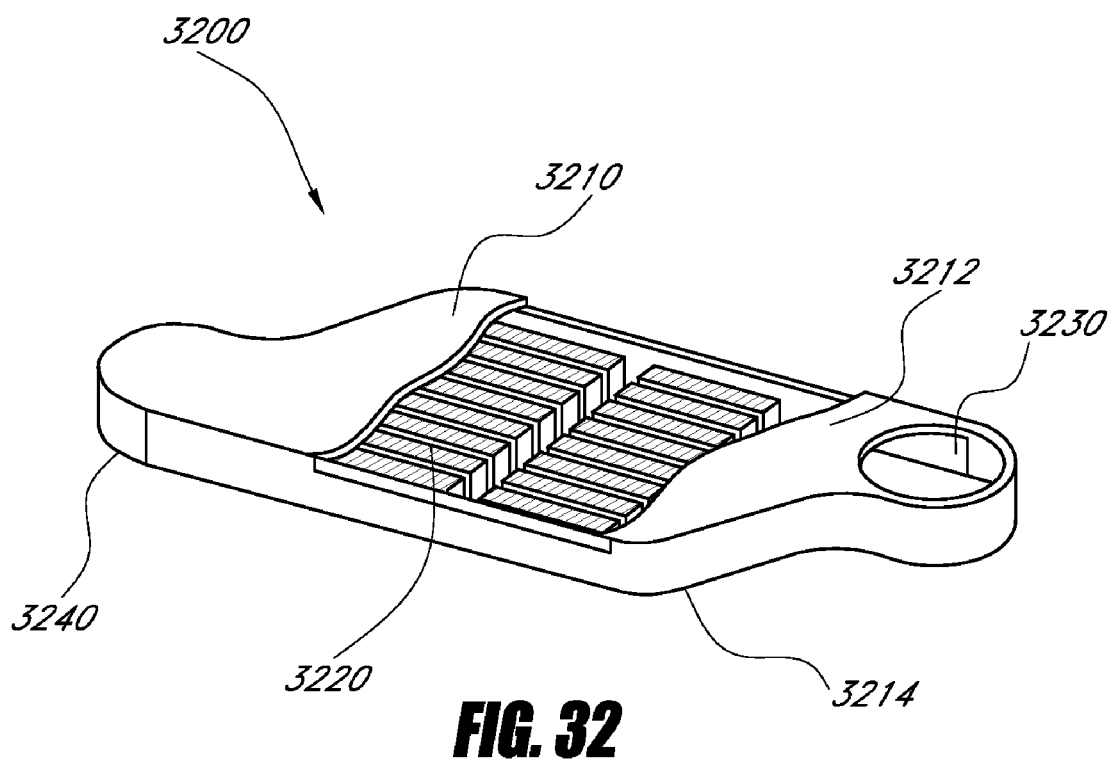
FIG. 32 schematically illustrates a partial cut-away view of an example heat transfer device in accordance with certain embodiments described herein.
Figure 33:
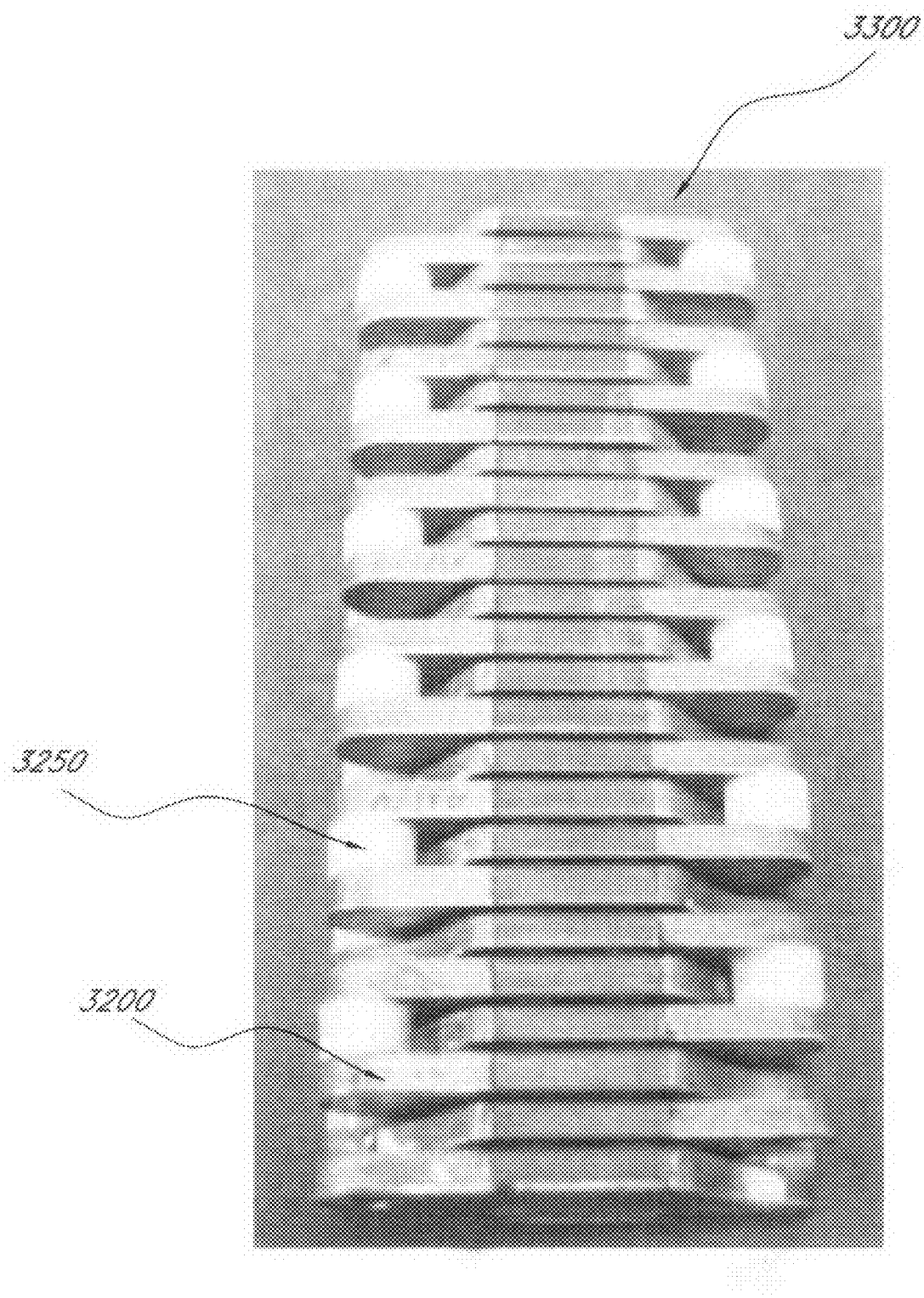
FIG. 33 is a view of an example thermoelectric system subassembly compatible with certain embodiments described herein.

FIG. 32 schematically illustrates a partial cut-away view of an example heat transfer device 3200 in accordance with certain embodiments described herein and FIG. 33 is a view of an example thermoelectric system subassembly 3300 compatible with certain embodiments described herein. The thermoelectric system comprises a plurality of thermoelectric modules (not visible in FIG. 33) and a plurality of heat transfer devices 3200. Each heat transfer device 3200 comprises a housing 3210 and one or more heat exchanger elements 3220 inside the housing 3210. Each heat transfer device 3200 accepts a working fluid to flow therethrough. At least some of the heat transfer devices 3200 are in thermal communication with and sandwiched between at least two thermoelectric modules of the plurality of thermoelectric modules so as to form a stack of alternating thermoelectric modules and heat transfer devices 3200. The stack is arranged to provide thermal isolation in the direction of a working medium movement. In certain embodiments, the subassembly 3300 is compressively loaded to assure mechanical stability.

In certain embodiments, the housing 3210 comprises copper and the one or more heat exchanger elements 3220 comprises copper fins. The housing 3210 of certain embodiments comprises a plurality of portions (e.g., two drawn copper shells) which are fitted together to form the housing 3210. In certain other embodiments, the housing 3210 is unitary in construction, with bends, folds, and/or removed material to define a volume through which the working fluid can flow.

In certain embodiments, the heat exchanger elements 3220 comprise a plurality of copper fins. The heat exchanger elements 3220 of a heat transfer device 3200 in certain embodiments are unitary in construction, with bends, folds, and/or removed material to form a portion across which the working fluid can flow to transfer heat between the heat exchanger elements 3220 and the working fluid. For example, the heat exchanger elements 3220 can comprise folded copper fins positioned within the copper shells of the housing 3210. In certain embodiments, the heat exchanger elements 3220 comprise two or more fin assemblies, as schematically illustrated by FIG. 32. In certain embodiments, the housing 3210 and the one or more heat exchanger elements 3220 are unitary in construction, with bends, folds, and/or removed material to form the heat transfer device 3200.

In certain embodiments, the housing 3210 comprises a first surface 3212 and a second surface 3214 generally parallel to the first surface 3212. When assembled into a thermoelectric system, the first surface 3212 is in thermal communication and in electrical communication with at least a first thermoelectric module of the plurality of thermoelectric modules. Furthermore, when assembled into the thermoelectric system, the second surface 3214 is in thermal communication and in electrical communication with at least a second thermoelectric module of the plurality of thermoelectric modules. This second thermoelectric module is also in thermal communication and in electrical communication with at least a second thermoelectric module.

For example, in certain embodiments, alternate N- and P-type thermoelectric elements are soldered or brazed directly to the first surface 3212 and the second surface 3214, respectively, of the heat transfer device 3200. The alternate N- and P-type thermoelectric elements are also soldered or brazed directly to the neighboring heat transfer devices 3200 of the thermoelectric system. Certain such embodiments advantageously provide a design feature which eliminates traditional thermoelectric module components, including substrates and other electrical circuitry components.

In certain embodiments, each heat transfer device 3200 comprises an inlet 3230 through which the working fluid enters the heat transfer device 3200 and an outlet 3240 through which the working fluid exits the heat transfer device 3200. The working fluid in certain embodiments flows through the inlet 3230 in a direction generally perpendicular to the first surface 3212 and flows through the outlet 3240 in a direction generally perpendicular to the second surface 3214. As shown in the example subassembly 3300 of FIG. 33, in certain embodiments, the outlet 3240 of a heat transfer device 3200 is fluidically coupled (e.g., by a fluid duct or conduit 3250) to the inlet 3230 of another heat transfer device 3200. In certain embodiments, the two heat transfer devices 3200 fluidically coupled to one another by the fluid conduit 3250 are spaced apart by a thermoelectric module, another heat transfer device 3200, and another thermoelectric module, such that the working fluids move in a counter-flow pattern, with each fluid passing through every second heat transfer device 3200.

Figure 34:
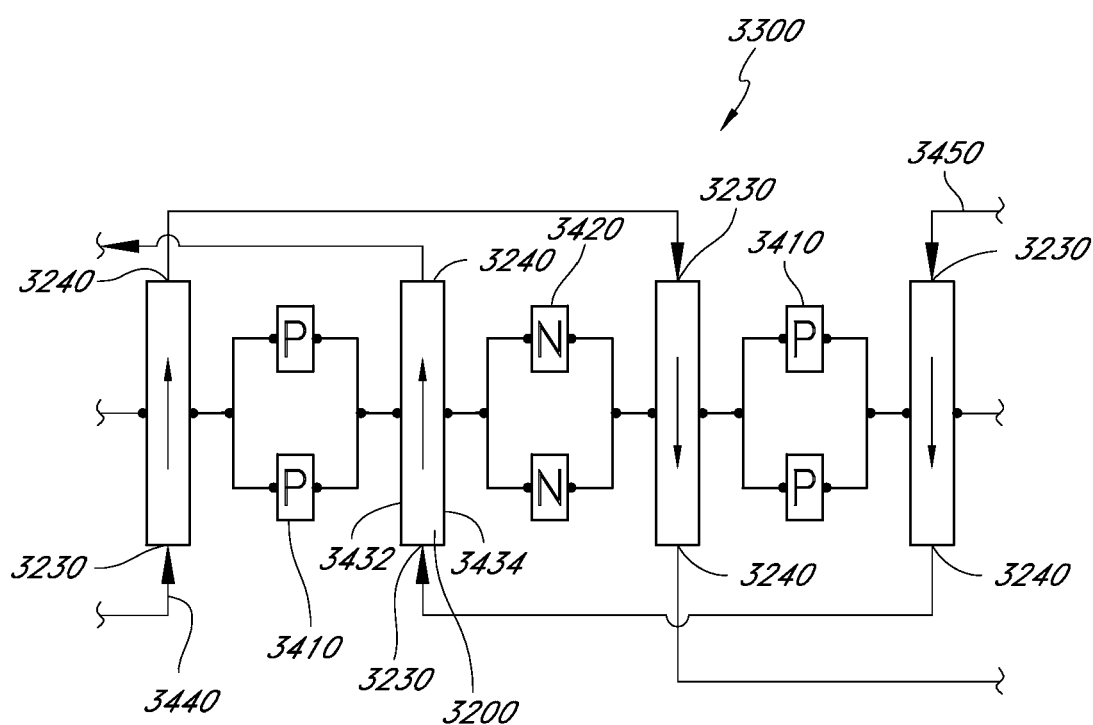
FIG. 34 schematically illustrates the working fluid paths and the electrical connections of a heat exchanger subassembly or stack of an example thermoelectric system compatible with certain embodiments described herein.

FIG. 34 schematically illustrates the working fluid paths and the electrical connections of a heat exchanger subassembly 3300 (e.g., the stack) of an example thermoelectric system compatible with certain embodiments described herein. In FIG. 34, the current flows along the length of the heat exchanger subassembly (e.g., the stack) 3300. In certain embodiments, the subassembly 3300 achieves a degree of electrical redundancy by incorporating electrical circuits through parallel thermoelectric elements. The series parallel redundancy shown in FIG. 34 can advantageously add to device ruggedness, stability, and reliability of the thermoelectric system.

The thermoelectric system of certain embodiments comprises a first plurality of thermoelectric elements 3410, a second plurality of thermoelectric elements 3420, and a plurality of heat transfer devices 3200. Each heat transfer device 3200 has a first side 3432 in thermal communication with two or more thermoelectric elements 3410 of the first plurality of thermoelectric elements 3410 and a second side 3434 in thermal communication with one or more thermoelectric elements 3420 of the second plurality of thermoelectric elements 3420, so as to form a stack of thermoelectric elements and heat transfer devices. The two or more thermoelectric elements 3410 of the first plurality of thermoelectric elements 3410 are in parallel electrical communication with one another. The two or more thermoelectric elements 3410 of the first plurality of thermoelectric elements 3410 are in series electrical communication with the one or more thermoelectric elements 3420 of the second plurality of thermoelectric elements 3420. In certain embodiments, the one or more thermoelectric elements 3420 of the second plurality of thermoelectric elements 3420 comprises two or more thermoelectric elements 3420 that are in parallel electrical communication with one another.

In certain embodiments, the thermoelectric elements 3410 of the first plurality of thermoelectric elements 3410 are P-type, and in certain such embodiments, the thermoelectric elements 3420 of the second plurality of thermoelectric elements 3420 are N-type. Each heat transfer device 3200 in certain embodiments thermally isolates the two or more thermoelectric elements 3410 of the first plurality of thermoelectric elements 3410 from the two or more thermoelectric elements 3420 of the second plurality of thermoelectric elements 3420. In certain embodiments, the stack is arranged to provide thermal isolation in the direction of a working medium movement.

In certain embodiments, each heat transfer device 3200 accepts a working fluid to flow therethrough in a general direction of the heat transfer device 3200. The general directions of two or more heat transfer devices 3200 of the plurality of heat transfer devices 3200 are substantially parallel to one another. For example, the arrows of the heat transfer devices 3200 in FIG. 34 show the general directions for fluid flow of the heat transfer devices 3200. In certain embodiments, the general directions of at least two heat transfer devices 3200 of the plurality of heat transfer devices 3200 are substantially opposite to one another.

As described above with regard to FIG. 33, the outlet 3240 of a heat transfer device 3430 is fluidically coupled to the inlet 3230 of another heat transfer device 3430. For example, as shown schematically by FIG. 34, a first working fluid 3440 is cooled by flowing through a first set of the heat transfer devices 3200 and a second working fluid 3450 is heated by flowing through a second set of the heat transfer devices 3200. The first working fluid 3440 flows generally along the stack in a first direction and the second working fluid 3450 flows generally along the stack in a second direction. The first direction and the second direction are generally parallel to one another. In certain embodiments, the first direction and the second direction are generally opposite to one another. In the example configuration of FIG. 34, the working fluids move in a counter-flow pattern, with each fluid passing through every second heat transfer device 3200. The thermoelectric elements 3410, 3420 of certain embodiments are alternately P- and N-type in the direction of current flow, such that alternate heat transfer devices 3200 are heat sources and heat sinks. The cooled working fluid 3440 is thereby progressively cooled as it passes through the heat transfer devices 3200, and the heated working fluid 3450 is thereby progressively heated as it passes through the heat transfer devices 3200.

In certain embodiments, the working fluids 3440, 3450 can flow in opposite directions, as shown schematically in FIG. 34. In certain other embodiments, the working fluids 3440, 3450 can flow in the same direction and can achieve similar improvements in performance compared to operation with the standard thermodynamic cycle. Under certain conditions, such as very small temperature differentials, efficiency can be slightly greater than that achieved with opposing flow. In certain embodiments, this geometry satisfies the basic condition of thermal isolation without the addition of extra components, and in practice, can reduce the total number of components used to achieve the intended performance characteristics.

A detailed simulation which modeled the heat transfer device 3200 schematically illustrated by FIG. 32 was used to evaluate design trade-offs and basic device performance. The parameters used in the modeling process to define the final device parameters included:

Area, thickness, and number of the thermoelectric elements;
Number of thermally isolated segments in the direction of flow;
Shell thickness, length, width, and construction material of the heat transfer device;
Fin thickness, length, width, spacing, and construction material of the heat transfer device;
Number of parallel thermoelectric segments;
Thickness and material properties of braze joints of the heat transfer device;
Thickness and material properties of solder layers; and
Electrical and thermal interfacial properties of the thermoelectric electrodes.

The first four parameters listed above (except construction materials) were simultaneously optimized to yield the design parameters described below. Constraints were placed on the material thicknesses and spacing parameters to assure manufacturability. Liquid flow rates and temperature changes were fixed, and hence, were constraints applied during the optimization procedure to optimize the coefficient of performance (COP). Outputs of the simulations included: operating current and voltage, liquid pressure drops, number of thermoelectric elements, volume of thermoelectric material, and device weight and volume (excluding: manifolds, electrical and mechanical interface components, external insulation, and mounting brackets).

The example breadboard subassembly 3300 shown in FIG. 33 was constructed in accordance with the model outputs for the optimized design. The example subassembly 3300 is 87 mm by 39 mm by 15 mm. Each thermoelectric section sandwiched between two heat transfer devices 3200 has four thermoelectric elements, each 4 mm by 3 mm in cross-sectional area and a thickness of 0.6 mm in the direction of current flow. The four thermoelectric elements are electrically in parallel with one another between adjacent heat transfer devices 3200. For performance verification tests, water was used as the working fluid. The uniformity of heat transfer and heat capacity properties facilitated repeatable measurement of flow rates and the inlet and outlet temperatures. Thermal heat exchange with the environment and other sources of experimental inaccuracies were addressed and minimized. Test results were analyzed for accuracy by computing performance using two independent computational methods for the power input to the device, $Q_{in}$.

Method 1: $Q_{in}=Q_{heated}-Q_{cooled}$, and

Method 2: $Q_{in}=IV$, where the heated side heat flux $Q_{heated}=Fm_{heated}*Cp*DT_{heated}$ and the cooled side heat flux $Q_{cooled}=Fm_{cooled}*Cp*DT_{cooled}$. Flow rates are $Fm_{heated}$ and $Fm_{cooled}$, and corresponding temperature changes between the inlets and outlets are $DT_{heated}$ and $DT_{cooled}$. The current through the subassembly 3300 is I, and the voltage across the subassembly 3300 is V. Results for $Q_{in}$, computed by both methods, were compared.

Figure 35:
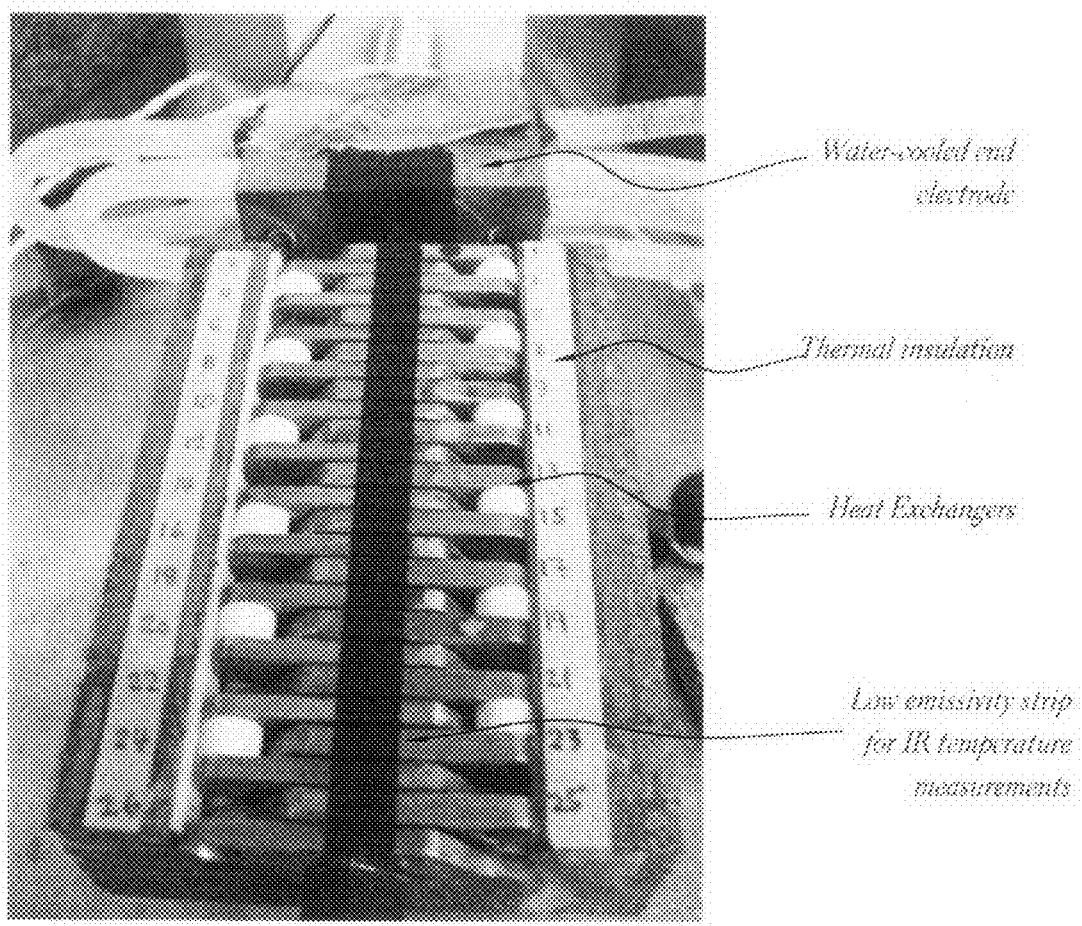
FIG. 35 illustrates an example subassembly mounted in a test fixture.

Test methodologies were developed so that the test values as measured by the two methods were within at least 5% of one another. The subassembly 3300 was mounted in a test fixture as shown in FIG. 35. The subassembly 3300 was mounted between two electrodes maintained at the inlet water temperature. Interfacial electrical and thermal losses were minimized by using liquid metal (GaInSn) external electrical interfaces to simulate solder (PbSn) electrical connection of an example complete system. The subassembly 3300 was placed in a foam insulation structure to reduce heat exchange with ambient.

Figure 36:
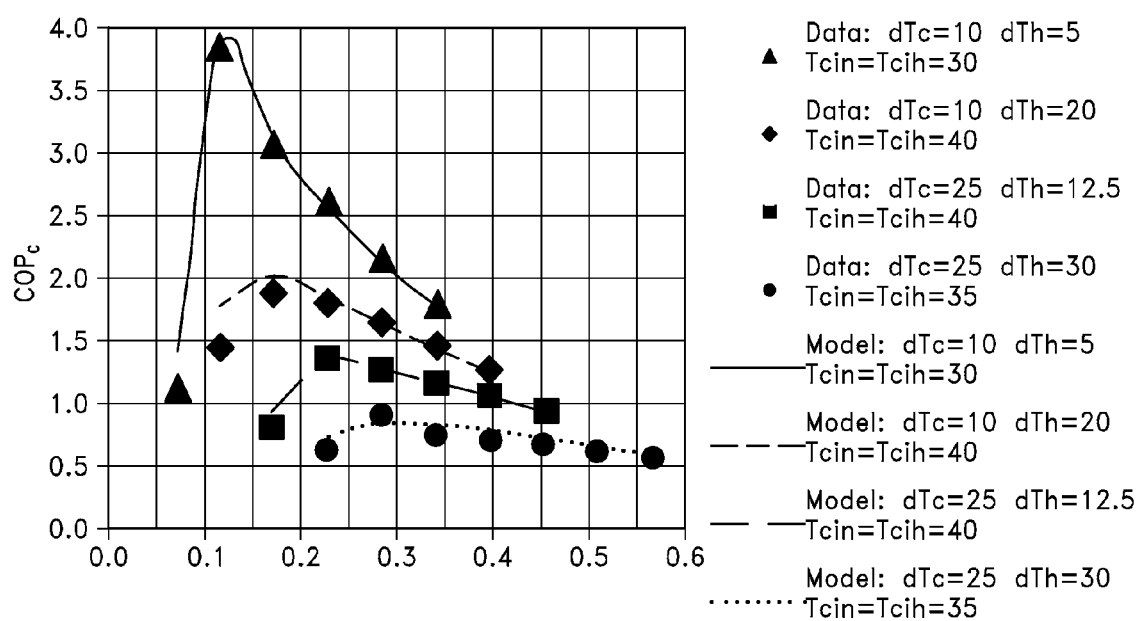
FIG. 36 shows a comparison of the measured performance results of the testing of the subassembly of FIG. 33 with simulated model results.

FIG. 36 shows a comparison of the measured performance results of the testing of the subassembly 3300 with simulated model results. These results show good correlation over a broad range of operating parameters. Accuracy of the model results were within 4% for operating conditions at and to the right (higher currents) of the point of peak COP for all of the temperature differentials tested. Test points to the left of the peak COP have not been included in the accuracy analysis. Such operating conditions are not typically of interest since they represent operating conditions that use much bulkier and more costly devices than those operating at the same COP on the right side of the peak. In addition, the very large slopes associated with this operating regime introduce both test errors and operating instabilities.

The parameter, epsilon, is the ratio of current I to $I_{max}$, the calculated current for maximum cooling power. For the thermoelectric subassembly 3300 as tested, $I_{max}=440$ amperes. The subassembly 3300 was tested at input currents from 30 to 150 amperes. Heated side to cooled side outlet temperature differentials ranged from 15° C. to 55° C. Input electrical power to the subassembly 3300 varied from 4.89 to 87.49 watts.

Figure 37:
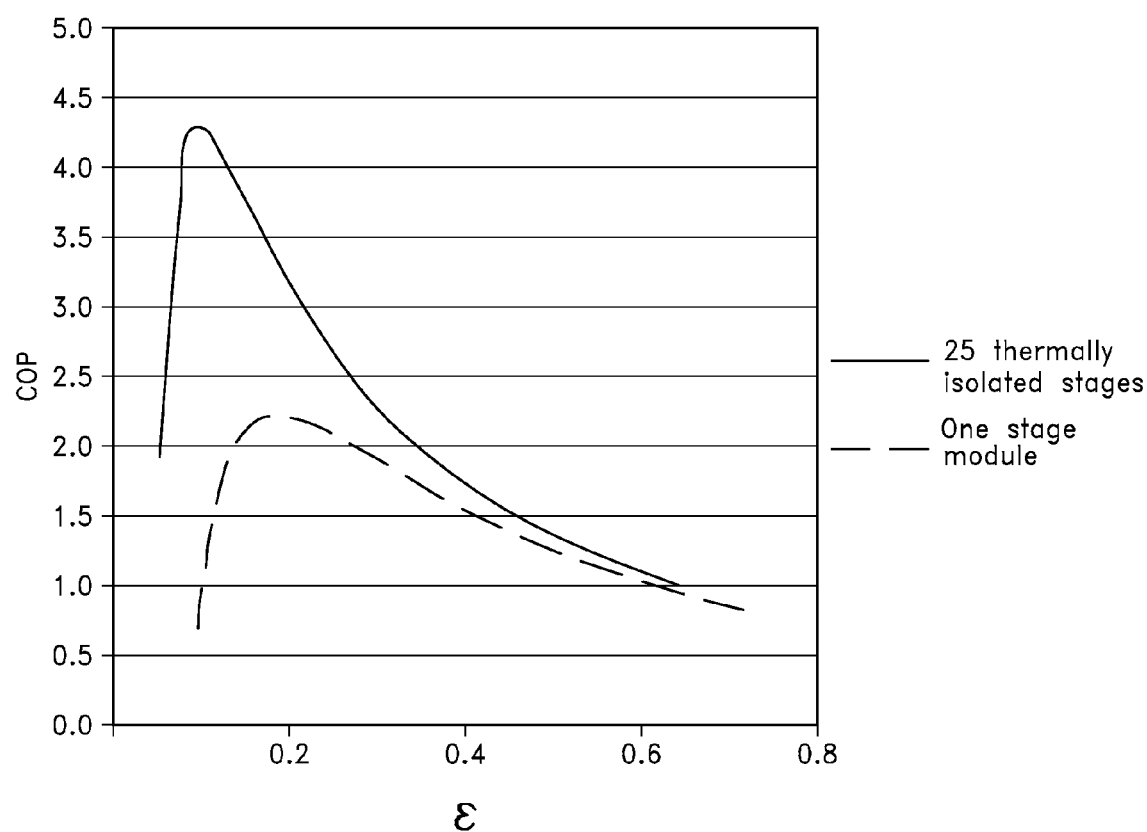
FIG. 37 illustrates a comparison of the COP for the subassembly of FIG. 33 at $\Delta T_c = 10°$ C. and $\Delta T_h = 5°$ C. (the uppermost curve in FIG. 36) with the performance of a conventional thermoelectric module-based design without thermal isolation.

FIG. 37 presents a comparison of the COP for the subassembly 3300 at $\Delta T_c=10°$ C. and $\Delta T_h=5°$ C. (the uppermost curve in FIG. 36) with the performance of a conventional thermoelectric module-based design without thermal isolation. That conventional design has a COP of 2.25 compared with a COP of 4.30 for the configuration of FIG. 33, resulting in an improvement of about 91%. The percentage improvement increases for higher temperature differentials, and slightly decreases for lower temperature differentials.

Based on the calculated results for standard TE module systems and the stack design, comparisons of sizes, weights, columns and power of the standard thermoelectric module construction and the example subassembly 3300 in accordance with certain embodiments described herein are presented in Table 1. As shown in Table 1, in addition to the COP (efficiency) improvements of about 91%, the subassembly 3300 exhibits substantial volume, weight, and cost reductions compared to standard thermoelectric module designs. Thermoelectric subassembly volume and weight are reduced about 15% and 70%, respectively; thermoelectric material usage, and hence, material cost, is about one-fourth, and specific power increased by about a factor of 3.3.

TABLE 1

| Parameter | Standard Design | Subassembly 3300 |
|---|---|---|
| Thermal cooling power at $\Delta T_c = 10°$ C.; $\Delta T_h = 5°$ C. (watts) | 65.10 | 65.10 |
| Thermoelectric material weight (grams) | 48.37 | 11.34 |
| Heat transfer device weight (grams) | 290.0 | 129.4 |
| Weight of other materials (shunts, substrates, sealants, wiring) (grams) | 146.9 | 6.1 |
| Total subassembly weight (grams) | 485.3 | 146.8 |
| Volume (liters) | 0.0616 | 0.0521 |
| Power density (watts/liter) | 1057 | 1250 |
| Specific cooling power (watts/gram) | 0.134 | 0.443 |
| Peak efficiency (COP) | 2.25 | 4.20 |

Figure 38:
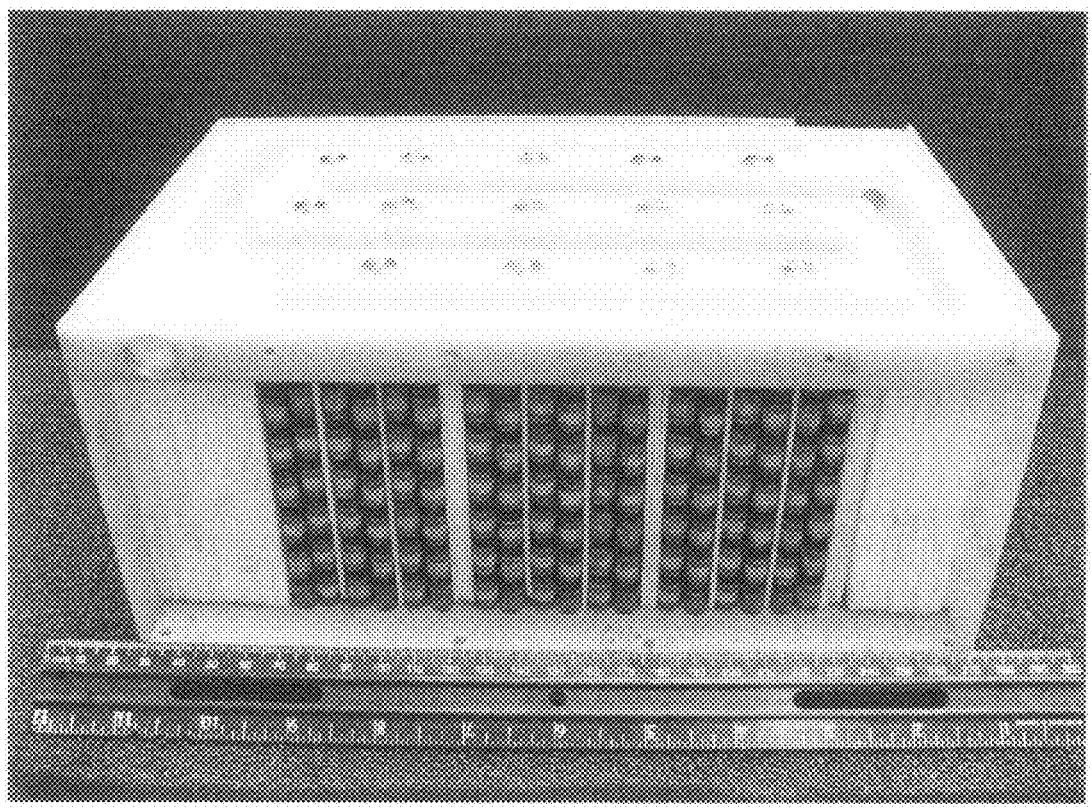
FIG. 38 shows a thermoelectric device with a plurality of subassemblies (front cover and insulation removed for illustration).

Based on this level of design verification, a design of a full-size device was completed and the device is shown in FIG. 38 with a front cover and insulation removed. In this device, the thermoelectric elements were changed to three elements per layer, each 12 mm by 3 mm in cross-sectional area and 0.6 mm thick, thereby increasing the area of each thermoelectric layer. This was done to meet the need for a particular application in which the temperature differential was lower, by advantageously using more thermoelectric area per stage. As shown by comparing the results of FIGS. 36 and 37, the device was predicted to have slightly higher efficiency than the thermoelectric subassembly 3300 under the specific operating condition plotted. The device was constructed in a 9×3 array with 1.5 mm semi-rigid insulation between thermoelectric subassemblies, so that the core thermoelectric assembly was compact. Ancillary parts were spaced apart with gaps filled with insulation, so as to allow access for thermocouples and other monitoring devices. The ancillary parts included: fluid manifolds, electrical connections between subassemblies, and springs to uniformly compress the subassemblies. No attempt was made to minimize weight or volume of the ancillary parts.

The device of FIG. 38 has the following nominal design properties:

Current: 86 amperes;

Voltage: 8.7 volts;

Thermal cooling power: 3500 watts;

Liquid flow rate: 0.16 liters/second;

Thermoelectric material weight: 306 grams;

Device volume: 1.59 liters; and

Device dry weight: 4.33 kilograms.

The thermoelectric subassemblies (see, e.g., FIG. 33) were connected in parallel for fluid flow and in series for current flow. Manifolds to direct the fluid flow also acted as top and bottom structural members. The manifolds also housed the electrical connections.

Figure 39:
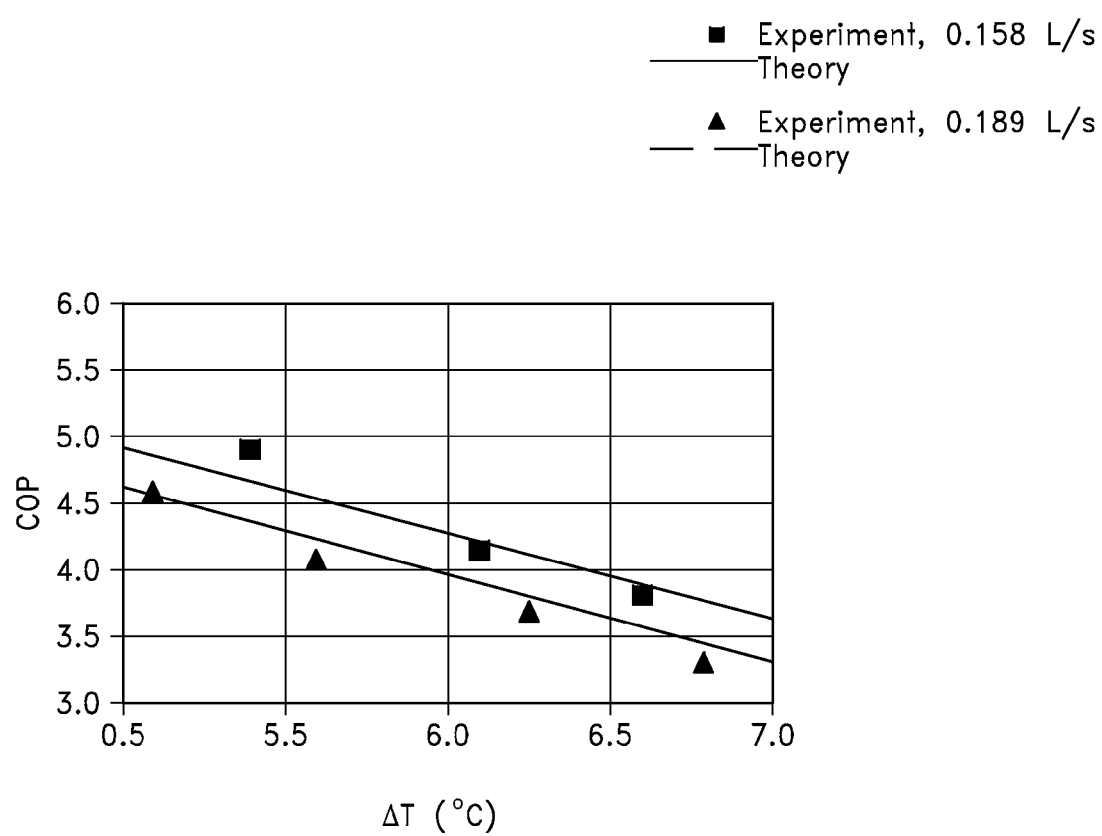
FIG. 39 shows a comparison of the measured experimental results for the device of FIG. 38 with computed model results.

The device was tested with water as the working fluid, and metered amounts of water were passed through the cooled and waste (heated) sides of the device. Current, voltage, flow rates, and inlet and outlet temperature were monitored. FIG. 39 shows a comparison of the measured experimental results with the computed model results. The experimental results are in good agreement with the predicted results, based on simulations using the design modeling tool.

Tests of the completed device of FIG. 38 show comparable accuracy to that of the example thermoelectric subassembly 3300, but testing was limited to fewer operating conditions because of power supply and working fluid flow rate capabilities of the test equipment used. Over the range of conditions tested, results did validate the model's performance perditions. Further, since the performance of the completed device and thermoelectric subassembly each agreed with the same predicted results for the subassembly, system level losses were shown to be sufficiently small so as to not invalidate the predicted performance at the system level. Hence, results for the completed device follow the predicted performance for the thermoelectric subassembly.

The design and model results show that under conditions of combined cooled and heated side temperature changes (up to 30° C.), a thermoelectric cooler compatible with certain embodiments described herein with liquid working fluid can have a high COP. In this range, and for thermal power levels between 50 and 3,500 watts, such systems are viable candidates for liquid-based cooling applications. Since multiple identical subassemblies were used to demonstrate operation at 3,500 watts, it can be expected that very similar results would be observed for devices of at least 5,000 watt thermal capacity. Further, similar performance and model accuracy is obtained for operation in heating mode. Thus, a class of cooling, heating and temperature control applications can be targets for the TE technology of certain embodiments described herein.

Applications Using Thermal Isolation in the Direction of Flow

In certain embodiments described herein, at least a portion of a single working fluid is circulated on both the heated and cooled sides of a thermoelectric system utilizing thermal isolation in the direction of flow. During the first pass on the cooled side, the working fluid is cooled, and is re-heated to somewhat above its original temperature during the return pass on the heated side. In a conventional thermoelectric device, the thermal conductivity of the substrate and the heat exchange members on which the thermoelectric circuitry is mounted tends to make the temperature rather uniform over the entire surface of the device. Certain embodiments described herein minimize the thermal conductivity in the direction of flow, then by cooling the heat transfer fluid as it flows over the first side, and then heating it again by flowing it in counter-flow on the other side, the temperature difference across any part of the thermoelectric device is advantageously made smaller, resulting in large improvements in COP, $\Delta T$, or both.

FIG. 4A schematically illustrates an example thermoelectric system 400 compatible with certain embodiments described herein. In certain embodiments, the thermoelectric system 400 comprises a plurality of thermoelectric modules 402 and a plurality of heat transfer devices 403. Each heat transfer device 403 accepts a working fluid to flow therethrough. At least some of the heat transfer devices 403 are in thermal communication with and sandwiched between at least two thermoelectric modules 402 of the plurality of thermoelectric modules 402 so as to form a stack of alternating thermoelectric modules 402 and heat transfer devices 403. The stack is arranged to provide thermal isolation along a direction of a working medium movement. A first working fluid is cooled by flowing through a first set of the heat transfer devices 403 and a second working fluid is heated by flowing through a second set of the heat transfer devices 403. FIG. 33 shows an example subassembly 3300 compatible with certain embodiments described herein.

Figure 40:
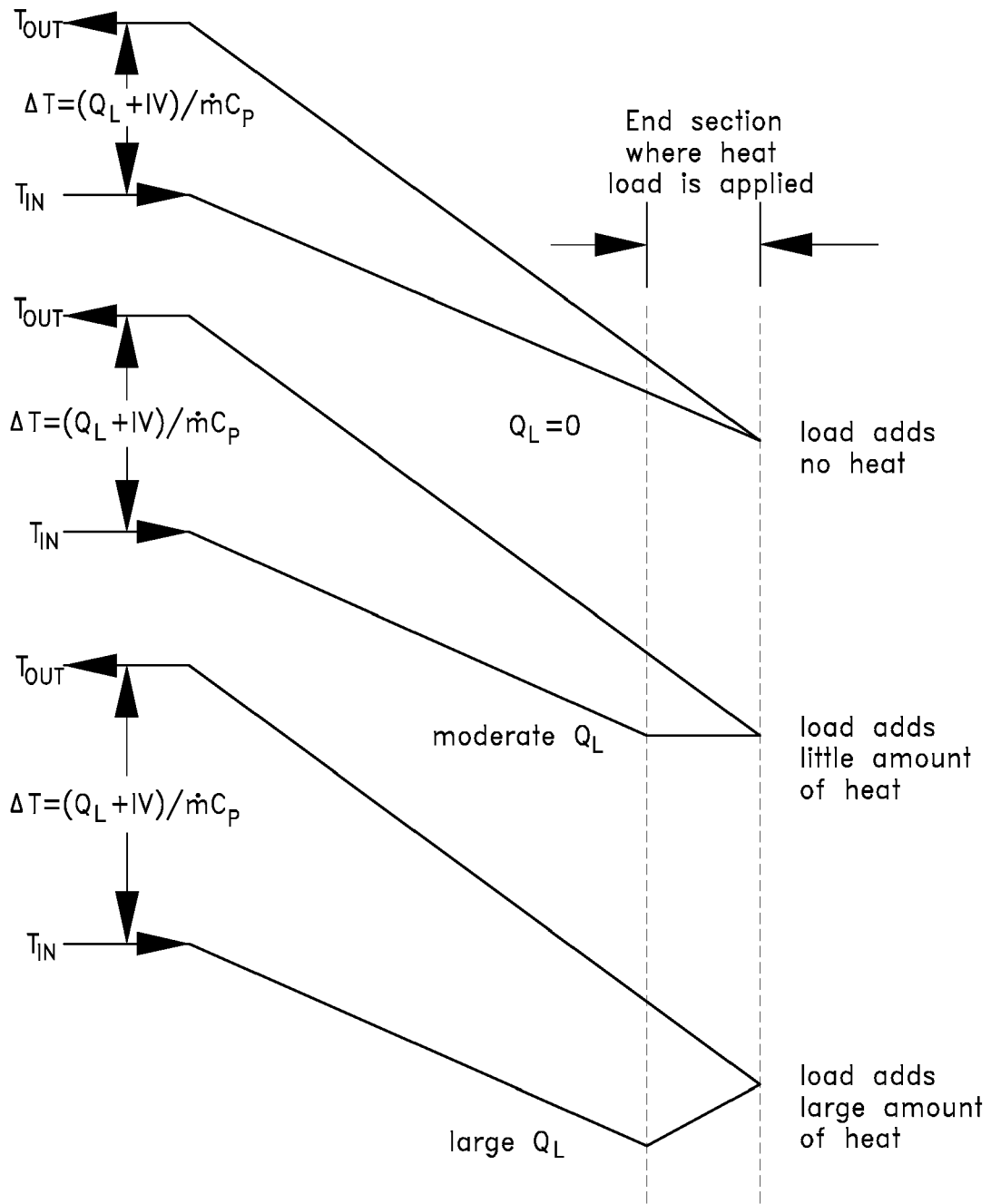
FIG. 40 schematically illustrates the temperature profiles of three thermoelectric systems as the working fluid circumnavigates the thermoelectric system.

FIG. 40 schematically illustrates the temperature profiles of three thermoelectric systems as the working fluid circumnavigates the thermoelectric system. In certain embodiments, the second working fluid comprises the first working fluid after having flowed through the first set of heat transfer devices. In certain such embodiments having a cooled load, the first working fluid receives an increase in temperature at the cold end from the load due to $Q_L$. The first working fluid is then fed back into the heated side as the second working fluid and exits at a temperature raised from the inlet temperature due to the sum of the input power, IV, and the load power $Q_L$.

In certain embodiments, the temperature at which the first working fluid is fed back into the heated side depends upon the relative sizes of the heat load and the ability of the coldest stage of the device to pump heat. The three profiles in FIG. 40 show a range of possibilities for (i) small or no heat load, (ii) moderate heat load, and (iii) large heat load. The first working fluid is introduced to the cooled side at an inlet temperature $T_{IN}$ and is progressively cooled as it flows through along the cooled side to an end section where a heat load is applied. The first working fluid is heated by the heat load and is introduced as the second working fluid to the heated side and is progressively heated further as it flows along the heated side to the outlet. The outlet temperature $T_{OUT}$ of the second working fluid is higher than the inlet temperature $T_{IN}$ of the first working fluid.

Figure 41:
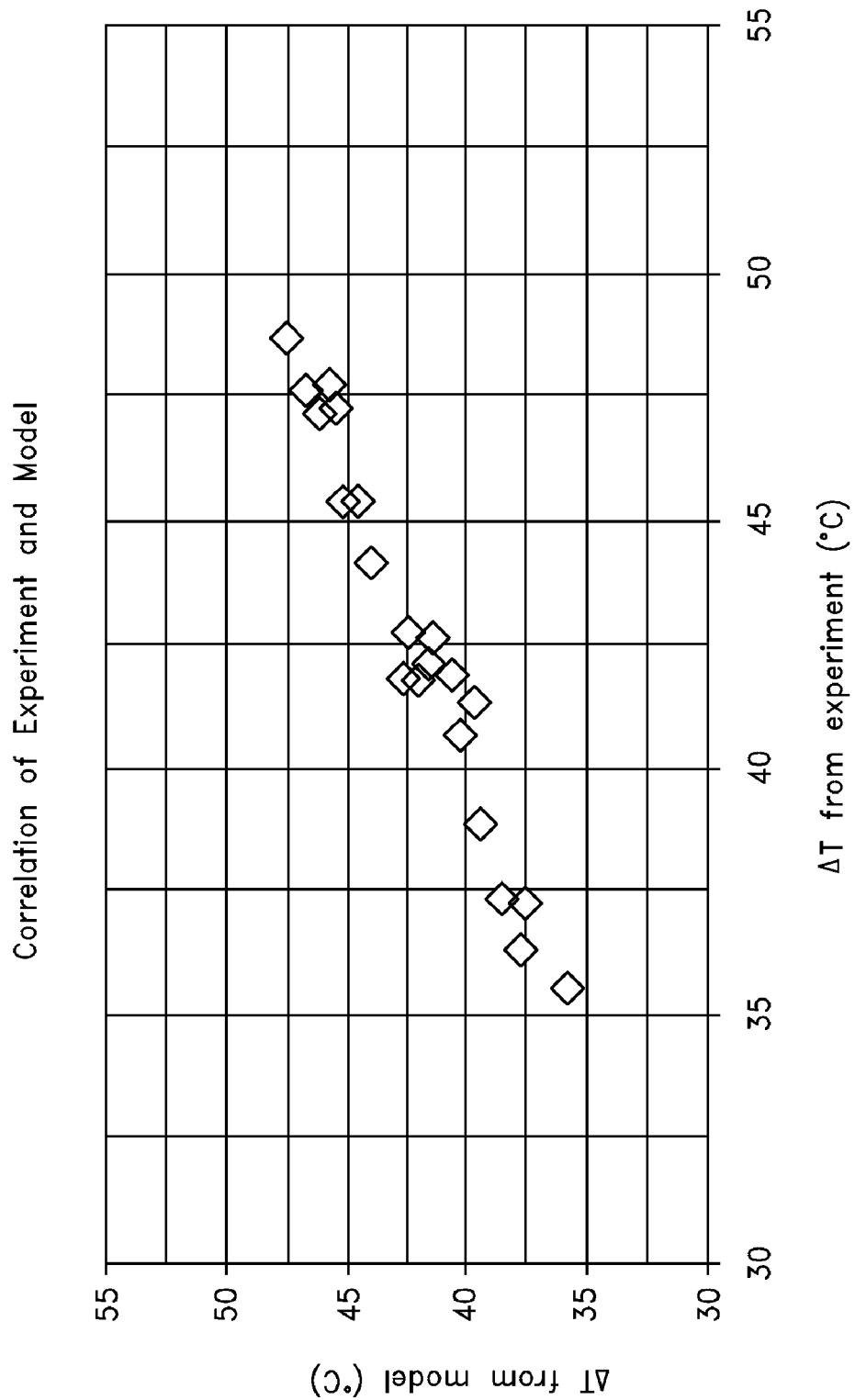
FIG. 41 shows the correlation between the measured temperature increase ($\Delta T = T_{OUT} - T_{IN}$) and the calculated temperature increase from the model.

A computer model for liquid-to-liquid thermoelectric devices was used to compare the performance of a conventional thermoelectric device to a device utilizing thermal isolation and the same working fluid on both sides of the device in accordance with certain embodiments described herein. FIG. 41 shows that the measured temperature increase ($\Delta T = T_{OUT} - T_{IN}$) correlates well with the calculated temperature increase from the model.

Figure 42:
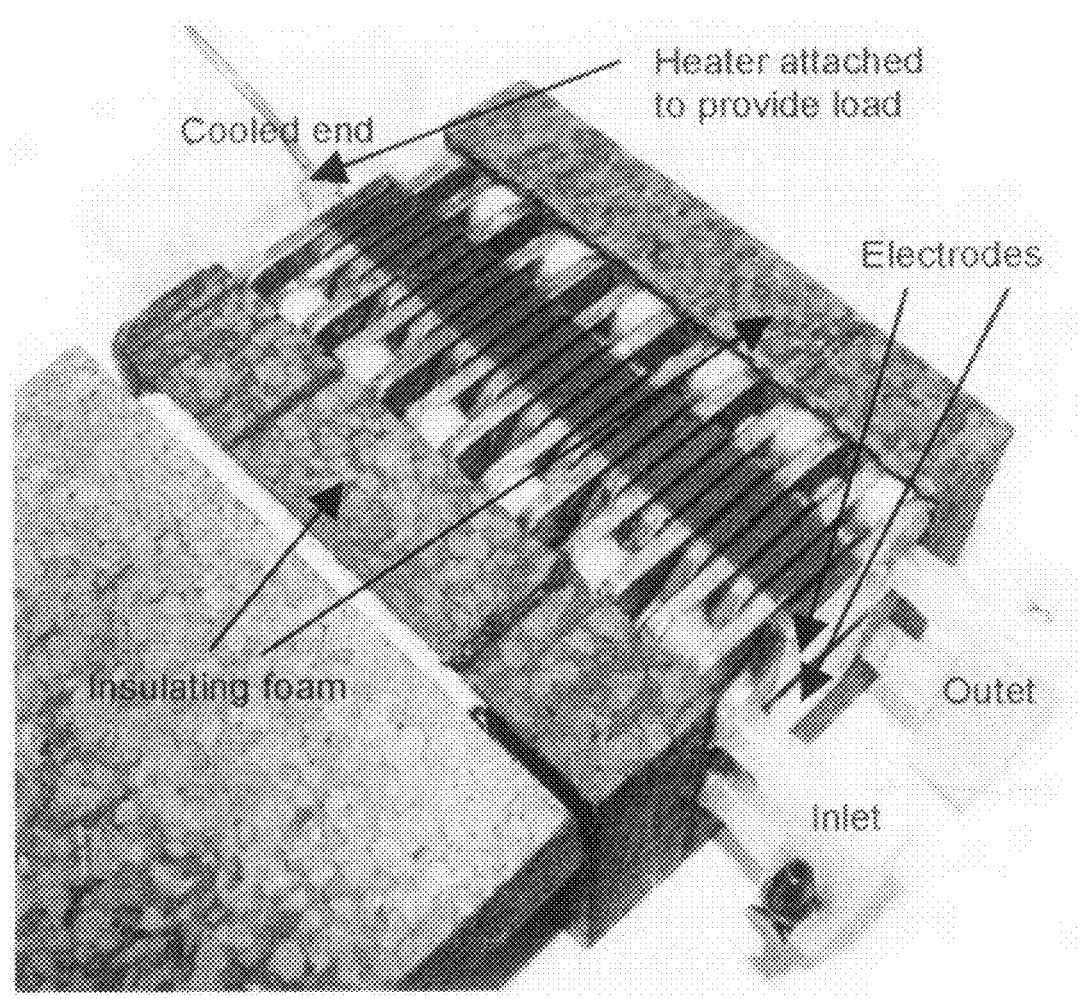
FIG. 42 shows an example thermoelectric system used to validate the model under various conditions.

FIG. 42 shows an example thermoelectric system 4200 used to validate the model under various conditions. The thermoelectric system 4200 comprises an inlet 4210 in fluidic communication with the cooled side of the thermoelectric system 4200, a heater 4220 attached to the cooled end 4230 to provide a heat load, an outlet 4240 in fluidic communication with the heated side of the thermoelectric system 4200, and a pair of electrodes 4250 to apply a current to the thermoelectric elements of the thermoelectric system 4200. Insulating foam is used to insulate the thermoelectric system 4200 from ambient.

Figure 43:
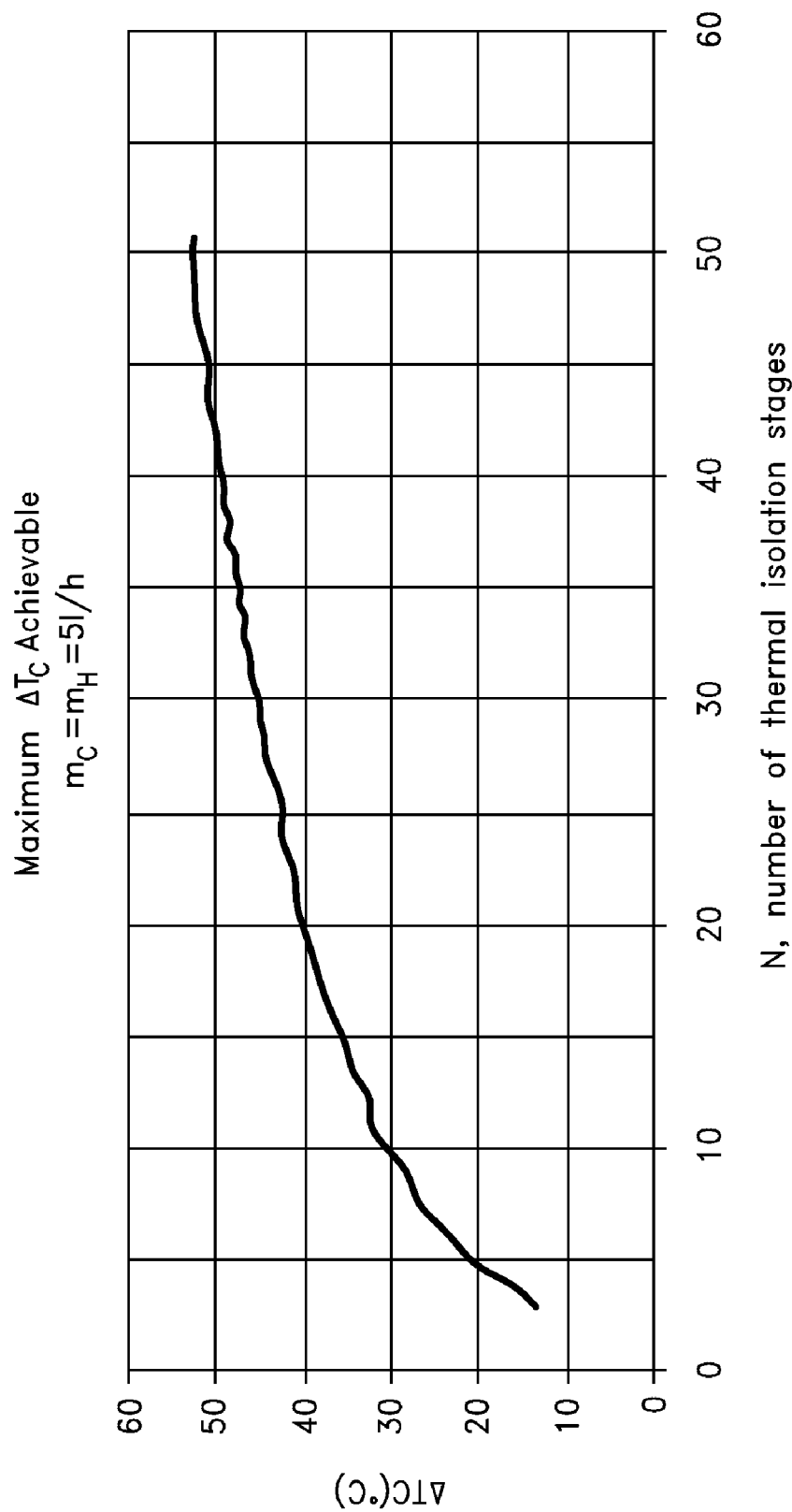
FIG. 43 shows the maximum $\Delta T_C$ achievable for various numbers of thermal isolation stages.
Figure 44:
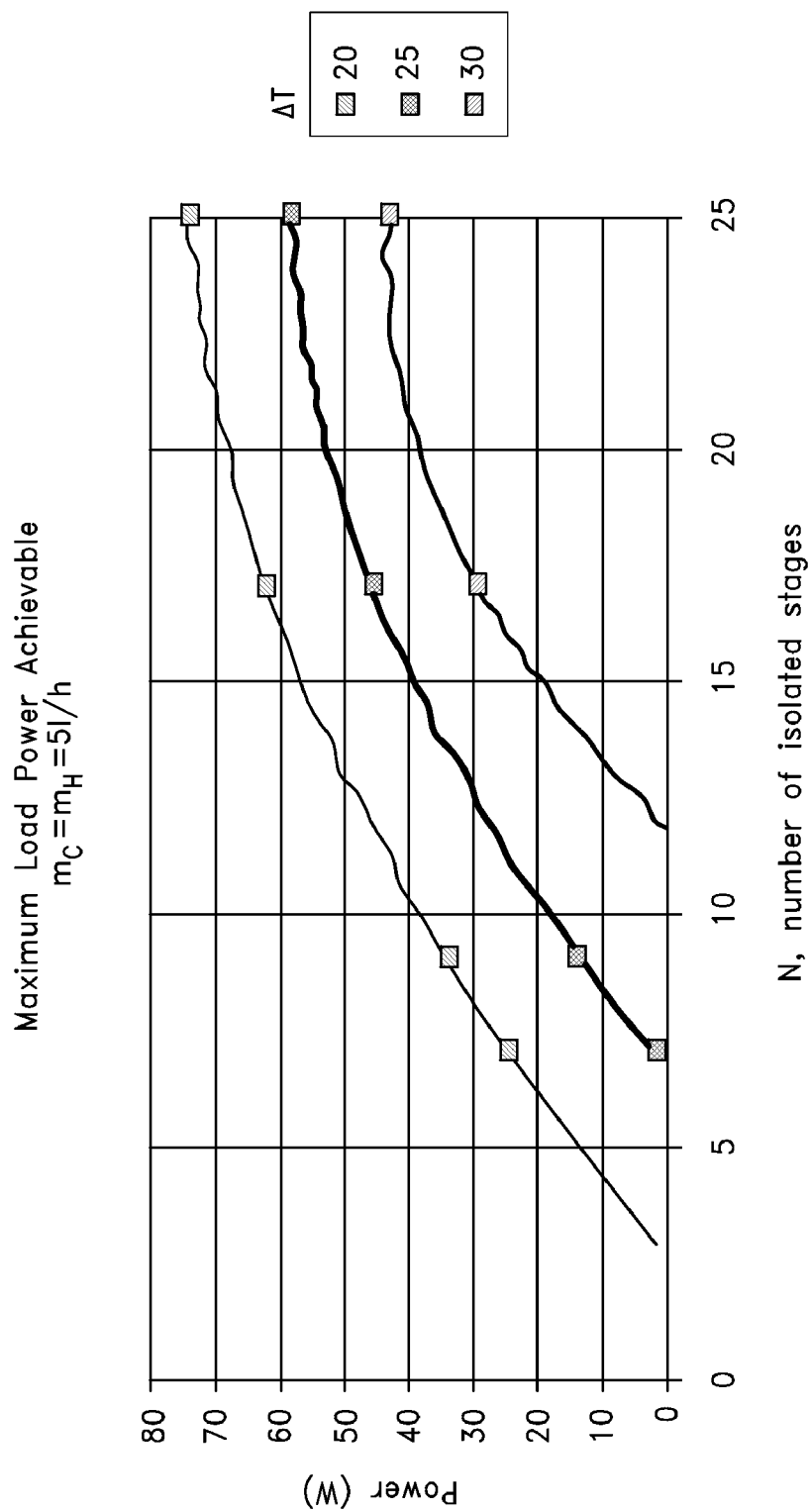
FIG. 44 shows the effect of thermal isolation on maximum power.

FIG. 43 shows the effect of thermal isolation on maximum $\Delta T_C$ by plotting the maximum $\Delta T_C$ achievable for various numbers of thermal isolation stages. FIG. 44 shows the effect of thermal isolation on maximum power. For the purposes of these comparisons, the parameter N is used for the number of stages of thermal isolation present in the thermoelectric system. A conventional thermoelectric system with no thermal isolation is denoted by N=1.

Figure 45:
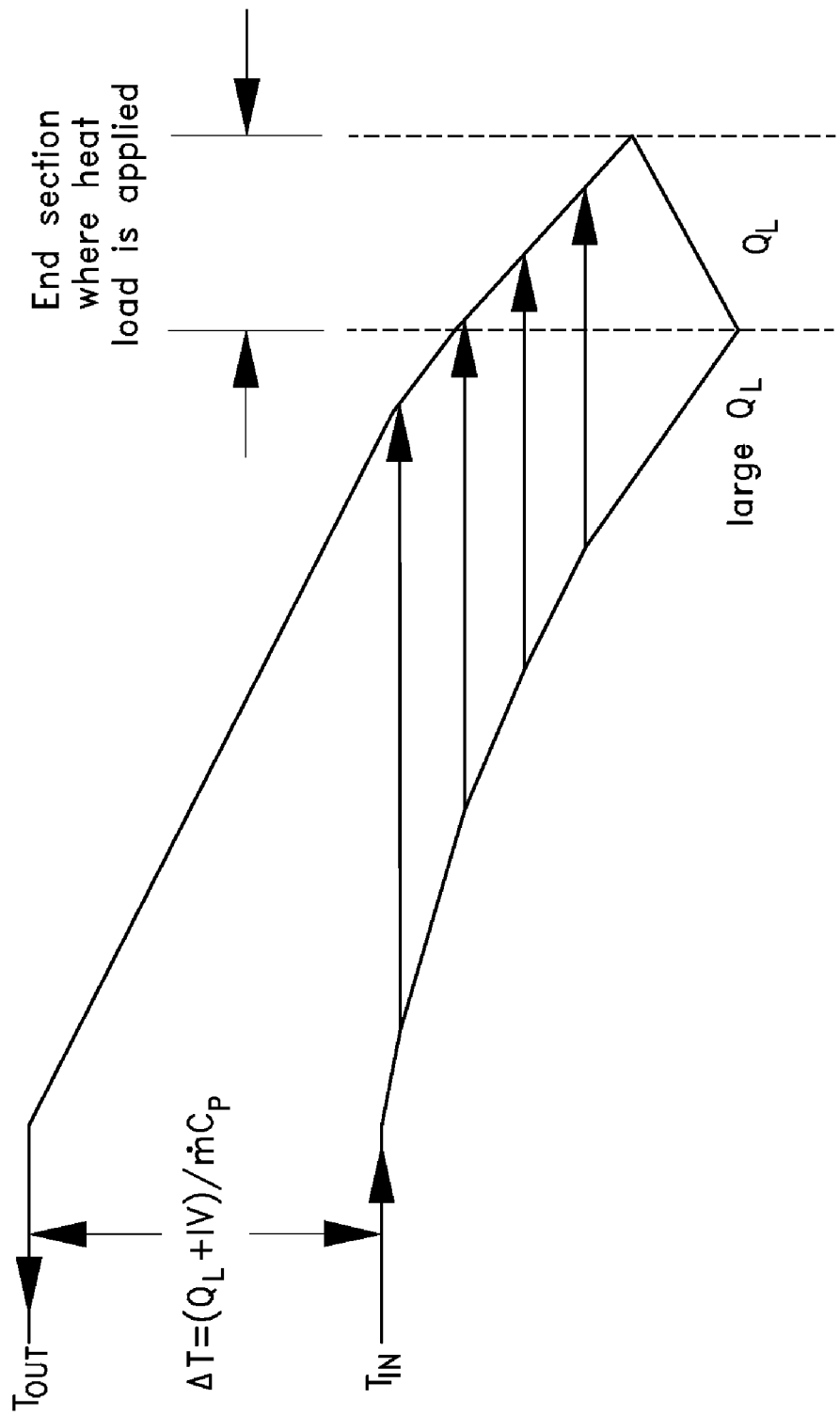
FIG. 45 schematically illustrates a configuration utilizing the cross connection of fluids compatible with certain embodiments described herein.

Improvements can be made in both the $\Delta T_C$ and the load power by additional complicating the redirection of flow. In certain embodiments, the second working fluid comprises one or more portions of the first working fluid after having flowed through one or more portions of the first set of heat transfer devices. In certain such embodiments, the one or more portions of the first working fluid comprise a plurality of portions of the first working fluid after having flowed through a plurality of portions of the first set of heat transfer devices. FIG. 45 schematically illustrates a configuration utilizing the cross connection of fluids compatible with certain embodiments described herein. Multiple portions of the first working fluid are diverted from the cooled side to the second working fluid on the heated side at several points along the thermally isolated stack. This configuration results in high flows at the inlet and outlet and low flows at the cold end. The smaller temperature difference across the high flow end is the factor improving performance.

Figure 46:
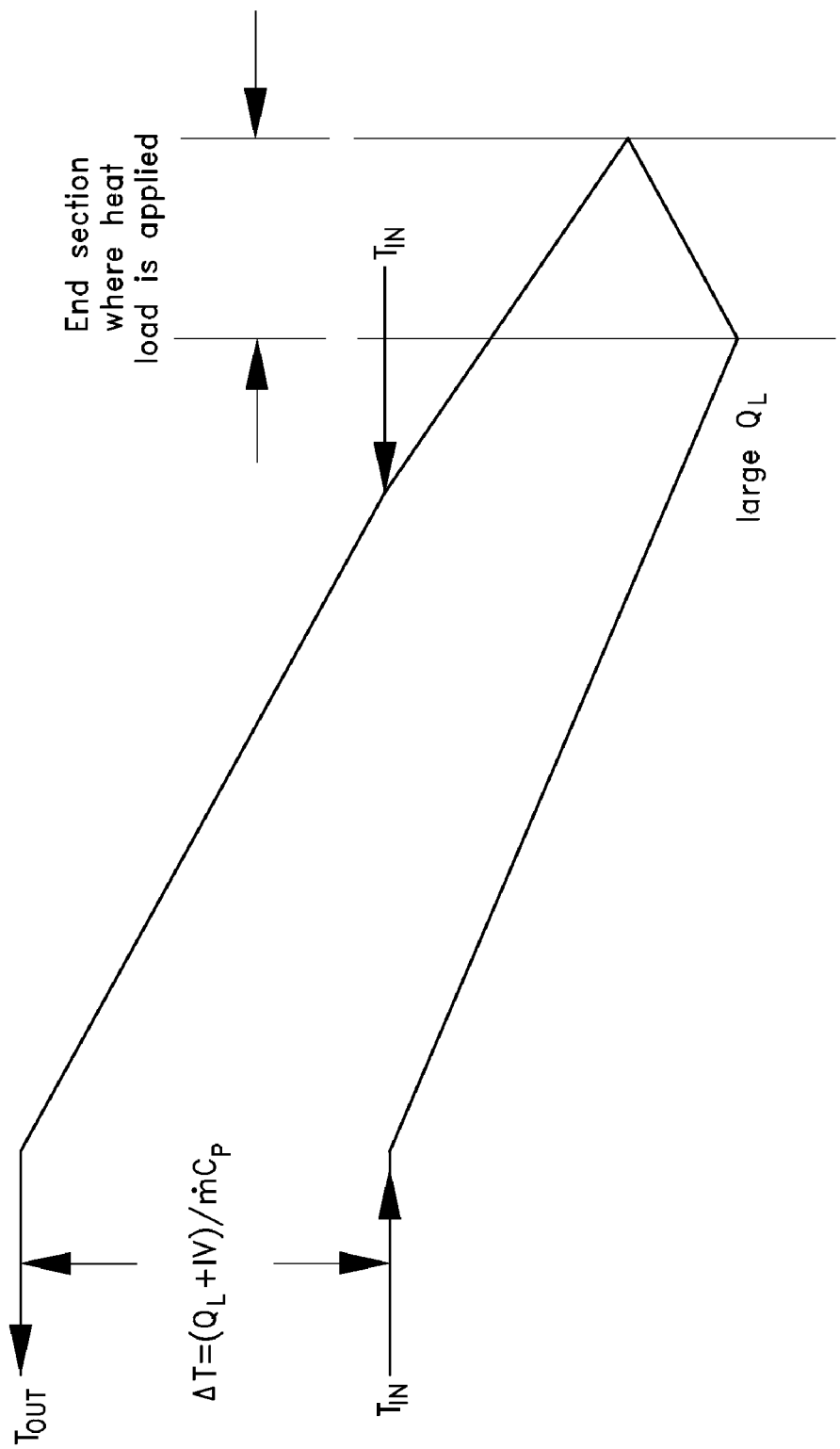
FIG. 46 schematically illustrates the effect of introduction of moderate temperature fluid into the heated side where its temperature matches that of the original flow in accordance with certain embodiments described herein.

In certain embodiments, the second working fluid comprises a portion of the first working fluid that does not flow through at least a portion of the first set of heat transfer devices. FIG. 46 schematically illustrates the effect of introduction of moderate temperature fluid into the heated side where its temperature matches that of the original flow in accordance with certain embodiments described herein. This introduction of a moderate temperature first working fluid into the second working fluid effectively removes the restriction of equal flows. The benefit of the use of the cooled flow in certain embodiments is to make use of the cool fluid to further enhance the performance above that of one with simply independent flows.

In certain embodiments, the thermoelectric system provides increased cooling capacity at large temperature differential from ambient, in a way that is much more efficient than that achieved with the conventional cascade geometry. In the cascade, the waste heat from each colder device must be passed through all of the higher temperature supporting devices, thus placing additional heat removal burdens on them over and above the heat removal from the cold surface of the coldest one. In certain embodiments described herein, the wast heat does not accumulate as it passes from one set of thermoelectric elements to the next. Since the use of the same fluid on both sides of the thermoelectric system removes the degree of freedom associated with differing flow rates, there is advantageously an external reason for applying this restriction. In certain embodiments, this reason can be due to the nature of the working fluid, the pumping means, the efficiency or cost of pumping, or the nature of the necessary containment of the fluid, as well as others.

Figure 47:
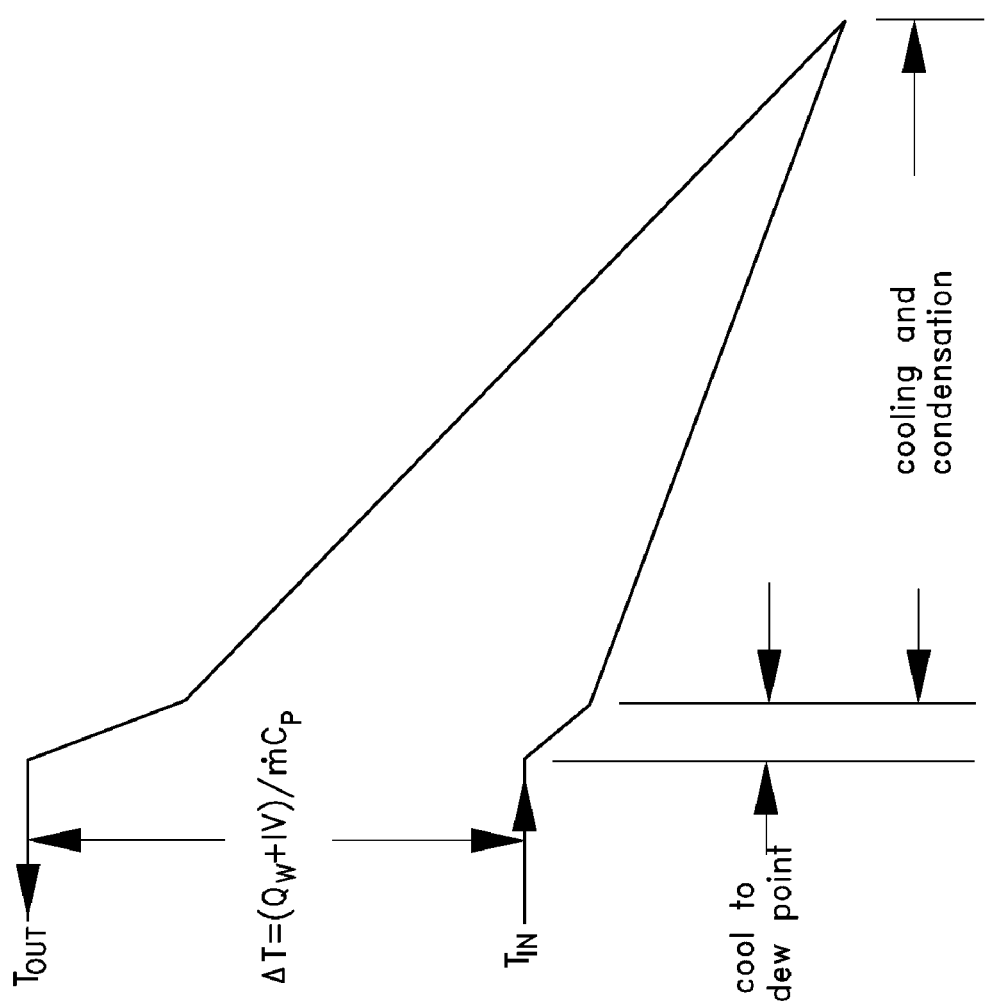
FIG. 47 shows an example temperature profile for an example thermoelectric system for removing vapor from a gas (e.g., dehumidification of air) in accordance with certain embodiments described herein.

FIG. 47 shows an example temperature profile for an example thermoelectric system for removing vapor from a gas (e.g., dehumidification of air) in accordance with certain embodiments described herein. FIG. 47 illustrates an example in which a first working fluid comprises vapor at a temperature above a condensation point of the vapor. The first working fluid is cooled to a temperature below the condensation point by flowing through at least a portion of the first set of heat transfer devices (e.g., the cooled side of the thermoelectric system) such that at least a portion of the vapor condenses to a liquid. The second working fluid comprises the first working fluid without the at least a portion of the vapor.

In an illustrative example, initially, the first working fluid of humid air is introduced to the inlet of the thermoelectric system at a temperature $T_{IN}$. As the humid air flows through the cooled side of the thermoelectric system, it is cooled to the condensation point or dew point of the water vapor to be removed. Once the condensation point is reached, the humidity is then 100% and beginning there, the thermoelectric system not only advantageously cools the air, but also removes enough heat to condense at least a portion of the water vapor out from the air. At the lowest temperature, the desired concentration of water vapor is achieved and the now dehumidified air (without a portion of the water vapor) is ducted to the heated side of the thermoelectric system to return to a higher temperature (e.g., warm up as less humid air). The exit air temperature $T_{OUT}$ is elevated above the inlet air temperature $T_{IN}$, for example to provide the warmth needed for typical defogging and demisting applications. Other gases and vapors are also compatible with certain embodiments described herein.

Figure 48:
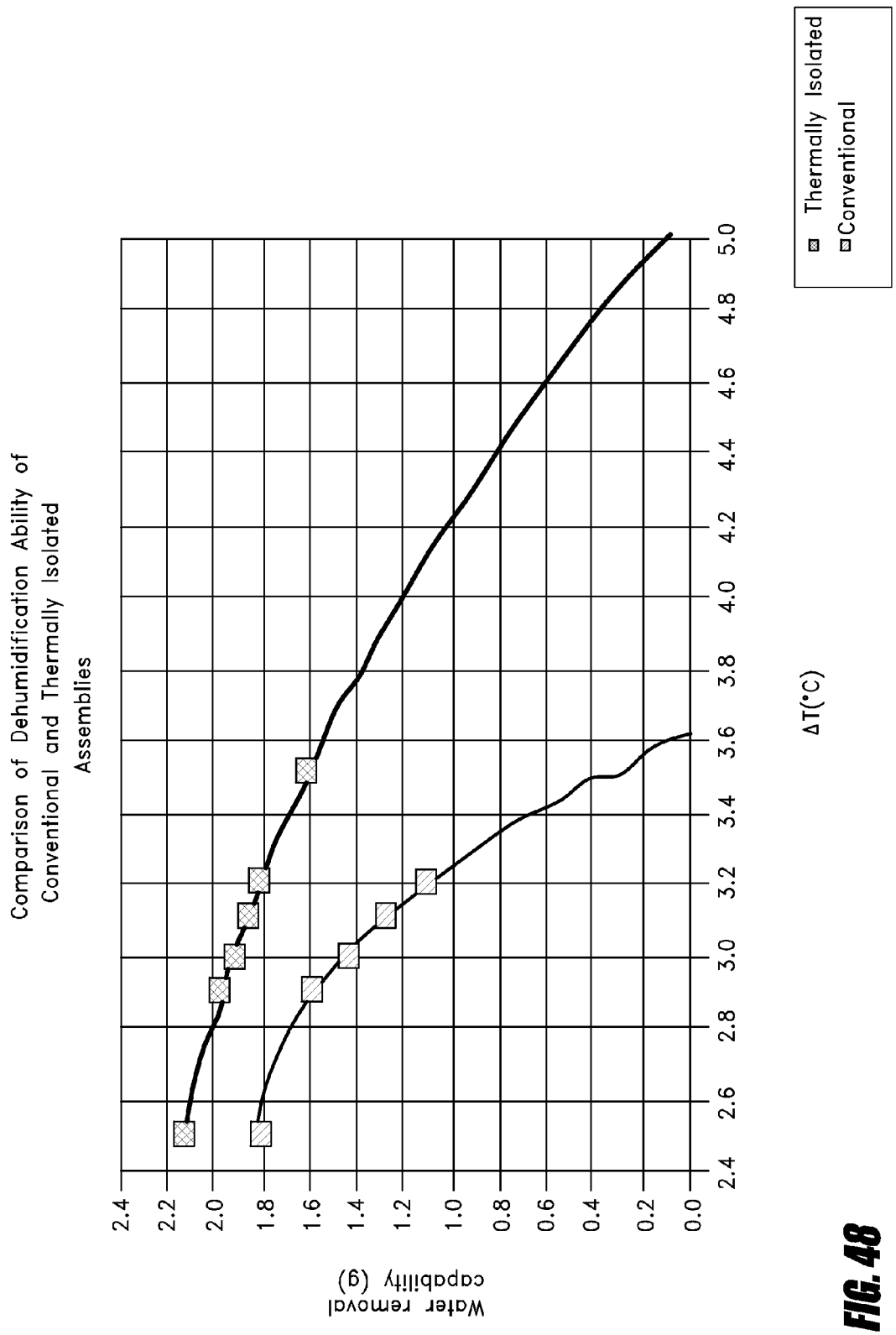
FIG. 48 shows the relative abilities of a conventional thermoelectric system and of a thermoelectric system utilizing thermal isolation to remove water from the air stream.

Using a mathematical model for air-to-air thermoelectric systems, this dehumidifying thermoelectric system was simulated as both a conventional thermoelectric system and as one with thermal isolation. A particular scenario was chosen as an example of the analysis, namely to determine the reduction in the relative humidity from 90% in 40° C. air. Current and flow rate were varied to optimize the power available to cool and condense the moisture. Other than thermal isolation (N=7), the thermoelectric systems simulated were identical and were the equivalent of 40 mm by 40 mm modules with 127 couples. The number of stages of thermal isolation was a modest N=7. FIG. 48 shows the relative abilities of a conventional thermoelectric system and of a thermoelectric system utilizing thermal isolation to remove water from the air stream.

Figure 49:
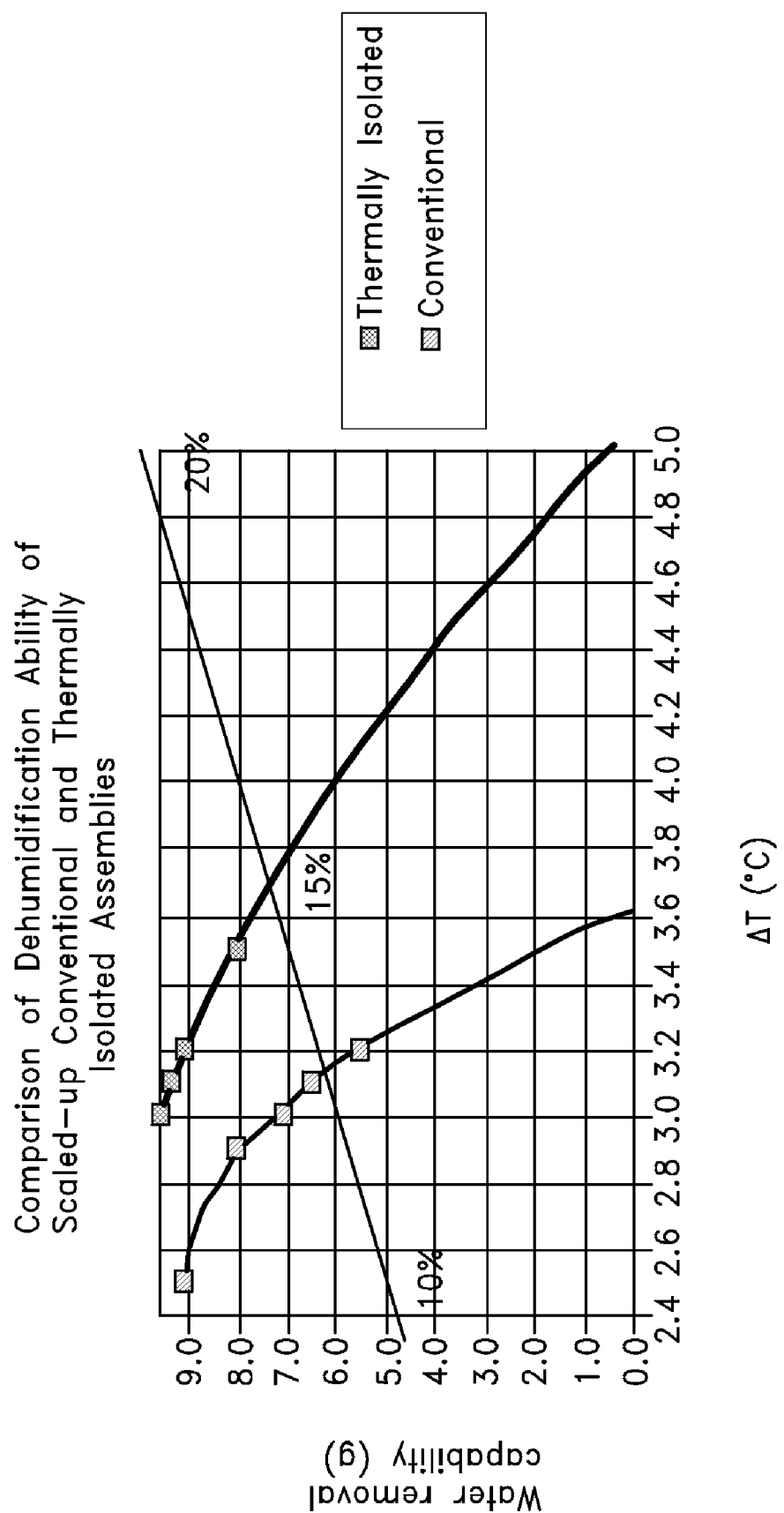
FIG. 49 shows a comparison of dehumidification ability of a scaled-up conventional thermoelectric system and a scaled-up thermally isolated thermoelectric system.

At 40° C., it is advantageous in certain embodiments to condense about ½ gram of water per cubic meter per 1% reduction in relative humidity. Doing so reduces the dew point by about ¼ ° C. For the modules simulated in FIG. 48, it is apparent that by themselves, they have too little capability. However, as FIG. 49 shows, scaling them up by a factor of 5 in their capability (and size) results in the ability of the thermally isolated thermoelectric system to meaningfully reduce humidity. The straight line of FIG. 49 represents the relationship mentioned above between water removal and dew point reduction. The range displayed covers reductions of 10 to 20% relative humidity.

It should also be noted that the disclosures in this patent present designs, configurations and applications of this invention. While the discussion above is analyzed in terms of the properties in cooling, similar results hold for heating and power generation, and lead to similar conclusions. Some systems, in particular those of the thermionic and heterostructure type, may be intrinsically of high power density, in which case this invention can be more suitable to accommodate the properties and possible high power densities of such systems.

Although several examples have been illustrated, and discussed above, the descriptions are merely illustrative of broad concepts of the inventions, which are set forth in the attached claims. In the claims, all terms are attributed to their ordinary and accustomed meaning and the description above does not restrict the terms to any special or specifically defined means unless specifically articulated.

What is claimed is:

1. A thermoelectric system comprising:
   a first plurality of thermoelectric elements;
   a second plurality of thermoelectric elements; and
   a plurality of heat transfer devices, each heat transfer device having a first side in thermal communication with two or more thermoelectric elements of the first plurality of thermoelectric elements and a second side in thermal communication with one or more thermoelectric elements of the second plurality of thermoelectric elements, so as to form a stack of thermoelectric elements and heat transfer devices, wherein the two or more thermoelectric elements of the first plurality of thermoelectric elements are in parallel electrical communication with one another, and the two or more thermoelectric elements of the first plurality of thermoelectric elements are in series electrical communication with the one or more thermoelectric elements of the second plurality of thermoelectric elements.

2. The thermoelectric system of claim 1, wherein the one or more thermoelectric elements of the second plurality of thermoelectric elements comprises two or more thermoelectric elements in parallel electrical communication with one another.

3. The thermoelectric system of claim 1, wherein the thermoelectric elements of the first plurality of thermoelectric elements are P-type.

4. The thermoelectric system of claim 3, wherein the thermoelectric elements of the second plurality of thermoelectric elements are N-type.

5. The thermoelectric system of claim 1, wherein each heat transfer device thermally isolates the two or more thermoelectric elements of the first plurality of thermoelectric elements from the two or more thermoelectric elements of the second plurality of thermoelectric elements.

6. The thermoelectric system of claim 1, wherein the stack is arranged to provide thermal isolation in the direction of a working medium movement.

7. The thermoelectric system of claim 1, wherein each heat transfer device accepts a working fluid to flow therethrough in a general direction of the heat transfer device.

8. The thermoelectric system of claim 7, wherein the general direction of two or more heat transfer devices of the plurality of heat transfer devices are substantially parallel to one another.

9. The thermoelectric system of claim 8, wherein the general direction of at least two heat transfer devices of the plurality of heat transfer devices are substantially opposite to one another.

10. The thermoelectric system of claim 7, wherein a first working fluid is cooled by flowing through a first set of the heat transfer devices and a second working fluid is heated by flowing through a second set of the heat transfer devices.

11. The thermoelectric system of claim 10, wherein the first working fluid flows generally along the stack in a first direction and the second working fluid flows generally along the stack in a second direction, the first direction generally parallel to the second direction.

12. The thermoelectric system of claim 11, wherein the first direction is generally opposite to the second direction.

13. The thermoelectric system of claim 1, wherein each heat transfer device comprises a housing and one or more heat exchanger elements inside the housing.

14. A thermoelectric system comprising:
a plurality of thermoelectric modules; and
a plurality of heat transfer devices, each heat transfer device comprising a housing and one or more heat exchanger elements inside the housing, each heat transfer device accepting a working fluid to flow therethrough, at least some of the heat transfer devices in thermal communication with and sandwiched between at least two thermoelectric modules of the plurality of thermoelectric modules so as to form a stack of alternating thermoelectric modules and heat transfer devices arranged to provide thermal isolation along a direction of a working medium movement.

15. The thermoelectric system of claim 14, wherein the housing comprises copper and the one or more heat exchanger elements comprise copper fins.

16. The thermoelectric system of claim 14, wherein the housing and the one or more heat exchanger elements are unitary in construction.

17. The thermoelectric system of claim 14, wherein the housing comprises a first surface and a second surface generally parallel to the first surface, the first surface in thermal communication and in electrical communication with at least a first thermoelectric module of the plurality of thermoelectric modules, the second surface in thermal communication and in electrical communication with at least a second thermoelectric module of the plurality of thermoelectric modules.

18. The thermoelectric system of claim 17, wherein the first thermoelectric module is soldered to the first surface of a first housing and the second thermoelectric module is soldered to the second surface of the first housing.

19. The thermoelectric system of claim 18, wherein the second thermoelectric module is soldered to the first surface of a second housing.

20. The thermoelectric system of claim 17, wherein each heat transfer device comprises an inlet through which the working fluid enters the heat transfer device and an outlet through which the working fluid exits the heat transfer device.

21. The thermoelectric system of claim 20, wherein the working fluid flows through the inlet in a direction generally perpendicular to the first surface and flows through the outlet in a direction generally perpendicular to the second surface.

22. A thermoelectric system comprising:
a plurality of thermoelectric modules; and
a plurality of heat transfer devices, each heat transfer device accepting a working fluid to flow therethrough, at least some of the heat transfer devices in thermal communication with and sandwiched between at least two thermoelectric modules of the plurality of thermoelectric modules so as to form a stack of alternating thermoelectric modules and heat transfer devices arranged to provide thermal isolation along a direction of a working medium movement, wherein a first working fluid is cooled by flowing through a first set of the heat transfer devices and a second working fluid is heated by flowing through a second set of the heat transfer devices, wherein the second working fluid comprises one or more portions of the first working fluid after having flowed through one or more portions of the first set of heat transfer devices.

23. The thermoelectric system of claim 22, wherein the one or more portions of the first working fluid comprise a plurality of portions of the first working fluid after having flowed through a plurality of portions of the first set of heat transfer devices.

24. A thermoelectric system comprising:
a plurality of thermoelectric modules; and
a plurality of heat transfer devices, each heat transfer device accepting a working fluid to flow therethrough, at least some of the heat transfer devices in thermal communication with and sandwiched between at least two thermoelectric modules of the plurality of thermoelectric modules so as to form a stack of alternating thermoelectric modules and heat transfer devices arranged to provide thermal isolation along a direction of a working medium movement, wherein a first working fluid is cooled by flowing through a first set of the heat transfer devices and a second working fluid is heated by flowing through a second set of the heat transfer devices, wherein the second working fluid comprises a portion of the first working fluid that does not flow through at least a portion of the first set of heat transfer devices.

25. A thermoelectric system comprising:
a plurality of thermoelectric modules; and
a plurality of heat transfer devices, each heat transfer device accepting a working fluid to flow therethrough, at least some of the heat transfer devices in thermal communication with and sandwiched between at least two thermoelectric modules of the plurality of thermoelectric modules so as to form a stack of alternating thermoelectric modules and heat transfer devices arranged to provide thermal isolation along a direction of a working medium movement, wherein a first working fluid is cooled by flowing through a first set of the heat transfer devices and a second working fluid is heated by flowing through a second set of the heat transfer devices, wherein the second working fluid comprises the first working fluid after having flowed through the first set of heat transfer devices.

26. The thermoelectric system of claim 25, wherein the first working fluid comprises vapor at a temperature above a condensation point of the vapor, the first working fluid cooled to a temperature below the condensation point by flowing through at least a portion of the first set of heat transfer devices such that at least a portion of the vapor condenses to a liquid, the second working fluid comprising the first working fluid without the at least a portion of the vapor.

27. The thermoelectric system of claim 26, wherein the first working fluid comprises water vapor and air, and the second working fluid comprises the first working fluid with at least a portion of the water vapor removed.

28. The thermoelectric system of claim 22, wherein the plurality of thermoelectric modules comprises a first plurality of thermoelectric elements and a second plurality of thermoelectric elements, and wherein the plurality of heat transfer devices comprises at least one heat transfer device having a first side in thermal communication with two or more thermoelectric elements of the first plurality of thermoelectric elements and a second side in thermal communication with one or more thermoelectric elements of the second plurality of thermoelectric elements, wherein the two or more thermoelectric elements of the first plurality of thermoelectric elements are in parallel electrical communication with one another, and the two or more thermoelectric elements of the first plurality of thermoelectric elements are in series electrical communication with the one or more thermoelectric elements of the second plurality of thermoelectric elements.

29. The thermoelectric system of claim 22, wherein the plurality of heat transfer devices comprises at least one heat transfer device comprising a housing and one or more heat exchanger elements inside the housing.

30. The thermoelectric system of claim 24, wherein the plurality of thermoelectric modules comprises a first plurality of thermoelectric elements and a second plurality of thermoelectric elements, and wherein the plurality of heat transfer devices comprises at least one heat transfer device having a first side in thermal communication with two or more thermoelectric elements of the first plurality of thermoelectric elements and a second side in thermal communication with one or more thermoelectric elements of the second plurality of thermoelectric elements, wherein the two or more thermoelectric elements of the first plurality of thermoelectric elements are in parallel electrical communication with one another, and the two or more thermoelectric elements of the first plurality of thermoelectric elements are in series electrical communication with the one or more thermoelectric elements of the second plurality of thermoelectric elements.

31. The thermoelectric system of claim 24, wherein the plurality of heat transfer devices comprises at least one heat transfer device comprising a housing and one or more heat exchanger elements inside the housing.

32. The thermoelectric system of claim 25, wherein the plurality of thermoelectric modules comprises a first plurality of thermoelectric elements and a second plurality of thermoelectric elements, and wherein the plurality of heat transfer devices comprises at least one heat transfer device having a first side in thermal communication with two or more thermoelectric elements of the first plurality of thermoelectric elements and a second side in thermal communication with one or more thermoelectric elements of the second plurality of thermoelectric elements, wherein the two or more thermoelectric elements of the first plurality of thermoelectric elements are in parallel electrical communication with one another, and the two or more thermoelectric elements of the first plurality of thermoelectric elements are in series electrical communication with the one or more thermoelectric elements of the second plurality of thermoelectric elements.

33. The thermoelectric system of claim 25, wherein the plurality of heat transfer devices comprises at least one heat transfer device comprising a housing and one or more heat exchanger elements inside the housing.

* * * * *

UNITED STATES PATENT AND TRADEMARK OFFICE
CERTIFICATE OF CORRECTION

| | | |
|---|---|---|
| PATENT NO. | : 7,946,120 B2 | Page 1 of 1 |
| APPLICATION NO. | : 11/829832 | |
| DATED | : May 24, 2011 | |
| INVENTOR(S) | : Bell et al. | |

It is certified that error appears in the above-identified patent and that said Letters Patent is hereby corrected as shown below:

Title Page, (item 63) Related U.S. Application Data at lines 4-9, Change "which is a continuation-in-part of application No. 10/405,001, filed on Mar. 31, 2003, now Pat. No. 7,111,465, which is a continuation-in-part of application No. 10/227,398, filed on Aug. 23, 2002, now Pat. No. 7,231,772, which is a continuation" to --which is a continuation-in-part of application No. 10/227,398, filed on Aug. 23, 2002, now Pat. No. 7,231,772, and which is a continuation-in-part of application No. 10/403,001, filed on Mar. 31, 2003, now Pat. No. 7,111,465, which is a continuation--.

In column 1 (item 56) page 4 at line 9, Under Other Publications, change "Thermolectricity" to --Thermoelectricity--.

In the drawings: Sheet 38 of 45 (fig. 42) at line 4, Change "Outet" to --Outlet--.

In column 2 at line 61, Change "RP" to --$R_P$--.

In column 30 at line 35 (approx.), Change "know" to --known--.

In column 39 at line 30, Change "wast" to --waste--.

Signed and Sealed this
Twenty-fourth Day of April, 2012

David J. Kappos
*Director of the United States Patent and Trademark Office*